(12) United States Patent
Bunandar et al.

(10) Patent No.: US 11,398,871 B2
(45) Date of Patent: Jul. 26, 2022

(54) SYSTEMS AND METHODS FOR ANALOG COMPUTING USING A LINEAR PHOTONIC PROCESSOR

(71) Applicant: Lightmatter, Inc., Boston, MA (US)

(72) Inventors: Darius Bunandar, Boston, MA (US); Nicholas C. Harris, Boston, MA (US); Michael Gould, Boston, MA (US); Carl Ramey, Westborough, MA (US); Tomo Lazovich, Cambridge, MA (US)

(73) Assignee: Lightmatter, Inc., Boston, MA (US)

( * ) Notice: Subject to any disclaimer, the term of this patent is extended or adjusted under 35 U.S.C. 154(b) by 168 days.

(21) Appl. No.: 16/940,900

(22) Filed: Jul. 28, 2020

(65) Prior Publication Data

US 2021/0036783 A1 Feb. 4, 2021

Related U.S. Application Data

(60) Provisional application No. 62/939,480, filed on Nov. 22, 2019, provisional application No. 62/879,936, filed on Jul. 29, 2019.

(51) Int. Cl.
| | |
|---|---|
| *H04B 10/80* | (2013.01) |
| *G06F 1/28* | (2006.01) |
| *H03K 19/21* | (2006.01) |

(52) U.S. Cl.
CPC ............ *H04B 10/801* (2013.01); *G06F 1/28* (2013.01); *H03K 19/21* (2013.01)

(58) Field of Classification Search
None
See application file for complete search history.

(56) References Cited

U.S. PATENT DOCUMENTS

| | | |
|---|---|---|
| 3,872,293 A | 3/1975 | Green |
| 4,567,569 A | 1/1986 | Caulfield et al. |

(Continued)

FOREIGN PATENT DOCUMENTS

| | | |
|---|---|---|
| CN | 101630178 A | 1/2010 |
| EP | 0251062 A2 | 1/1988 |

(Continued)

OTHER PUBLICATIONS

International Search Report and Written Opinion from International Application No. PCT/US2015/034500, dated Mar. 15, 2016, 7 pages.

(Continued)

*Primary Examiner* — David W Lambert
(74) *Attorney, Agent, or Firm* — Wolf, Greenfield & Sacks, P.C.

(57) ABSTRACT

Systems and methods for performing signed matrix operations using a linear photonic processor are provided. The linear photonic processor is formed as an array of first amplitude modulators and second amplitude modulators, the first amplitude modulators configured to encode elements of a vector into first optical signals and the second amplitude modulators configured to encode a product between the vector elements and matrix elements into second optical signals. An apparatus may be used to implement a signed value of an output of the linear processor. The linear photonic processor may be configured to perform matrix-vector and/or matrix-matrix operations.

20 Claims, 31 Drawing Sheets

(56) References Cited

U.S. PATENT DOCUMENTS

| | | | |
|---|---|---|---|
| 4,592,004 A * | 5/1986 | Bocker | G06E 1/045 359/107 |
| 4,607,344 A | 8/1986 | Athale et al. | |
| 4,633,428 A | 12/1986 | Byron | |
| 4,686,646 A | 8/1987 | Goutzoulis | |
| 4,739,520 A | 4/1988 | Collins, Jr. et al. | |
| 4,809,204 A | 2/1989 | Dagenais et al. | |
| 4,849,940 A | 7/1989 | Marks, II et al. | |
| 4,868,803 A | 9/1989 | Sunagawa et al. | |
| 4,877,297 A | 10/1989 | Yeh | |
| 4,948,212 A | 8/1990 | Cheng et al. | |
| 5,004,309 A | 4/1991 | Caulfield et al. | |
| 5,077,619 A | 12/1991 | Toms | |
| 5,095,459 A | 3/1992 | Ohta et al. | |
| 5,117,099 A | 5/1992 | Schmidt | |
| 5,254,957 A | 10/1993 | Lauffenburger | |
| 5,333,117 A | 7/1994 | Ha et al. | |
| 5,383,042 A | 1/1995 | Robinson | |
| 5,394,257 A | 2/1995 | Horan et al. | |
| 5,410,145 A | 4/1995 | Coroy | |
| 5,428,711 A | 6/1995 | Akiyama et al. | |
| 5,448,749 A * | 9/1995 | Kyuma | G06N 3/0675 708/835 |
| 5,495,356 A | 2/1996 | Sharony et al. | |
| 5,576,873 A | 11/1996 | Crossland et al. | |
| 5,621,227 A | 4/1997 | Joshi | |
| 5,640,261 A | 6/1997 | Ono | |
| 5,699,449 A | 12/1997 | Javidi | |
| 5,784,309 A | 7/1998 | Budil | |
| 5,953,143 A | 9/1999 | Sharony et al. | |
| 6,005,998 A | 12/1999 | Lee | |
| 6,060,710 A | 5/2000 | Carrieri et al. | |
| 6,178,020 B1 | 1/2001 | Schultz et al. | |
| 6,525,858 B1 | 2/2003 | Nagahori | |
| 6,590,197 B2 | 7/2003 | Wadsworth et al. | |
| 6,728,434 B2 | 4/2004 | Flanders | |
| 7,050,116 B2 | 5/2006 | Van Zanten et al. | |
| 7,136,587 B1 | 11/2006 | Davis et al. | |
| 7,173,272 B2 | 2/2007 | Ralph | |
| 7,230,227 B2 | 6/2007 | Wilcken et al. | |
| 7,515,753 B2 * | 4/2009 | Goldenberg | G02B 27/46 382/191 |
| 7,536,431 B2 | 5/2009 | Goren et al. | |
| 7,660,533 B1 | 2/2010 | Meyers et al. | |
| 7,876,248 B2 | 1/2011 | Berkley et al. | |
| 7,985,965 B2 | 7/2011 | Barker et al. | |
| 8,018,244 B2 | 9/2011 | Berkley | |
| 8,023,828 B2 | 9/2011 | Beausoleil et al. | |
| 8,026,837 B1 | 9/2011 | Valley et al. | |
| 8,027,587 B1 | 9/2011 | Watts | |
| 8,035,540 B2 | 10/2011 | Berkley et al. | |
| 8,129,670 B2 | 3/2012 | Laycock et al. | |
| 8,190,553 B2 | 5/2012 | Routt | |
| 8,223,414 B2 | 7/2012 | Goto | |
| 8,247,780 B2 | 8/2012 | Zhang et al. | |
| 8,324,670 B2 | 12/2012 | Bui et al. | |
| 8,386,899 B2 | 2/2013 | Goto et al. | |
| 8,478,138 B2 | 7/2013 | Sugawara et al. | |
| 8,560,282 B2 | 10/2013 | Macready et al. | |
| 8,576,677 B2 | 11/2013 | Kurokawa et al. | |
| 8,604,944 B2 | 12/2013 | Berkley et al. | |
| 8,620,855 B2 | 12/2013 | Bonderson | |
| 8,837,544 B2 | 9/2014 | Santori | |
| 9,009,560 B1 | 4/2015 | Matache et al. | |
| 9,250,391 B2 | 2/2016 | McLaughlin et al. | |
| 9,354,039 B2 | 5/2016 | Mower et al. | |
| 9,513,276 B2 | 12/2016 | Tearney et al. | |
| 9,791,258 B2 | 10/2017 | Mower | |
| 10,009,135 B2 | 6/2018 | Tait et al. | |
| 10,095,262 B2 | 10/2018 | Valley et al. | |
| 10,197,971 B1 | 2/2019 | Horst | |
| 10,268,232 B2 | 4/2019 | Harris et al. | |
| 10,359,272 B2 | 7/2019 | Mower et al. | |
| 10,382,139 B2 | 8/2019 | Rosenhouse et al. | |
| 10,461,967 B1 | 10/2019 | Ahmed et al. | |
| 10,483,922 B2 | 11/2019 | Shibata et al. | |
| 10,608,663 B2 | 3/2020 | Gould et al. | |
| 10,670,860 B2 | 6/2020 | Tait et al. | |
| 10,763,974 B2 | 9/2020 | Bunandar et al. | |
| 2003/0025562 A1 | 2/2003 | Andreou et al. | |
| 2003/0086138 A1 | 5/2003 | Pittman et al. | |
| 2003/0235363 A1 | 12/2003 | Pfeiffer | |
| 2003/0235413 A1 | 12/2003 | Cohen et al. | |
| 2004/0243657 A1 | 12/2004 | Goren et al. | |
| 2005/0036786 A1 | 2/2005 | Ramachandran et al. | |
| 2006/0215949 A1 | 9/2006 | Lipson et al. | |
| 2007/0180586 A1 | 8/2007 | Amin | |
| 2008/0002993 A1 | 1/2008 | Kirkpatrick et al. | |
| 2008/0031566 A1 | 2/2008 | Matsubara et al. | |
| 2008/0212186 A1 | 9/2008 | Zoller et al. | |
| 2008/0212980 A1 | 9/2008 | Weiner | |
| 2008/0273835 A1 | 11/2008 | Popovic | |
| 2009/0028554 A1 | 1/2009 | Anderson et al. | |
| 2010/0165432 A1 | 7/2010 | Laycock et al. | |
| 2010/0215365 A1 | 8/2010 | Fukuchi | |
| 2010/0284703 A1 | 11/2010 | Suzuki | |
| 2011/0248150 A1 | 10/2011 | Bureau et al. | |
| 2013/0011093 A1 | 1/2013 | Goh et al. | |
| 2013/0121706 A1 | 5/2013 | Yang et al. | |
| 2014/0003761 A1 | 1/2014 | Dong | |
| 2014/0056585 A1 | 2/2014 | Qian et al. | |
| 2014/0241657 A1 | 8/2014 | Manouvrier | |
| 2014/0299743 A1 | 10/2014 | Miller | |
| 2015/0354938 A1 | 12/2015 | Mower et al. | |
| 2015/0382089 A1 | 12/2015 | Mazed | |
| 2016/0103281 A1 | 4/2016 | Matsumoto | |
| 2016/0112129 A1 | 4/2016 | Chang | |
| 2016/0118106 A1 | 4/2016 | Yoshimura et al. | |
| 2016/0162781 A1 | 6/2016 | Lillicrap et al. | |
| 2016/0162798 A1 | 6/2016 | Marandi et al. | |
| 2016/0182155 A1 | 6/2016 | Taylor et al. | |
| 2016/0245639 A1 | 8/2016 | Mower et al. | |
| 2016/0301478 A1 | 10/2016 | Luo et al. | |
| 2016/0352515 A1 | 12/2016 | Bunandar et al. | |
| 2017/0031101 A1 | 2/2017 | Miller | |
| 2017/0201813 A1 | 7/2017 | Sahni | |
| 2017/0237505 A1 | 8/2017 | Lucamarini et al. | |
| 2017/0285373 A1 | 10/2017 | Zhang et al. | |
| 2017/0351293 A1 | 12/2017 | Carolan et al. | |
| 2018/0107237 A1 | 4/2018 | Andregg et al. | |
| 2018/0274900 A1 | 9/2018 | Mower et al. | |
| 2018/0323825 A1 | 11/2018 | Cioffi et al. | |
| 2018/0335574 A1 | 11/2018 | Steinbrecher et al. | |
| 2019/0110084 A1 | 4/2019 | Jia et al. | |
| 2019/0331912 A1 | 10/2019 | Tait et al. | |
| 2019/0346685 A1 | 11/2019 | Miller | |
| 2019/0354894 A1 | 11/2019 | Lazovich et al. | |
| 2019/0356394 A1 | 11/2019 | Bunandar et al. | |
| 2019/0370644 A1 | 12/2019 | Kenney et al. | |
| 2019/0372589 A1 | 12/2019 | Gould et al. | |
| 2020/0228077 A1 | 7/2020 | Harris et al. | |
| 2020/0396007 A1 | 12/2020 | Bunandar et al. | |

FOREIGN PATENT DOCUMENTS

| | | | | |
|---|---|---|---|---|
| WO | WO 2005/029404 A2 | 3/2005 | | |
| WO | WO 2006/023067 A2 | 3/2006 | | |
| WO | WO 2008/069490 A1 | 6/2008 | | |
| WO | WO 2018/098230 A1 | 5/2018 | | |
| WO | WO 2019/115517 A1 | 6/2019 | | |
| WO | WO-2019115517 A1 * | 6/2019 | | H04N 5/341 |
| WO | WO 2019/217835 A1 | 11/2019 | | |

OTHER PUBLICATIONS

International Search Report and Written Opinion for International Application No. PCT/US19/32111 dated Aug. 2, 2019.

Invitation to Pay Additional Fees for International Application No. PCT/US19/32181 dated Jul. 23, 2019.

International Search Report and Written Opinion for International Application No. PCT/US19/32181 dated Sep. 23, 2019.

Invitation to Pay Additional Fees for International Application No. PCT/US2019/032272 dated Jun. 27, 2019.

(56) References Cited

OTHER PUBLICATIONS

International Search Report and Written Opinion for International Application No. PCT/US2019/032272 dated Sep. 4, 2019.
Invitation to Pay Additional Fees for International Application No. PCT/US2020/043841 dated Oct. 13, 2020.
[No Author Listed], Optical Coherent Receiver Analysis. 2009 Optiwave Systems, Inc. 16 pages. URL:https://dru5cjyjifvrg.cloudfront.net/wp-content/uploads/2017/03/OptiSystem-Applications-Coherent-Receiver-Analysis.pdf [retrieved on Aug. 17, 2019].
Aaronson et al., Computational complexity of linear optics. Proceedings of the 43rd Annual ACM Symposium on Theory of Computing. 2011. 101 pages. ISBN 978-1-4503-0691-1.
Abu-Mostafa et al., Optical neural computers. Scientific American. 1987:88-95.
Albert et al., Statistical mechanics of com-plex networks. Reviews of Modern Physics. 2002;(74):47-97.
Almeida et al., All-optical control of light on a silicon chip. Nature. 2004;431:1081-1084.
Amir et al., Classical diffusion of a quantum particle in a noisy environment. Physical Review E. 2009;79. 5 pages. DOI: 10.1103/PhysRevE.79.050105.
Amit et al., Spin-glass models of neural networks. Physical Review A. 1985;32(2):1007-1018.
Anitha et al., Comparative Study of High performance Braun's multiplier using FPGAs. IOSR Journal of Electrontrics and Communication Engineering (IOSRJECE). 2012;1:33-37.
Appeltant et al., Information processing using a single dynamical node as complex system. Nature Communications. 2011. 6 pages. DOI: 10.1038/ncomms1476.
Arjovsky et al., Unitary Evolution Recurrent Neural Networks. arXiv:1511.06464. 2016. 9 pages.
Aspuru-Guzik et al., Photonic quantum simulators. Nature Physics. 2012;8:285-291. DOI: 10.1038/NPHYS2253.
Aspuru-Guzik et al., Simulated Quantum Computation of Molecular Energies. Science. 2005;309:1704-7.
Atabaki et al., Integrating photonics with silicon nanoelectronics for the next generation of systems on a chip. Nature. 2018;556(7701):349-354. 10 pages. DOI: 10.1038/s41586-018-0028-z.
Baehr-Jones et al., A 25 Gb/s Silicon Photonics Platform. arXiv:1203.0767. 2012. 11 pages.
Bao et al., Atomic-Layer Graphene as a Saturable Absorber for Ultrafast Pulsed Lasers. 24 pages. 2009.
Bao et al., Monolayer graphene as a saturable absorber in a mode-locked laser. Nano Research. 2011;4:297-307. DOI: 10.1007/s12274-010-0082-9.
Barahona, On the computational complexity of Ising spin glass models. Journal of Physics A: Mathematical and General. 1982;15:3241-3253.
Bertsimas et al., Robust optimization with simulated annealing. Journal of Global Optimization. 2010;48:323-334. DOI 10.1007/s10898-009-9496-x.
Bewick, Fast multiplication: algorithms and implementation. Ph.D. thesis, Stanford University (1994). 170 pages.
Bonneau et al., Quantum interference and manipulation of entanglement in silicon wire waveguide quantum circuits. New Journal of Physics. 2012;14:045003. 13 pages. DOI: 10.1088/1367-2630/14/4/045003.
Brilliantov, Effective magnetic Hamiltonian and Ginzburg criterion for fluids. Physical Review E. 1998;58:2628-2631.
Bromberg et al., Bloch oscillations of path-entangled photons. Physical Review Letters. 2010;105:263604-1-2633604-4. 4 pages. DOI: 10.1103/PhysRevLett.105.263604.
Bromberg et al., Quantum and Classical Correlations in Waveguide Lattices. Physical Review Letters. 2009;102:253904-1-253904-4. 4 pages. DOI: 10.1103/PhysRevLett.102.253904.
Broome et al., Photonic Boson Sampling in a Tunable Circuit. Science. 2012;339:794-8.
Bruck et al., On the power of neural networks for solving hard problems. American Institute of Physics. 1988. pp. 137-143. 7 pages.
Canziani et al., Evaluation of neural network architectures for embedded systems. Circuits and Systems (ISCAS). 2017 IEEE International Symposium. 4 pages.
Cardenas et al., Low loss etchless silicon photonic waveguides. Optics Express. 2009;17(6):4752-4757.
Carolan et al., Universal linear optics. Science. 2015;349:711-716.
Caves, Quantum-mechanical noise in an interferometer. Physical Review D. 1981;23(8):1693-1708. 16 pages.
Centeno et al., Optical bistability in finite-size nonlinear bidimensional photonic crystals doped by a microcavity. Physical Review B. 2000;62(12):R7683-R7686.
Chan, Optical flow switching networks. Proceedings of the IEEE. 2012;100(5):1079-1091.
Chen et al., Compact, low-loss and low-power 8×8 broadband silicon optical switch. Optics Express. 2012;20(17):18977-18985.
Chen et al., DianNao: A small-footprint high-throughput accelerator for ubiquitous machine-learning. ACM Sigplan Notices. 2014;49:269-283.
Chen et al., Efficient photon pair sources based on silicon-on-insulator microresonators. Proc. of SPIE. 2010;7815. 10 pages.
Chen et al., Frequency-bin entangled comb of photon pairs from a Silicon-on-Insulator micro-resonator. Optics Express. 2011;19(2):1470-1483.
Chen et al., Universal method for constructing N-port nonblocking optical router based on 2×2 optical switch for photonic networks-on-chip. Optics Express. 2014;22(10);12614-12627. DOI: 10.1364/OE.22.012614.
Cheng et al., In-Plane Optical Absorption and Free Carrier Absorption in Graphene-on-Silicon Waveguides. IEEE Journal of Selected Topics in Quantum Electronics. 2014;20(1). 6 pages.
Chetlur et al., cuDNN: Efficient primitives for deep learning. arXiv preprint arXiv:1410.0759. 2014. 9 pages.
Childs et al., Spatial search by quantum walk. Physical Review A. 2004;70(2):022314. 11 pages.
Chung et al., A monolithically integrated large-scale optical phased array in silicon-on-insulator cmos. IEEE Journal of Solid-State Circuits. 2018;53:275-296.
Cincotti, Prospects on planar quantum computing. Journal of Lightwave Technology. 2009;27(24):5755-5766.
Clements et al., Optimal design for universal multiport interferometers. Optica. 2016;3(12):1460-1465.
Crespi et al., Integrated multimode interferometers with arbitrary designs for photonic boson sampling. Nature Photonics. 2013;7:545-549. DOI: 10.1038/NPHOTON.2013.112.
Crespi, et al., Anderson localization of entangled photons in an integrated quantum walk. Nature Photonics. 2013;7:322-328. DOI: 10.1038/NPHOTON.2013.26.
Dai et al., Novel concept for ultracompact polarization splitter-rotator based on silicon nanowires. Optics Express. 2011;19(11):10940-9.
Di Giuseppe et al., Einstein-Podolsky-Rosen Spatial Entanglement in Ordered and Anderson Photonic Lattices. Physical Review Letters. 2013;110:150503-1-150503-5. DOI: 10.1103/PhysRevLett.110.150503.
Dunningham et al., Efficient comparison of path-lengths using Fourier multiport devices. Journal of Physics B: Atomic, Molecular and Optical Physics. 2006;39:1579-1586. DOI:10.1088/0953-4075/39/7/002.
Esser et al., Convolutional networks for fast, energy-efficient neuromorphic computing. Proceedings of the National Academy of Sciences. 2016;113(41):11441-11446.
Farhat et al., Optical implementation of the Hopfield model. Applied Optics. 1985;24(10):1469-1475.
Feinberg et al., Making memristive neural network accelerators reliable. IEEE International Symposium on High Performance Computer Architecture (HPCA). 2018. pp. 52-65. DOI 10.1109/HPCA.2018.00015.
Fushman et al., Controlled Phase Shifts with a Single Quantum Dot. Science. 2008;320:769-772. DOI: 10.1126/science.1154643.
George et al., A programmable and configurable mixed-mode FPAA SoC. IEEE Transactions on Very Large Scale Integration (VLSI) Systems. 2016;24:2253-2261.

(56) References Cited

OTHER PUBLICATIONS

Gilmer et al., Neural message passing for quantum chemistry. arXiv preprint arXiv:1704.01212. Jun. 2017. 14 pages.
Golub et al., Calculating the singular values and pseudo-inverse of a matrix. Journal of the Society for Industrial and Applied Mathematics Series B Numerical Analysis. 1965;2(2):205-224.
Graves et al., Hybrid computing using a neural network with dynamic external memory. Nature. 2016;538. 21 pages. DOI:10.1038/nature20101.
Grote et al., First long-term application of squeezed states of light in a gravitational-wave observatory. Physical Review Letter. 2013;110:181101. 5 pages. DOI: 10.1103/PhysRevLett.110.181101.
Gruber et al., Planar-integrated optical vector-matrix multiplier. Applied Optics. 2000;39(29):5367-5373.
Gullans et al., Single-Photon Nonlinear Optics with Graphene Plasmons. Physical Review Letter. 2013;111:247401-1-247401-5. DOI: 10.1103/PhysRevLett.111.247401.
Gunn, CMOS photonics for high-speed interconnects. IEEE Micro. 2006;26:58-66.
Haffner et al., Low-loss plasmon-assisted electro-optic modulator. Nature. 2018;556:483-486. 17 pages. DOI: 10.1038/s41586-018-0031-4.
Halasz et al., Phase diagram of QCD. Physical Review D. 1998;58:096007. 11 pages.
Hamerly et al., Scaling advantages of all-to-all connectivity in physical annealers: the Coherent Ising Machine vs. D-Wave 2000Q. arXiv preprints, May 2018. 17 pages.
Harris et al. Efficient, Compact and Low Loss Thermo-Optic Phase Shifter in Silicon. Optics Express. 2014;22(9);10487-93. DOI:10.1364/OE.22.010487.
Harris et al., Bosonic transport simulations in a large-scale programmable nanophotonic processor. arXiv:1507.03406. 2015. 8 pages.
Harris et al., Integrated source of spectrally filtered correlated photons for large-scale quantum photonic systems. Physical Review X. 2014;4:041047. 10 pages. DOI: 10.1103/PhysRevX.4.041047.
Harris et al., Quantum transport simulations in a programmable nanophotonic processor. Nature Photonics. 2017;11:447-452. DOI: 10.1038/NPHOTON.2017.95.
Hinton et al., Reducing the dimensionality of data with neural networks. Science. 2006;313:504-507.
Hochberg et al., Silicon Photonics: The Next Fabless Semiconductor Industry. IEEE Solid-State Circuits Magazine. 2013. pp. 48-58. DOI: 10.1109/MSSC.2012.2232791.
Honerkamp-Smith et al., An introduction to critical points for biophysicists; observations of compositional heterogeneity in lipid membranes. Biochimica et Biophysica Acta (BBA). 2009;1788:53-63. DOI: 10.1016/j.bbamem.2008.09.010.
Hong et al., Measurement of subpicosecond time intervals between two photons by interference. Physical Review Letters. 1987;59(18):2044-2046.
Hopfield et al., Neural computation of decisions in optimization problems. Biological Cybernetics. 1985;52;141-152.
Hopfield, Neural networks and physical systems with emergent collective computational abilities. PNAS. 1982;79:2554-2558. DOI: 10.1073/pnas.79.8.2554.
Horowitz, Computing's energy problem (and what we can do about it). Solid-State Circuits Conference Digest of Technical Papers (ISSCC), 2014 IEEE International. 5 pages.
Horst et al., Cascaded Mach-Zehnder wavelength filters in silicon photonics for low loss and flat pass-band WDM (de-)multiplexing. Optics Express. 2013;21(10):11652-8. DOI:10.1364/OE.21.011652.
Humphreys et al., Linear Optical Quantum Computing in a Single Spatial Mode. Physical Review Letters. 2013;111:150501. 5 pages. DOI: 10.1103/PhysRevLett.111.150501.
Inagaki et al., Large-scale ising spin network based on degenerate optical parametric oscillators. Nature Photonics. 2016;10:415-419. 6 pages. DOI: 10.1038/NPHOTON.2016.68.
Isichenko, Percolation, statistical topography, and trans-port in random media. Reviews of Modern Physics. 1992;64(4):961-1043.
Jaekel et al., Quantum limits in interferometric measurements. Europhysics Letters. 1990;13(4):301-306.
Jalali et al., Silicon Photonics. Journal of Lightwave Technology. 2006;24(12):4600-15. DOI: 10.1109/JLT.2006.885782.
Jia et al., Caffe: Convolutional architecture for fast feature embedding. Proceedings of the 22nd ACM International Conference on Multimedia. Nov. 2014. 4 pages. URL:http://doi.acm.org/10.1145/2647868.2654889.
Jiang et al., A planar ion trapping microdevice with integrated waveguides for optical detection. Optics Express. 2011;19(4):3037-43.
Jonsson, An empirical approach to finding energy efficient ADC architectures. 2011 International Workshop on ADC Modelling, Testing and Data Converter Analysis and Design and IEEE 2011 ADC Forum. 6 pages.
Jouppi et al., In-datacenter performance analysis of a tensor processing unit. Proceeding of Computer Architecture (ISCA). Jun. 2017. 12 pages. URL:https://doi.org/10.1145/3079856.3080246.
Kahn et al., Communications expands its space. Nature Photonics. 2017;11:5-8.
Kardar et al., Dynamic Scaling of Growing Interfaces. Physical Review Letters. 1986;56(9):889-892.
Karpathy, CS231n Convolutional Neural Networks for Visual Recognition. Class notes. 2019. URL:http://cs231n.github.io/ 2 pages. [last accessed Sep. 24, 2019].
Kartalopoulos, Part III Coding Optical Information. Introduction to DWDM Technology. IEEE Press. 2000. pp. 165-166.
Keckler et al., GPUs and the future of parallel computing. IEEE Micro. 2011;31:7-17. DOI: 10.1109/MM.2011.89.
Kieling et al., On photonic Controlled Phase Gates. New Journal of Physics. 2010;12:0133003. 17 pages. DOI: 10.1088/1367-2630/12/1/013003.
Kilper et al., Optical networks come of age. Optics Photonics News. 2014;25:50-57. DOI: 10.1364/OPN.25.9.000050.
Kim et al., A functional hybrid memristor crossbar-array/cmos system for data storage and neuromorphic applications. Nano Letters. 2011;12:389-395.
Kirkpatrick et al., Optimization by simulated annealing. Science. 1983;220(4598):671-680.
Knill et al., A scheme for efficient quantum computation with linear optics. Nature. 2001;409(4652):46-52.
Knill et al., The Bayesian brain: the role of uncertainty in neural coding and computation. Trends in Neurosciences. 2004;27(12):712-719.
Knill, Quantum computing with realistically noisy devices. Nature. 2005;434:39-44.
Kok et al., Linear optical quantum computing with photonic qubits. Reviews of Modern Physics. 2007;79(1):135-174.
Koos et al., Silicon-organic hybrid (SOH) and plasmonic-organic hybrid (POH) integration. Journal of Lightwave Technology. 2016;34(2):256-268.
Krizhevsky et al., ImageNet classification with deep convolutional neural networks. Advances in Neural Information Processing Systems (NIPS). 2012. 9 pages.
Kucherenko et al., Application of Deterministic Low-Discrepancy Sequences in Global Optimization. Computational Optimization and Applications. 2005;30:297-318.
Kwack et al., Monolithic InP strictly non-blocking 8×8 switch for high-speed WDM optical interconnection. Optics Express. 2012;20(27):28734-41.
Lahini et al., Anderson Localization and Nonlinearity in One-Dimensional Disordered Photonic Lattices. Physical Review Letters. 2008;100:013906. 4 pages. DOI: 10.1103/PhysRevLett.100.013906.
Lahini et al., Quantum Correlations in Two-Particle Anderson Localization. Physical Review Letters. 2010;105:163905. 4 pages. DOI: 10.1103/PhysRevLett.105.163905.
Laing et al., High-fidelity operation of quantum photonic circuits. Applied Physics Letters. 2010;97:211109. 5 pages. DOI: 10.1063/1.3497087.

(56) References Cited

OTHER PUBLICATIONS

Landauer, Irreversibility and heat generation in the computing process. IBM Journal of Research and Development. 1961. pp. 183-191.
Lanyon et al., Towards quantum chemistry on a quantum computer. Nature Chemistry. 2010;2:106-10. DOI: 10.1038/NCHEM.483.
Lawson et al., Basic linear algebra subprograms for Fortran usage. ACM Transactions on Mathematical Software (TOMS). 1979;5(3):308-323.
Lecun et al., Deep learning. Nature. 2015;521:436-444. DOI:10.1038/nature14539.
Lecun et al., Gradient-based learning applied to document recognition. Proceedings of the IEEE. Nov. 1998. 46 pages.
Levi et al., Hyper-transport of light and stochastic acceleration by evolving disorder. Nature Physics. 2012;8:912-7. DOI: 10.1038/NPHYS2463.
Li et al., Efficient and self-adaptive in-situ learning in multilayer memristor neural networks. Nature Communications. 2018;9:2385. 8 pages, doi: 10.1038/s41467-018-04484-2.
Lin et al., All-optical machine learning using diffractive deep neural networks. Science. 2018;361:1004-1008. 6 pages. doi: 10.1126/science.aat8084.
Little, The existence of persistent states in the brain. Mathematical Biosciences. 1974;19:101-120.
Liu et al., Towards 1-Tb/s Per-Channel Optical Transmission Based on Multi-Carrier Modulation. 19th Annual Wireless and Optical Communications Conference. May 2010. 4 pages. DOI: 10.1109/WOCC.2010.5510630.
Lu et al., 16 × 16 non-blocking silicon optical switch based on electro-optic Mach-Zehnder interferometers. Optics Express. 2016;24(9):9295-9307. doi: 10.1364/OE.24.009295.
Ma et al., Optical switching technology comparison: Optical mems vs. Other technologies. IEEE Optical Communications. 2003;41(11):S16-S23.
Macready et al., Criticality and Parallelism in Combinatorial Optimization. Science. 1996;271:56-59.
Marandi et al., Network of time-multiplexed optical parametric oscillators as a coherent Ising machine. Nature Photonics. 2014;8:937-942. doi: 10.1038/NPHOTON.2014.249.
Martin-Lopez et al., Experimental realization of Shor's quantum factoring algorithm using qubit recycling. Nature Photonics. 2012;6:773-6. DOI: 10.1038/NPHOTON.2012.259.
Mcmahon et al., A fully programmable 100-spin coherent Ising machine with all-to-all connections. Science. 2016;354(6312):614-7. DOI: 10.1126/science.aah5178.
Mead, Neuromorphic electronic systems. Proceedings of the IEEE. 1990;78(10):1629-1636.
Migdall et al., Tailoring single-photon and multiphoton probabilities of a single-photon on-demand source. Physical Review A. 2002;66:053805. 4 pages. DOI: 10.1103/PhysRevA.66.053805.
Mikkelsen et al., Dimensional variation tolerant silicon-on-insulator directional couplers. Optics Express. 2014;22(3):3145-50. DOI:10.1364/OE.22.003145.
Miller, Are optical transistors the logical next step? Nature Photonics. 2010;4:3-5.
Miller, Attojoule optoelectronics for low-energy information processing and communications. Journal of Lightwave Technology. 2017;35(3):346-96. DOI: 10.1109/JLT.2017.2647779.
Miller, Energy consumption in optical modulators for interconnects. Optics Express. 2012;20(S2):A293-A308.
Miller, Perfect optics with imperfect components. Optica. 2015;2(8):747-750.
Miller, Reconfigurable add-drop multiplexer for spatial modes. Optics Express. 2013;21(17):20220-9. DOI:10.1364/OE.21.020220.
Miller, Self-aligning universal beam coupler, Optics Express. 2013;21(5):6360-70.
Miller, Self-configuring universal linear optical component [Invited]. Photonics Research. 2013;1(1):1-15. URL:http://dx.doi.org/10.1364/PRJ.1.000001.
Misra et al., Artificial neural networks in hardware: A survey of two decades of progress. Neurocomputing. 2010;74:239-255.
Mohseni et al., Environment-assisted quantum walks in photosynthetic complexes. The Journal of Chemical Physics. 2008;129:174106. 10 pages. DOI: 10.1063/1.3002335.
Moore, Cramming more components onto integrated circuits. Proceeding of the IEEE. 1998;86(1):82-5.
Mower et al., Efficient generation of single and entangled photons on a silicon photonic integrated chip. Physical Review A. 2011;84:052326. 7 pages. DOI: 10.1103/PhysRevA.84.052326.
Mower et al., High-fidelity quantum state evolution in imperfect photonic integrated circuits. Physical Review A. 2015;92(3):032322. 7 pages. doi: 10.1103/PhysRevA.92.032322.
Nagamatsu et al., A 15 NS 32×32-bit CMOS multiplier with an improved parallel structure. IEEE Custom Integrated Circuits Conference. 1989. 4 pages.
Najafi et al., On-Chip Detection of Entangled Photons by Scalable Integration of Single-Photon Detectors. arXiv:1405.4244. May 16, 2014. 27 pages.
Najafi et al., On-Chip detection of non-classical light by scalable integration of single-photon detectors. Nature Communications. 2015;6:5873. 8 pages. DOI: 10.1038/ncomms6873.
Naruse, Nanophotonic Information Physics. Nanointelligence and Nanophotonic Computing. Springer. 2014. 261 pages. DOI 10.1007/978-3-642-40224-1.
Nozaki et al., Sub-femtojoule all-optical switching using a photonic-crystal nanocavity. Nature Photonics. 2010;4:477-483. doi: 10.1038/NPHOTON.2010.89.
O'Brien et al., Demonstration of an all-optical quantum controlled-NOT gate. Nature. 2003;426:264-7.
Onsager, Crystal Statistics. I. A Two-Dimensional Model with an Order-Disorder Transition. Physical Review. 1944;65(3,4):117-149.
Orcutt et al., Nanophotonic integration in state-of-the-art CMOS foundries. Optics Express. 2011;19(3):2335-46.
Pelissetto et al., Critical phenomena and renormalization-group theory. Physics Reports. Apr. 2002. 150 pages.
Peng, Implementation of AlexNet with Tensorflow. https://github.com/ykpengba/AlexNet-A-Practical-Implementation. 2018. 2 pages. [last accessed Sep. 24, 2019].
Peretto, Collective properties of neural networks: A statistical physics approach. Biological Cybernetics. 1984;50:51-62.
Pernice et al., High-speed and high-efficiency travelling wave single-photon detectors embedded in nanophotonic circuits. Nature Communications 2012;3:1325. 10 pages. DOI: 10.1038/ncomms2307.
Peruzzo et al., Quantum walk of correlated photons. Science. 2010;329;1500-3. DOI: 10.1126/science.1193515.
Politi et al., Integrated Quantum Photonics, IEEE Journal of Selected Topics in Quantum Electronics, 2009;5(6):1-12. DOI: 10.1109/JSTQE.2009.2026060.
Politi et al., Silica-on-Silicon Waveguide Quantum Circuits. Science. 2008;320:646-9. DOI: 10.1126/science.1155441.
Poon et al., Neuromorphic silicon neurons and large-scale neural networks: challenges and opportunities. Frontiers in Neuroscience. 2011;5:1-3. doi: 10.3389/fnins.2011.00108.
Prucnal et al., Recent progress in semiconductor excitable lasers for photonic spike processing. Advances in Optics and Photonics. 2016;8(2):228-299.
Psaltis et al., Holography in artificial neural networks. Nature. 1990;343:325-330.
Qiao et al., 16×16 non-blocking silicon electro-optic switch based on mach zehnder interferometers. Optical Fiber Communication Conference. Optical Society of America. 2016. 3 pages.
Ralph et al., Linear optical controlled-NOT gate in the coincidence basis. Physical Review A. 2002;65:062324-1-062324-5. DOI: 10.1103/PhysRevA.65.062324.
Ramanitra et al., Scalable and multi-service passive optical access infrastructure using variable optical splitters. Optical Fiber Communication Conference. Optical Society of America. 2005. 3 pages.
Raussendorf et al., A one-way quantum computer. Physical Review Letter. 2001;86(22):5188-91. DOI: 10.1103/PhysRevLett.86.5188.
Rechtsman et al., Photonic floquet topological insulators. Nature. 2013;496:196-200. doi: 10.1038/nature12066.

(56) References Cited

OTHER PUBLICATIONS

Reck et al., Experimental realization of any discrete unitary operator. Physical review letters. 1994;73(1):58-61. 6 pages.
Reed et al., Silicon optical modulators. Nature Photonics. 2010;4:518-26. DOI: 10.1038/NPHOTON.2010.179.
Rendl et al., Solving Max-Cut to optimality by intersecting semidefinite and polyhedral relaxations. Mathematical Programming. 2010;121:307-335. doi: 10.1007/s10107-008-0235-8.
Rios et al., Integrated all-photonic non-volatile multilevel memory. Nature Photonics. 2015;9:725-732. doi: 10.1038/NPHOTON.2015.182.
Rogalski, Progress in focal plane array technologies. Progress in Quantum Electronics. 2012;36:342-473.
Rohit et al., 8×8 space and wavelength selective cross-connect for simultaneous dynamic multi-wavelength routing. Optical Fiber Communication Conference. OFC/NFOEC Technical Digest. 2013. 3 pages.
Rosenblatt, The perceptron: a probabilistic model for information storage and organization in the brain. Psychological Review. 1958;65(6):386-408.
Russakovsky et al., ImageNet Large Scale Visual Recognition Challenge. arXiv:1409.0575v3. Jan. 2015. 43 pages.
Saade et al., Random projections through multiple optical scattering: Approximating Kernels at the speed of light. arXiv:1510.06664v2. Oct. 25, 2015. 6 pages.
Salandrino et al., Analysis of a three-core adiabatic directional coupler. Optics Communications. 2009;282:4524-6. doi:10.1016/j.optcom.2009.08.025.
Schaeff et al., Scalable fiber integrated source for higher-dimensional path-entangled photonic quNits. Optics Express. 2012;20(15):16145-153.
Schirmer et al., Nonlinear mirror based on two-photon absorption. Journal of the Optical Society of America B. 1997;14(11):2865-8.
Schmidhuber, Deep learning in neural networks: An overview. Neural Networks. 2015;61:85-117.
Schreiber et al., Decoherence and Disorder in Quantum Walks: From Ballistic Spread to Localization. Physical Review Letters. 2011;106:180403. 4 pages. DOI: 10.1103/PhysRevLett.106.180403.
Schwartz et al., Transport and Anderson localization in disordered two-dimensional photonic lattices. Nature. 2007;446:52-5. doi:10.1038/nature05623.
Selden, Pulse transmission through a saturable absorber. British Journal of Applied Physics. 1967;18:743-8.
Shafiee et al., ISAAC: A convolutional neural network accelerator with in-situ analog arithmetic in crossbars. ACM/IEEE 43rd Annual International Symposium on Computer Architecture. Oct. 2016. 13 pages.
Shen et al., Deep learning with coherent nanophotonic circuits. Nature Photonics. 2017;11:441-6. DOI: 10.1038/NPHOTON.2017.93.
Shoji et al., Low-crosstalk 2×2 thermo-optic switch with silicon wire waveguides. Optics Express.2010;18(9):9071-5.
Silver et al. Mastering chess and shogi by self-play with a general reinforcement learning algorithm. arXiv preprint arXiv:1712.01815. 19 pages. 2017.
Silver et al., Mastering the game of go with deep neural networks and tree search. Nature. 2016;529:484-9. 20 pages. doi:10.1038/nature16961.
Silver et al., Mastering the game of Go without human knowledge. Nature. 2017;550:354-9. 18 pages. doi:10.1038/nature24270.
Silverstone et al., On-chip quantum interference between silicon photon-pair sources. Nature Photonics. 2014;8:104-8. DOI: 10.1038/NPHOTON.2013.339.
Smith et al., Phase-controlled integrated photonic quantum circuits. Optics Express. 2009;17(16):13516-25.
Soljacic et al., Optimal bistable switching in nonlinear photonic crystals. Physical Review E. 2002;66:055601. 4 pages.
Solli et al., Analog optical computing. Nature Photonics. 2015;9:704-6.
Spring et al., Boson sampling on a photonic chip. Science. 2013;339:798-801. DOI: 10.1126/science.1231692.
Srinivasan et al., 56 Gb/s germanium waveguide electro-absorption modulator. Journal of Lightwave Technology. 2016;34(2):419-24. DOI: 10.1109/JLT.2015.2478601.
Steinkraus et al., Using GPUs for machine learning algorithms. Proceedings of the 2005 Eight International Conference on Document Analysis and Recognition. 2005. 6 pages.
Suda et al., Quantum interference of photons in simple networks. Quantum Information Process. 2013;12:1915-45. DOI 10.1007/s11128-012-0479-3.
Sun et al., Large-scale nanophotonic phased array. Nature. 2013;493:195-9. doi:10.1038/nature11727.
Sun et al., Single-chip microprocessor that communicates directly using light. Nature. 2015;528:534-8. doi:10.1038/nature16454.
Suzuki et al., Ultra-compact 8×8 strictly-non-blocking Si-wire PILOSS switch. Optics Express. 2014;22(4):3887-94. DOI:10.1364/OE.22.003887.
Sze et al., Efficient processing of deep neural networks: A tutorial and survey. Proceedings of the IEEE. 2017;105(12):2295-2329. DOI: 10.1109/JPROC.2017.276174.
Tabia, Experimental scheme for qubit and qutrit symmetric informationally complete positive operator-valued measurements using multiport devices. Physical Review A. 2012;86:062107. 8 pages. DOI: 10.1103/PhysRevA.86.062107.
Tait et al., Broadcast and weight: An integrated network for scalable photonic spike processing. Journal of Lightwave Technology. 2014;32(21):3427-39. DOI: 10.1109/JLT.2014.2345652.
Tait et al., Chapter 8 Photonic Neuromorphic Signal Processing and Computing. Springer, Berlin, Heidelberg. 2014. pp. 183-222.
Tait et al., Neuromorphic photonic networks using silicon photonic weight banks. Scientific Reports. 2017;7:7430. 10 pages.
Tanabe et al., Fast bistable all-optical switch and memory on a silicon photonic crystal on-chip. Optics Letters. 2005;30(19):2575-7.
Tanizawa et al., Ultra-compact 32×32 strictly-non-blocking Si-wire optical switch with fan-out LGA interposer. Optics Express. 2015;23(13):17599-606. DOI:10.1364/OE.23.017599.
Thompson et al., Integrated waveguide circuits for optical quantum computing. IET Circuits, Devices, & Systems. 2011;5(2):94-102. doi: 10.1049/iet-cds.2010.0108.
Timurdogan et al., An ultralow power athermal silicon modulator. Nature Communications. 2014;5:4008. 11 pages. DOI: 10.1038/ncomms5008.
Vandoorne et al., Experimental demonstration of reservoir computing on a silicon photonics chip. Nature Communications. 2014,5:3541. 6 pages. DOI: 10.1038/ncomms4541.
Vazquez et al., Optical NP problem solver on laser-written waveguide plat-form. Optics Express. 2018;26(2):702-10.
Vivien et al., Zero-bias 40gbit/s germanium waveguide photodetector on silicon. Optics Express. 2012;20(2):1096-1101.
Wang et al., Coherent Ising machine based on degenerate optical parametric oscillators. Physical Review A. 2013;88:063853. 9 pages. DOI: 10.1103/PhysRevA.88.063853.
Wang et al., Deep learning for identifying metastatic breast cancer. arXiv preprint arXiv:1606.05718. Jun. 18, 2016. 6 pages.
Werbos, Beyond regression: New tools for prediction and analysis in the behavioral sciences. Ph.D. dissertation, Harvard University. Aug. 1974. 454 pages.
Whitfield et al., Simulation of electronic structure Hamiltonians using quantum computers. Molecular Physics. 2010;109(5,10):735-50. DOI: 10.1080/00268976.2011.552441.
Wu et al., An optical fiber network oracle for NP-complete problems. Light: Science & Applications. 2014;3: e147. 5 pages. doi:10.1038/lsa.2014.28.
Xia et al., Mode conversion losses in silicon-on-insulator photonic wire based racetrack resonators. Optics Express. 2006;14(9):3872-86.
Xu et al., Experimental observations of bistability and instability in a two-dimensional nonlinear optical superlattice. Physical Review Letters. 1993;71(24):3959-62.
Yang et al., Non-Blocking 4×4 Electro-Optic Silicon Switch for On-Chip Photonic Networks. Optics Express 2011;19(1):47-54.

(56) References Cited

OTHER PUBLICATIONS

Yao et al., Serial-parallel multipliers. Proceedings of 27th Asilomar Conference on Signals, Systems and Computers. 1993. pp. 359-363.
Young et al., Recent trends in deep learning based natural language processing. IEEE Computational Intelligence Magazine. arXiv:1708.02709v8. Nov. 2018. 32 pages.
Zhou et al., Calculating Unknown Eigenvalues with a Quantum Algorithm. Nature Photonics. 2013;7:223-8. DOI: 10.1038/NPHOTON.2012.360.
International Search Report and Written Opinion dated Dec. 18, 2020 in connection with International Application No. PCT/US2020/043841.
International Preliminary Report on Patentability dated Nov. 26, 2020 in connection with International Application No. PCT/US2019/032181.
International Preliminary Report on Patentability for International Application No. PCT/US2019/032272 dated Dec. 17, 2020.

\* cited by examiner

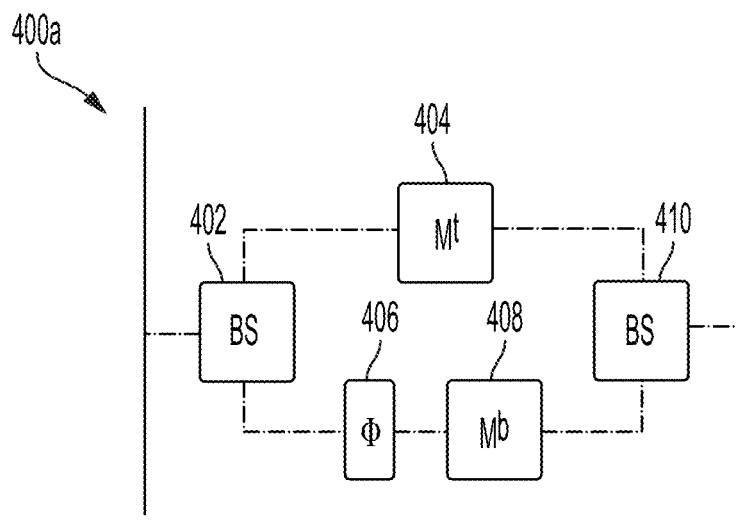
FIG. 4A
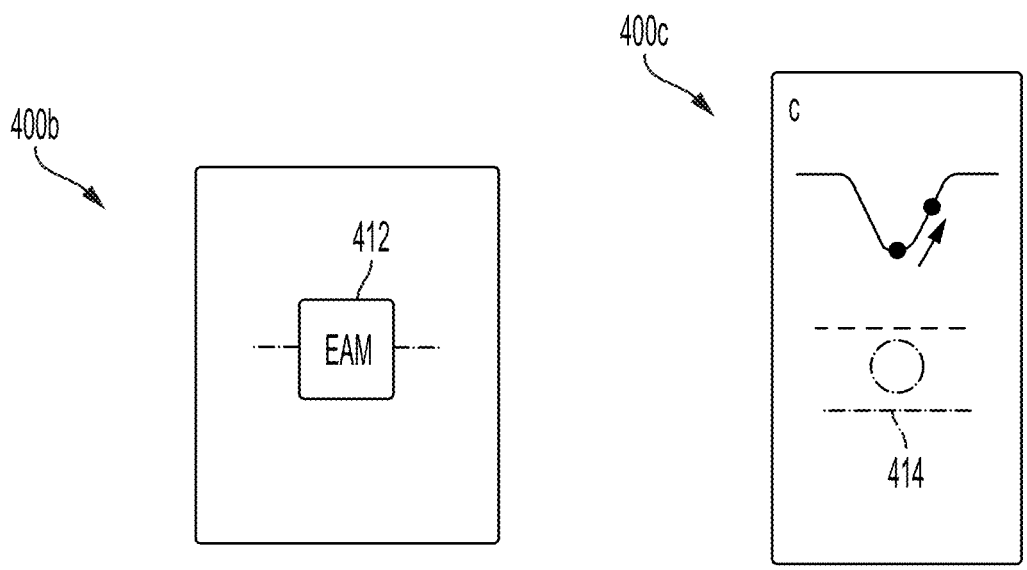
FIG. 4B
FIG. 4C

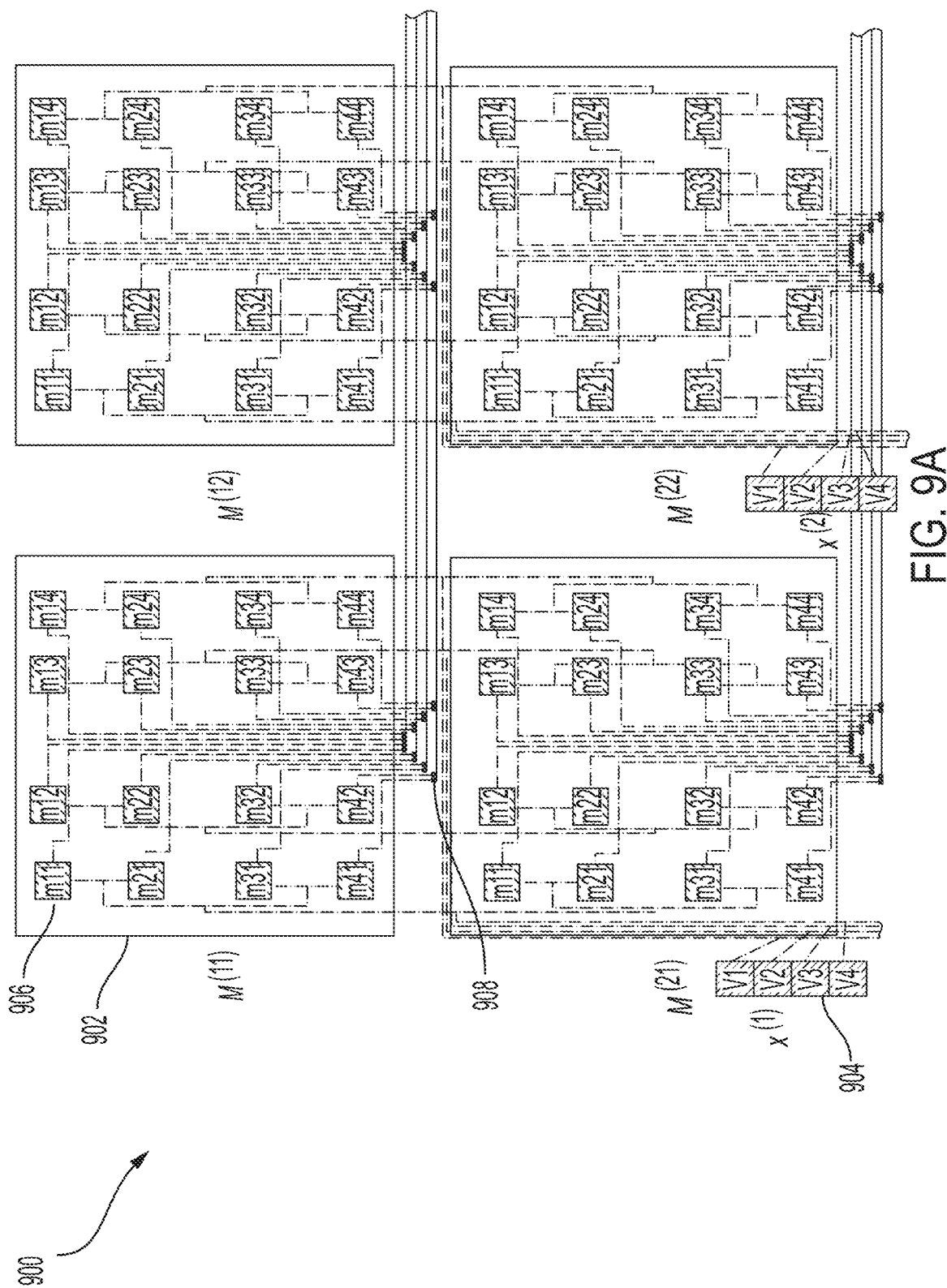

SYSTEMS AND METHODS FOR ANALOG COMPUTING USING A LINEAR PHOTONIC PROCESSOR

RELATED APPLICATIONS

This Application claims priority under 35 § USC 119(e) to U.S. Provisional Patent Application Ser. No. 62/879,936, filed Jul. 29, 2019, entitled "LINEAR PHOTONIC PROCESSOR," and this Application claims priority under 35 § USC 119(e) to U.S. Provisional Patent Application Ser. No. 62/939,480, filed Nov. 22, 2019, entitled "SYSTEMS AND METHODS FOR ANALOG COMPUTING," which are hereby incorporated herein by reference in their entirety.

BACKGROUND

Conventional computation uses processors that include circuits of millions of transistors to implement logical gates on bits of information represented by electrical signals. The architectures of conventional central processing units (CPUs) are designed for general purpose computing, but are not optimized for particular types of algorithms. Consequently, specialized processors have been developed with architectures better-suited for particular algorithms. Graphical processing units (GPUs), for example, have a highly parallel architecture that makes them more efficient than CPUs for performing image processing, graphical manipulations, and other parallelizable applications, such as for neural networks and deep learning.

BRIEF SUMMARY

Some embodiments are directed to an apparatus for implementing signed numerical values, the apparatus comprising: an optical detector comprising a first terminal and a second terminal; a first switch coupling the first terminal of the optical detector to either a node or a reference voltage; a second switch coupling the second terminal of the optical detector to either the node or to a voltage rail; and control circuitry configured to: produce a positively-signed numerical value output at least in part by setting the first switch to couple the first terminal to the reference voltage and setting the second switch to couple the second terminal to the node; and produce a negatively-signed numerical value output at least in part by setting the first switch to couple the first terminal to the node and setting the second switch to couple the second terminal to the voltage rail.

Some embodiments are directed to an optical processing system, comprising: a first plurality of optical modulators, each configured to receive an input optical signal, modulate the input optical signal, and output a first optical signal representing an element of a vector; a second plurality of optical modulators, each optically coupled to an optical modulator of the first plurality of optical modulators and configured to receive the first optical signal, modulate the first optical signal, and output a second optical signal representing a portion of a matrix-vector multiplication between the vector and a matrix; a plurality of optical detectors each optically coupled to optical modulators of the second plurality of optical modulators and configured to convert the second optical signal into an electrical signal representing the portion of the matrix-vector multiplication, wherein each optical detector of the plurality of optical detectors comprises a first terminal and a second terminal; a first switch coupling the first terminal of a first optical detector to either an output node or a reference voltage; a second switch coupling the second terminal of the first optical detector to either the output node or to a voltage rail; and control circuitry configured to: produce a positively-signed numerical value output at least in part by setting the first switch to couple the first terminal of the first optical detector to the reference voltage and setting the second switch to couple the second terminal of the first optical detector to the output node; and produce a negatively-signed numerical value output at least in part by setting the first switch of the first optical detector to couple the first terminal to the output node and setting the second switch of the first optical detector to couple the second terminal to the voltage rail.

Some embodiments are directed to a method for implementing signed numerical values output by optical detectors of an optical processor, the method comprising: converting, using an optical detector comprising a first terminal and a second terminal, an output optical signal into a first electrical signal, the output optical signal being output by a portion of the optical processor; determining, using an at least one conventional processor coupled to the optical processor, whether the first electrical signal represents a positively-signed numerical value or a negatively-signed numerical value; arranging, using control circuitry of the optical processor, settings of a first switch coupled to the first terminal and settings of a second switch coupled to the second terminal in response to determining whether the first electrical signal represents the positively-signed numerical value or the negatively-signed numerical value, wherein the control circuitry is configured to: produce a positively-signed numerical value output at least in part by setting the first switch to couple the first terminal to a reference voltage and setting the second switch to couple the second terminal to a node; and produce a negatively-signed numerical value output at least in part by setting the first switch to couple the first terminal to the node and setting the second switch to couple the second terminal to a voltage rail; and outputting, from the optical detector, the first electrical signal so that the first electrical signal passes through either the first switch or the second switch based on the determination of whether the first electrical signal represents a positively-signed numerical value or a negatively-signed numerical value.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 4A-4C are illustrative examples of intensity modulators configured to optically represent zero, in accordance with some embodiments of the technology described herein;

FIGS. 9A-9D are a schematic diagram illustrating a photonic processor arranged into sub-matrices, in accordance with some embodiments of the technology described herein;

DETAILED DESCRIPTION

Figure 1:
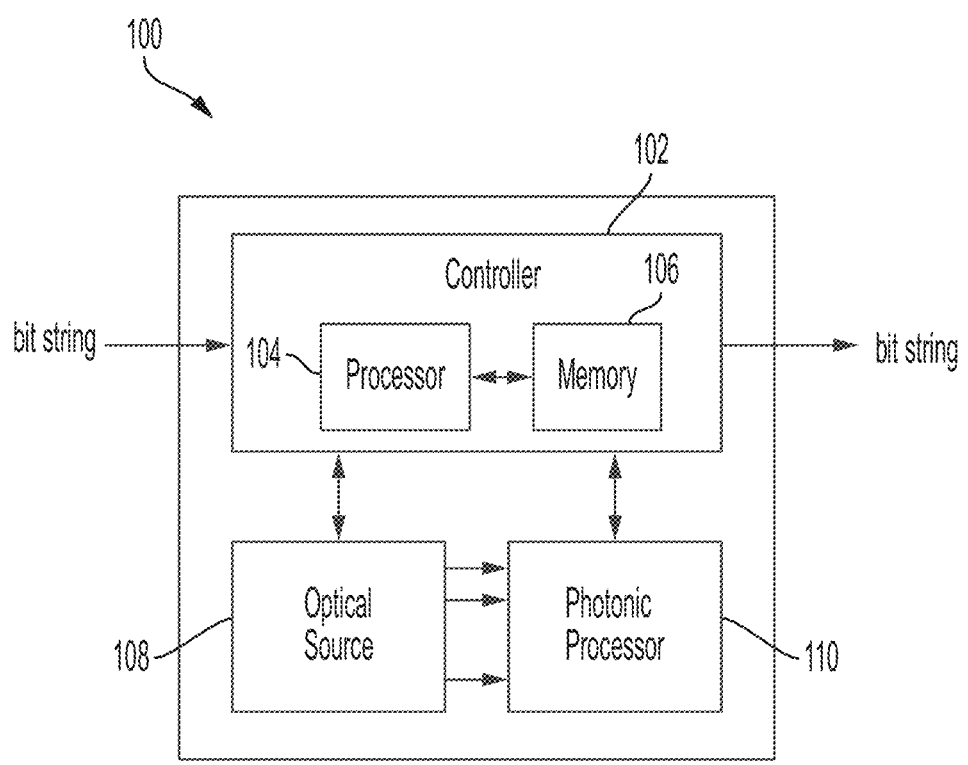
FIG. 1 is a schematic diagram illustrating an example of a photonic processing system, in accordance with some embodiments of the technology described herein.

Processors based on electrical circuits face limitations regarding speed and efficiency due to electrical properties such as impedance. For example, connecting multiple processor cores and/or connecting a processor core to a memory uses a conductive trace with a non-zero impedance. Large values of impedance limit the maximum rate at which data can be transferred through the trace with a negligible bit error rate. For processing that requires billions of operations, these delays can result in a significant loss of time. In addition to electrical circuits' inefficiencies in speed, the heat generated by the dissipation of energy caused by the impedance of the circuits is also a barrier in developing electrical processors.

The inventors have recognized and appreciated that using light signals instead of or in combination with electrical signals overcomes many of the aforementioned problems with electrical computing. Light signals travel at the speed of light in the medium in which the light is traveling; thus the latency of photonic signals is far less of a limitation than electrical propagation delay. Additionally, no power is dissipated by increasing the distance traveled by the light signals, opening up new topologies and processor layouts that would not be feasible using electrical signals. Thus, light-based processors, such as a photonics-based processor, may have better speed and efficiency performance than conventional electrical processors.

The inventors have recognized and appreciated that a light-based processor, such as a photonics-based processor, may be well-suited for particular types of algorithms. For example, many machine learning algorithms, e.g. support vector machines, artificial neural networks, probabilistic graphical model learning, rely heavily on linear transformations on multi-dimensional arrays/tensors. The simplest example is multiplying a vector by a matrix, which using conventional algorithms has a complexity on the order of $O(N^2)$, where N is the dimensionality of a square matrix being multiplied by a vector of the same dimension. The inventors have recognized and appreciated that a photonics-based processor can perform linear transformations, such as matrix multiplication, in a highly parallel manner by propagating a particular set of input light signals through a configurable array of active optical components. Using such implementations, matrix-vector multiplication of dimension N=512 can be completed in hundreds of picoseconds, as opposed to the tens to hundreds of nanoseconds using conventional electronic circuit-based processing.

General matrix-matrix (GEMM) operations are ubiquitous in software algorithms, including those for graphics processing, artificial intelligence, neural networks, and deep learning. GEMM calculations in today's computers are typically performed using transistor-based systems such as GPU systems or systolic array systems. GEMM calculations can also be performed in the photonics domain by mixing an array of input light signals representing elements of the input vector using a mesh array of interferometers representing elements of the input matrix.

Matrix-vector multiplication using a photonics array can be highly power efficient when compared to their electronic counterparts as light signals can propagate within a semiconductor substrate with a minimal amount of loss. The inventors have recognized and appreciated a number of challenges associated with the use of such photonics arrays. Although interference is mathematically described by a unitary matrix, the scheme can be generalized to an arbitrary linear transformation by intentionally adding loss into the mesh array of interferometers. However, photonics arrays often use practically-lossless interferometers that do not exhibit phase-dependent loss. This property can restrict the modulation schemes that are allowable in the system; in particular, it prevents the usage of high-bandwidth (e.g., up to 100 GHz), junction-based modulation schemes. Additionally, the number of optical devices that each optical path "sees" scales with the dimensionality of the matrix. This causes the amount of loss imparted on each optical signal to be larger for larger matrices. Non-zero insertion loss in real-world modulators thus sets a practical limit on the size of the matrix that can be represented in such a photonic processing system. Moreover, programming the matrix into the array of interferometers can be challenging, as the elements of the matrix must be converted by an algorithm into phase settings of each interferometer.

Accordingly, the inventors have developed a novel photonic processing architecture for performing matrix-vector multiplication, a core operation of GEMM operations, that avoids or mitigates the above-described challenges. The photonic processing architecture performs matrix-vector multiplication by modulating the intensity of an array of light signals to encode elements of an input vector, attenuating or amplifying the array of light signals to perform multiplication between elements of an input matrix and the elements of the input vector, detecting the light signals with an array of output detectors, and summing the resulting photodetector current to produce the final output result representing the matrix-vector product.

The inventors have recognized and appreciated that such a photonic processing architecture can utilize incoherent light (e.g., light in which the electromagnetic waves do not maintain a fixed and predictable phase relationship with each other over a period of time) for its operations. An advantage of using an array of incoherent light sources is that no phase correcting scheme is necessary (e.g. to correct for thermal drift and/or device fabrication imperfections). Additionally, the inventors have recognized and appreciated that in such a photonic processing architecture, the matrix elements can be directly encoded in the attenuators. Finally, the inventors have recognized that optical paths in such a photonic processing architecture pass through two modulators (e.g., a vector modulator and a matrix modulator) regardless of the size of the matrix being encoded. The photonic processing architectures described herein thus allows for modulation schemes with coupled amplitude and phase modulation, as well as dynamic loss, loss-scaling that does not scale with the size of the matrix, and a more direct encoding scheme while maintaining the power efficiency advantage of a photonics-based GEMM processor.

Following below are more detailed descriptions of various concepts related to, and embodiments of, techniques for performing GEMM operations using a linear photonic processor. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a schematic diagram of a photonic processing system implementing photonic processing techniques, according to some embodiments of the technology described herein. Photonic processing system 100 includes a controller 102, an optical source 108, and a photonic processor 110. The photonic processing system 100 receives, as an input from an external processor (e.g., a CPU), an input vector and/or matrix represented by a group of input bit strings and produces an output vector and/or matrix represented by a group of output bit strings. For example, if the input vector is an M-dimensional vector, the input vector may be represented by M separate bit strings, each bit string representing a respective component of the vector. Alternatively or additionally, for example, if an input matrix is an N×N matrix, the input matrix may be represented by $N^2$ separate bit strings, each bit string representing a respective component of the input matrix. The input bit string may be received as an electrical or optical signal from the external processor and the output bit string may be transmitted as an electrical or optical signal to the external processor.

In some embodiments, the controller 102 does not necessarily output an output bit string after every process iteration. Instead, the controller 102 may use one or more output bit strings to determine a new input bit stream to feed through the components of the photonic processing system 100. In some embodiments, the output bit string itself may be used as the input bit string for a subsequent iteration of the process implemented by the photonic processing system 100. In other embodiments, multiple output bit streams are combined in various ways to determine a subsequent input bit string. For example, one or more output bit strings may be summed together as part of the determination of the subsequent input bit string.

In some embodiments, the controller 102 includes a processor 104 and a memory 106 for controlling the optical source 108 and/or photonic processor 110. The memory 106 may be used to store input and output bit strings and/or results from the photonic processor 110. The memory 106 may also store executable instructions that, when executed by the processor 104, control the optical source 108 and/or control components of the photonic processor 110 (e.g., encoders, phase shifters, and/or detectors). For example, the memory 106 may store executable instructions that cause the processor 104 to determine new input values to send to the photonic processor 110 based on the number of computational iterations that have occurred. Thus, the output matrix transmitted by the photonic processing system 100 to the external processor may be the result of multiple, accumulated multiplication operations, not simply a single multiplication operation. In another embodiment, the result of the computation by the photonic processing system 100 may be operated on digitally by the processor 104 before being stored in the memory 106. The operations on the bit strings may not be simply linear, but may also be non-linear or, more generally, be Turing complete.

The optical source 108 may be configured to provide the photonic processor 110 with N optical signals, in accordance with some embodiments of the technology. Optical source 108 may include, for example, one or more coherent and/or incoherent light sources configured to produce the N optical signals. Optical light source 108, in some embodiments, may include a laser configured to emit light at a wavelength $\lambda_0$. The wavelength of emission may be in the visible, infrared (including near infrared, mid infrared and far infrared) or ultraviolet portion of the electromagnetic spectrum. In some embodiments, $\lambda_0$ may be in the O-band, C-band or L-band. In some embodiments, optical light source 108 may include multiple lasers configured to emit light at different wavelengths $\lambda_1, \lambda_2, \ldots, \lambda_n$.

Each output of optical source 108 may be coupled one-to-one to a single input of the photonic processor 110, in accordance with some embodiments of the technology described herein. In some embodiments, optical source 108 may be disposed on the same substrate (e.g., a same chip) as the photonic processor 110. In such embodiments, the optical signals may be transmitted from the optical source 108 to the photonic processor 110 in waveguides (e.g., silicon photonic waveguides) disposed on the same substrate. In other embodiments, the optical source 108 may be disposed on a separate substrate from the photonic processor 110. In such embodiments, the optical signals may be transmitted from the optical source 108 to the photonic processor 110 through one or more optical fibers.

The photonic processor 110 may perform matrix-vector, matrix-matrix, and/or tensor-tensor multiplication operations, in accordance with some embodiments of the technology described herein. In some embodiments, the photonic processor 110 includes two parts: modulators configured to encode elements of the input vector, matrix, and/or tensor in the amplitude and/or intensity of the optical signals from optical source 108 (see e.g., amplitude modulators 204 and 208 of FIG. 2), and optical detectors configured to detect and convert optical signals to an electrical signal proportional to a product of the encoded elements (see e.g., detectors 210 of FIG. 2). The photonic processor 110 outputs these electrical signals to the controller 102 for further processing and/or output to the external processor.

In some embodiments, one or more of the input matrices or tensors may be too large to be encoded in the photonic processor using a single pass. In such situations, one portion of the large matrix may be encoded in the photonic processor and the multiplication process may be performed for that single portion of the large matrix and/or matrices. The results of that first operation may be stored in memory 106. Subsequently, a second portion of the large matrix may be encoded in the photonic processor and a second multiplication process may be performed. This "tiling" of the large matrix may continue until the multiplication process has been performed on all portions of the large matrix. The results of the multiple multiplication processes, which may be stored in memory 106, may then be combined to form a final result of the tensor multiplication operation.

In some embodiments, the photonic processor 110 may convert N separate optical pulses into electrical signals. In some embodiments, the intensity and/or phase of each of the optical pulses may be measured by optical detectors within the photonic processor 110, as described in more detail in connection with at least FIGS. 2 and 3. The electrical signals representing those measured values may then be electrically summed and/or output to the controller 102 for use in further computations and/or display.

Figure 2:
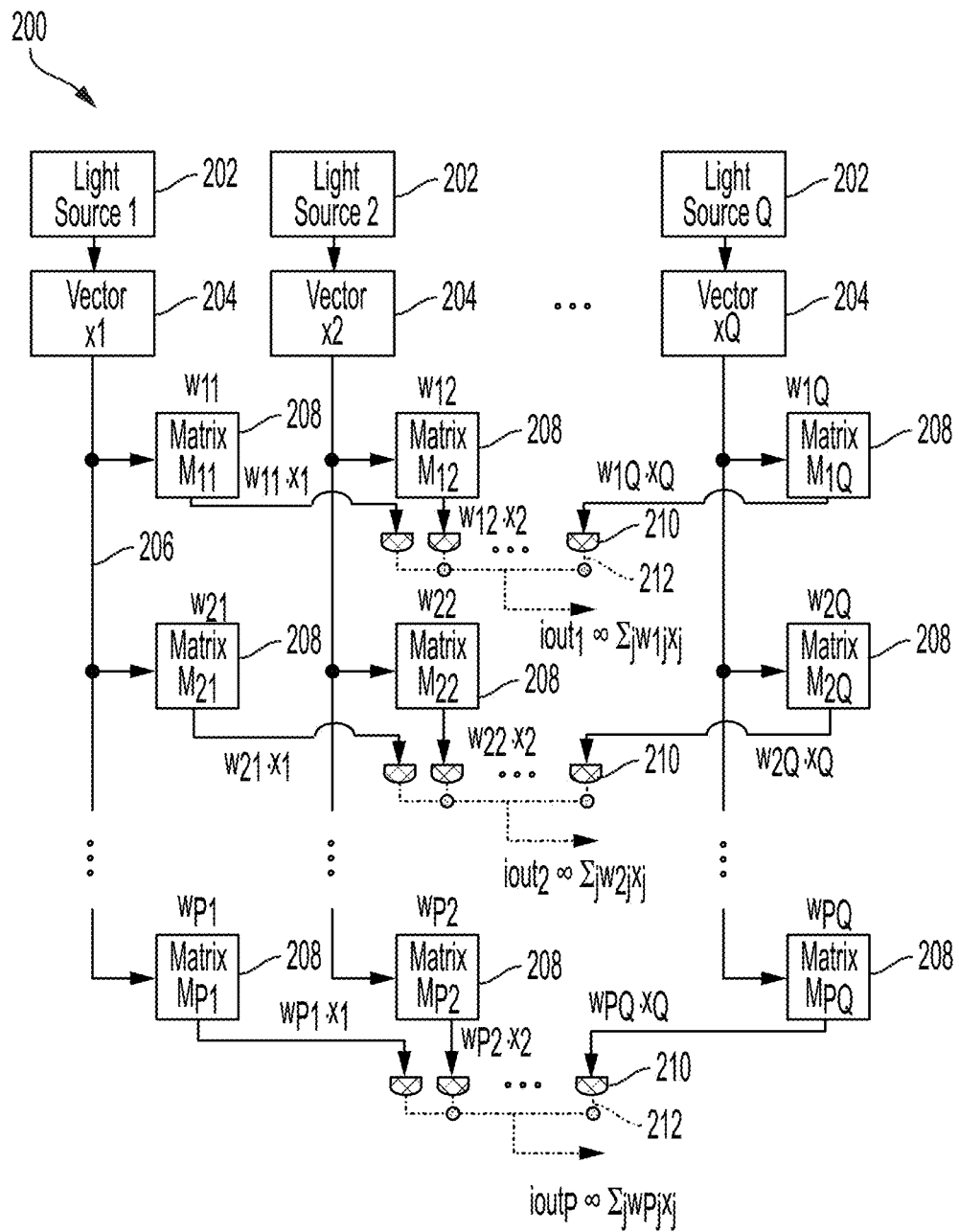
FIG. 2 is a schematic diagram illustrating a linear photonic processor, in accordance with some embodiments of the technology described herein.

FIG. 2 is a schematic diagram illustrating an example of a linear photonic processor 200, in accordance with some embodiments of the technology described herein. Linear photonic processor 200 may be implemented as the optical source 108 and photonic processor 110 of photonic processing system 100 as described in connection with FIG. 1.

In some embodiments, linear photonic processor 200 may be configured to perform the matrix-vector multiplication operation $\vec{y} = w\vec{x}$, where $w$ is an input P-by-Q matrix, $\vec{x}$ is an input vector with Q elements, and $\vec{y}$ is the output vector with P elements. Light sources 202 may produce coherent or incoherent light that is passed to Q first amplitude modulators 204. Light sources 202 may be located on a same substrate as the first amplitude modulators 204 in some embodiments, and light may be passed to the first amplitude modulators 204 through photonic waveguides. In some embodiments, light sources 202 may be located on a different substrate than first amplitude modulators 204, and light may be passed to first amplitude modulators 204 at least in part through optical fibers.

In some embodiments, first amplitude modulators 204 may be configured to encode elements of the input vector into the amplitude of the optical signals received from light sources 202 based on a respective input bit string (e.g., from a controller, as in FIG. 1). Modulation mechanisms could include, for example, electro-mechanical, plasma dispersion, electro-optic ($\chi^{(2)}, \chi^{(3)}, \chi^{(4)}, \ldots$), thermo-optic, and/or piezo-electrical-optical. Let $I_j$ be the intensity of a received optical signal that is the input of the $j^{th}$ first amplitude modulator. Each first amplitude modulator $j$ modulates the intensity of the light to encode the value of $x_j$ such that each first amplitude modulator $j$ outputs a first optical signal having an intensity $x_j I_j$.

In some embodiments, first amplitude modulators 204 may be a variable attenuator or any other suitable amplitude modulator controlled by a DAC (not pictured), which may further be controlled by the controller (e.g., controller 102 of FIG. 1). Some amplitude modulators are known for telecommunication applications and may be used in some embodiments. In some embodiments, a variable beam splitter may be used as a first amplitude modulator 204, where only one output of the variable beam splitter is kept and the other output is discarded or ignored. Other examples of amplitude modulators that may be used in some embodiments include traveling wave modulators, cavity-based modulators, Franz-Keldysh modulators, plasmon-based modulators, 2-D material-based modulators and nano-opto-electromechanical switches (NOEMS).

In some embodiments, the first optical signals from first amplitude modulators 204 may be split $\log_2 (P)$ times and transmitted to P second amplitude modulators 208 using photonic waveguides 206. Photonic waveguides 206 may comprise, for example, silicon photonic waveguides or any other suitable dielectric photonic waveguide material. The intensity of the first optical signals after being split (e.g., when received by each second amplitude modulator 208) is $x_j I_j / P$.

Each of the second amplitude modulators 208 may be configured to encode one value of one element of the matrix $w$, in some embodiments. The second amplitude modulators 208 may be a same kind of modulator as the first amplitude modulators 204, or alternatively, may be a different kind of modulator as the first amplitude modulators 204. There may be a total of P×Q second amplitude modulators to represent the entire matrix $w$. The received first optical signals with intensity $x_j I_j / P$ may be modulated by the second amplitude modulators 208 in the $p^{th}$ row of the matrix $w$ to produce a second optical signal having an intensity $w_{pj} x_j I_j / P$. This optical intensity represents a multiplication of the matrix element $w_{pj}$ and vector element $x_j$ in an amplitude of the output optical signal.

In some embodiments, the output second optical signal that is output by each second amplitude modulator 208 may be transmitted to and detected using an optical detector 210. The optical detectors 210 may be, for example, photodetectors configured to produce a photocurrent that is proportion to the intensity of light incident on the detector. In particular, the photocurrent produced by an optical detector 210 located in row p and column j is $i_{pj} \propto w_{pj} x_j I_j / P$. In some embodiments, the optical detectors 210 may be, for example, photodetectors as described in U.S. Patent Application Publication No. 2020-0228077 filed May 14, 2019 and titled "Optical Differential Low-Noise Receivers and Related Methods," which is hereby incorporated herein by reference in its entirety.

In some embodiments, the photocurrent generated from optical detectors 210 in each row may be combined to produce a summed output $i_{out_p} = \Sigma_j i_{pj} \propto y_p = \Sigma_j w_{pj} x_j$ representing an element of the output vector $\vec{y}$ which is a product of the vector $\vec{x}$ and a row of matrix w. This summation can be performed by, for example, connecting all the cathodes of all the photodetectors of a single row together using conductive traces 212 (e.g., metal traces). In some embodiments, the value of the summed photocurrent may be read out using a combination of a transimpedance amplifier (TIA) and an analog-to-digital converter (ADC) with an appropriate bit width and precision. The readout value may then be returned to the controller (e.g., controller 102 of FIG. 1) for use in further computation and/or applications.

In some embodiments, it may be appreciated that the number of optical detectors 210 may be reduced by routing the optical signals that are output by the second amplitude modulators 208 to a same detector. This alteration will still produce an appropriate electrical signal output because the matrix-vector multiplication information is encoded in the intensity of the light which is directly proportional to the photocurrent produced by the optical detector. To prevent unwanted interference between the signals routed to the same detector, one can use a sufficiently incoherent light source or can also time-multiplex the optical detectors 210 such that a first output signal arrives first, a second output signal arrives after the first, a third output signal arrives after the second, and so on. The detector readout circuitry may use an electrical storage circuit to store the charges that have been accumulated in such an embodiment.

In prior photonic processing architectures, the inputs to the modulators encoding the matrix w must be calculated using a computationally expensive decomposition procedure. In the described linear photonic processor 200, the inputs to each matrix modulator are the elements of the matrix w itself, completely eliminating the need for any decomposition prior to performing the optical computation.

Additionally, as a direct result of the "Euclidean-space" representation of the matrix w rather than the "phase-space" representation used by prior photonic processing architectures, there are $N^2$ optical paths for an N-by-N matrix in the above-described linear photonic processing architecture, each associated with a single element of the w matrix. This result has two important implications for the performance and scaling of this architecture.

First, each optical path contains two modulators, regardless of the size of the matrix being represented. In contrast, optical paths in some photonic processing architectures contain O(N) modulators. Real-world modulators suffer from non-zero insertion loss, thus limiting the size of matrix that can be represented for a given acceptable optical loss. The above-describe linear photonic processor 200 does not suffer from this limitation on matrix size.

Second, in other photonic processing architectures, each matrix element is generally associated with many optical paths through an optical array. The number of paths passing through any given "phase-space" modulator affect many elements of the represented matrix. Moreover, the number of elements affected by a particular modulator is not constant, giving rise to a non-uniform error-sensitivity. For example, the sensitivity of modulators near the center of a modulator array may be much higher than for those modulators at the edges and corners. This is because the center modulators are in the propagation path of a larger number of input optical signals than the edge or corner modulators. In contrast, the errors in each "Euclidean-space" matrix modulator in the above-described linear photonic processor 200 affect only that specific value of the matrix element.

It may be further appreciated that the above-described linear photonic processor 200 may reduce a number of photonic crossings (e.g., of waveguides 206) within a photonic processing architecture, in some embodiments. Due to the nature of the data flow in a matrix-vector multiplication (e.g., a single vector element may be broadcast to multiple rows, and the signals from the different columns of each row may be combined together to produce a single output vector element), there will inherently be crossings in the data path that can be in the photonic domain or in the electrical domain. For example, for the case of the photonic processor, evaluating the partial product $M_{ij}x_j$ involves broadcasting of $x_j$ to multiple rows of i. At this point, no crossing is necessary. But, to perform the summation of the different columns within a single row, i.e. $\Sigma_j M_{ij}x_j$, photonic or electrical crossings become necessary.

A crossing between two photonic waveguides can be physically achieved by using a multi-mode interferometer (MMI) crossing within the same semiconductor layer or by using another layer of the semiconductor substrate. The photonic crossings are desirable as opposed to electrical crossing because photonic crossings can reduce the overall capacitance of the circuits that can adversely affect the bandwidth of the system. However, MMI-based crossings can induce significant cross-talk and loss to the optical signal.

The nature of the binary tree used to broadcast the value of $x_j$ is in fact amenable for reducing the number of necessary crossings. For example, consider the case when the value $x_j$ is split N times (for a multiplication between an N×N matrix and a vector of size N). If the split is performed with a single 1-to-N splitter, approximately the order of N/2 photonic crossings may be needed. On the other hand, if the split is performed with binary 1-to-2 splitters that are spaced apart in a tree fashion, one may need on the order of N photonic crossings to clear the broadcasting waveguides.

In some embodiments, when the cross-talk and loss become significant because of the number of photonic waveguide crossings, it may be desirable to design the crossings in the electrical domain at the expense of extra capacitance. Crossings in the electrical domain consist of routing the two signals in two different metal layers in the same semiconductor substrate. The electrical crossings can be placed at the output of the photodetectors.

Figure 3A:
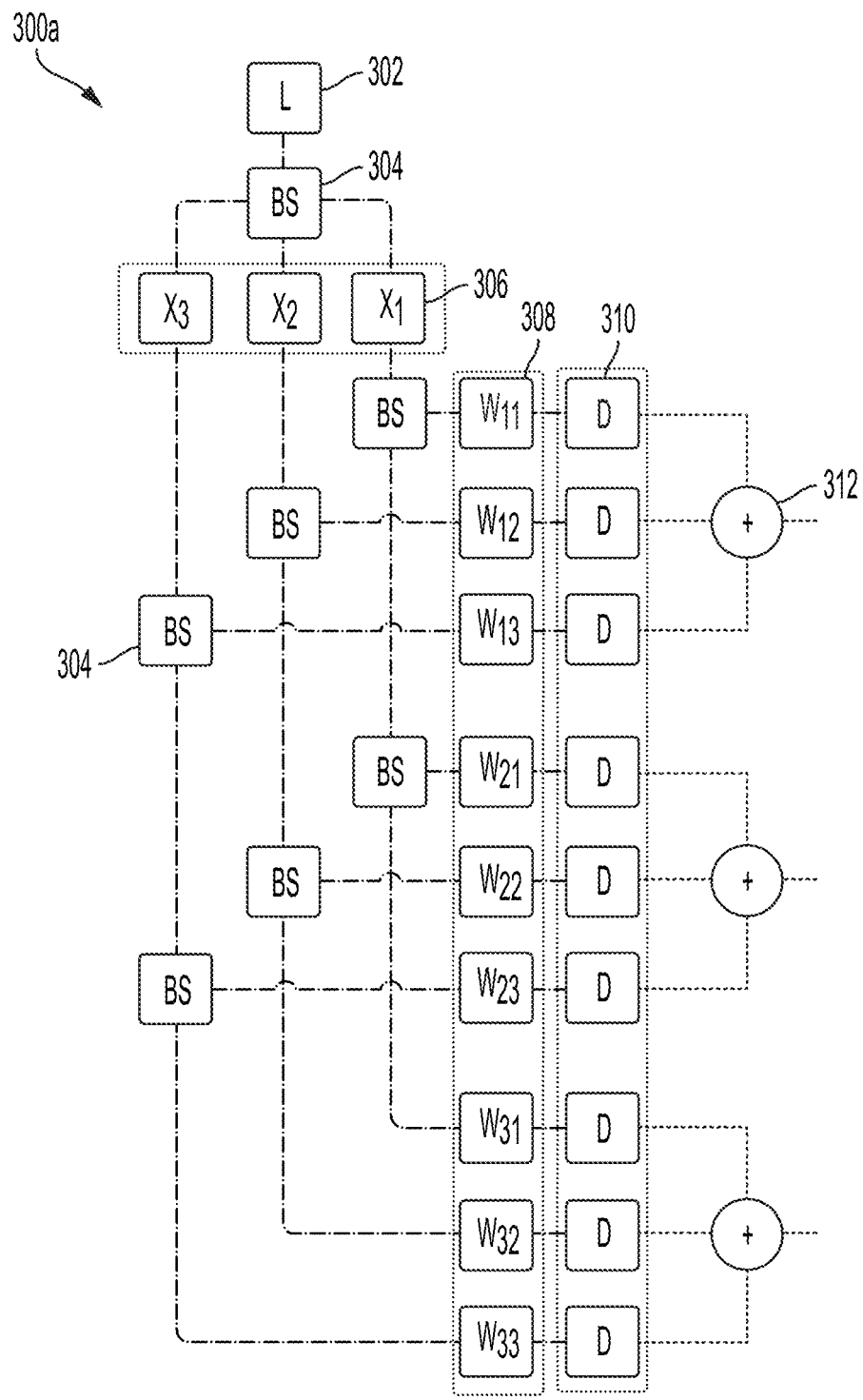
FIG. 3A is a block diagram illustrating an example of a photonic architecture for implementing a matrix-vector operation, in accordance with some embodiments of the technology described herein.

FIG. 3A is a block diagram of an illustrative example of a linear photonic processor 300a for implementing a matrix-vector operation, in accordance with some embodiments of the technology described herein. Linear photonic processor 300a is similar to linear photonic processor 200 as described in connection with FIG. 2 and is configured to perform a same matrix-vector multiplication operation $\vec{y}=w\vec{x}$, where w is an input P-by-Q matrix, $\vec{x}$ is an input vector with Q elements, and $\vec{y}$ is the output vector with P elements.

In some embodiments, linear photonic processor 300a may include a single light source 302 configured to output an optical signal. The light source 302 may be a coherent (e.g., a laser) or incoherent light source (e.g., thermal lights, superluminescent diodes, LEDs, etc.). In some embodiments, the optical signal output by the light source 302 may pass through a beam splitter 304 configured to split the optical signal into Q optical signals, each being transmitted to a first amplitude modulator 306.

As in linear photonic processor 200 of FIG. 2, first amplitude modulators 306 may be configured to encode elements of the input vector into the amplitude of the optical signals received from light source 302. The first amplitude modulators 306 may be a variable attenuator or any other suitable amplitude modulator controlled by a DAC (not pictured), which may further be controlled by the controller (e.g., controller 102 of FIG. 1). Some amplitude modulators are known for telecommunication applications and may be used in some embodiments. In some embodiments, a variable beam splitter may be used as a first amplitude modulator 204, where only one output of the variable beam splitter is kept and the other output is discarded or ignored. Other examples of amplitude modulators that may be used in some embodiments include traveling wave modulators, cavity-based modulators, Franz-Keldysh modulators, plasmon-based modulators, 2-D material-based modulators and nano-opto-electromechanical switches (NOEMS).

The first amplitude modulators 306 may then output first optical signals that represent elements of the input vector in amplitudes (e.g., intensity) of the first optical signals. The first optical signals may be transmitted through additional beam splitters 304 so that the first optical splitters may be split P times. The split first optical signals may then be transmitted to P second amplitude modulators 308.

Each of the second amplitude modulators 308 may be configured to encode one value of one element of the matrix w, in some embodiments. The second amplitude modulators 308 may be a same kind of modulator as the first amplitude modulators 306, or alternatively, may be a different kind of modulator as the first amplitude modulators 306. The received first optical signals may be modulated by the second amplitude modulators 208 to produce a second optical signal having an intensity representing a multiplication of the matrix element $w_{pj}$ and vector element $x_j$ in an amplitude of the output second optical signal.

In some embodiments, the output second optical signal that is output by each second amplitude modulator 308 may be transmitted to and detected using an optical detector 310. The optical detectors 310 may be, for example, photodetectors configured to produce a photocurrent that is proportion to the intensity of light incident on the detector.

In some embodiments, some outputs of optical detectors 310 may be transmitted to an electrical summing circuit 312. As shown in the example of FIG. 3A, the outputs of optical detectors 310 that are coupled to second amplitude modulators 308 that are configured to represent a matrix row (e.g., elements $w_{11}$, $w_{12}$, and $w_{13}$) are transmitted to a same electrical summing circuit 312. In such embodiments, the electrical summing circuits 312 may comprise circuitry configured to add received photocurrents from the optical detectors 310 such that an output electrical signal from an electrical summing circuit 312 represents a product of the input vector and a matrix row (e.g., for the first row of the matrix w, electrically representing $x_1w_{11}+x_2w_{12}+x_3w_{13}$).

In some embodiments, the electrical summing circuits 312 may comprise voltage summer circuits. For example, the electrical summing circuits 312 may comprise a resistor network and an amplifier circuit. In some embodiments, the electrical signals output by the optical detectors 310 may be summed by simply tying the output nodes together. There are two advantages to performing this electrical summation prior to reading out an output result. First, this earlier summation may reduce the number of mixed-signal readout circuitry used in the photonic processing architecture such that only P readout circuitry elements are used in the architecture (instead of a total of P×Q of such circuitry as in the example of linear photonic processor 200 of FIG. 2). Second, the earlier summation increases the size of the photocurrent that is to be detected by the readout circuitry. Before the optical signals reach each second amplitude modulator 308, they are split P-ways. Combining the photocurrent generated from Q different photodetectors can offset the reduction in intensity due to the split (if Q≥P).

Figure 3B:
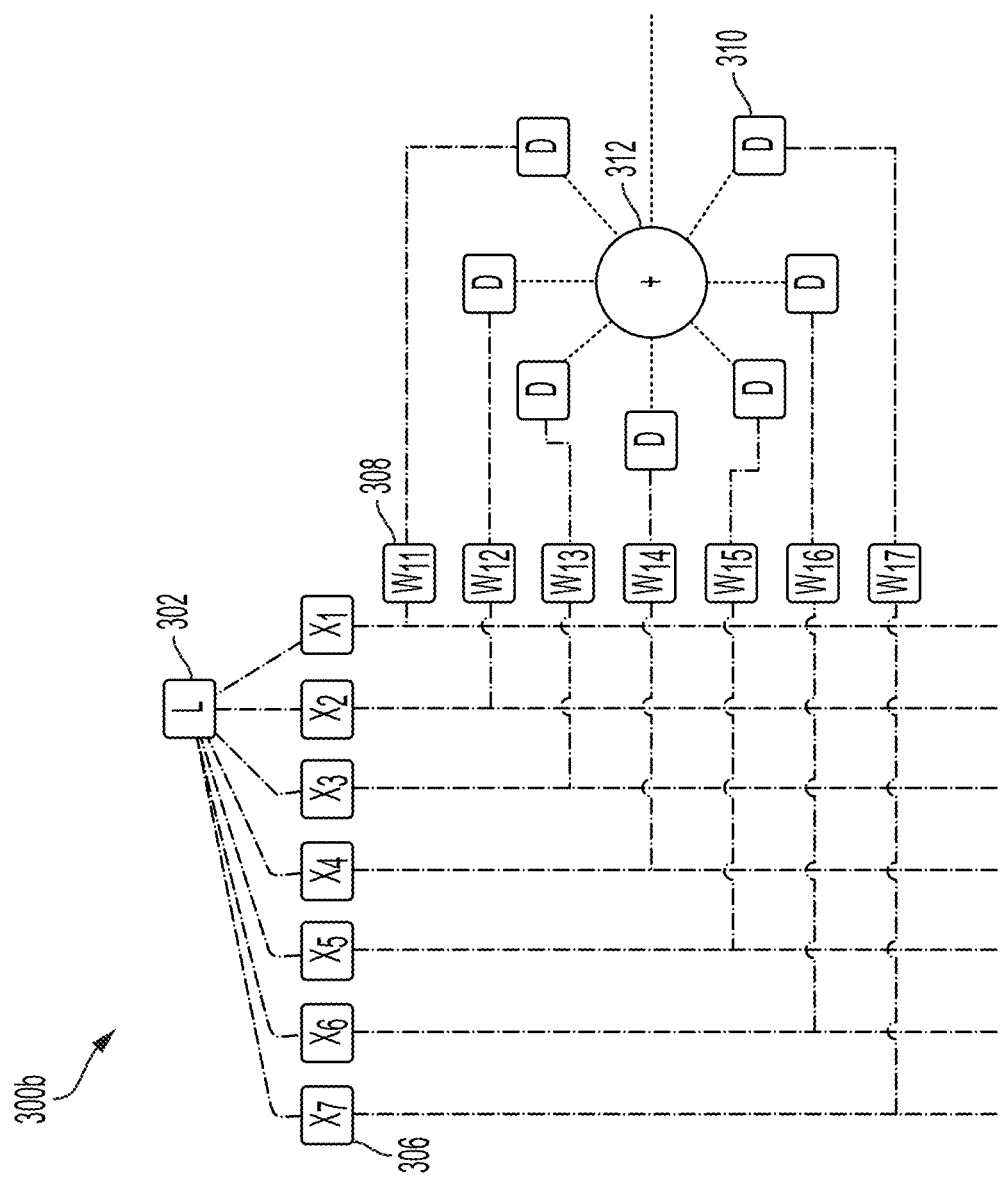
FIG. 3B is a block diagram illustrating an example of a photonic architecture layout for minimizing electrical path length, in accordance with some embodiments of the technology described herein.

FIG. 3B is a block diagram illustrating an example of a linear photonic processor 300b having a layout configured to minimize electrical path length, in accordance with some embodiments of the technology described herein. Because electrical wires suffer from parasitic resistances, inductances, and capacitances, it can be useful to design the layout of such electrical wires to minimize these parasitic effects (e.g., by minimizing electrical trace length). The electrical signals output by the optical detectors 310 are electrical currents, and the speed at which these electrical currents can switch may depend on the above-described electrical parasitics. To enable high-speed operation, these electrical parasitics should be minimized.

Linear photonic processor 300b has same components as linear photonic processor 300a of the example of FIG. 3A, though beam splitters 304 are not shown for clarity. However, in the example of FIG. 3B, the optical detectors 310 are disposed in a ring configuration around the electrical summing circuit 312. This ring configuration minimizes lengths of the electrical traces between optical detectors 310 and the electrical summing circuit 312, thereby minimizing electrical parasitics such as resistances, inductances, and capacitances.

I. Non-Linear Relationships Between Code and Signals

Analog computers typically take, as inputs, bit strings that may be converted into some physical process (e.g., electrical, photonic) in which the computation is performed. The computers then output bit strings based on one or more measurements of these physical processes.

In some embodiments, the relationships between the input bit string and the modulated signal as well as the output signal and the output bit string need not be linear. In fact, non-linear signal-to-code relationships may be advantageous for certain algorithms. For example, in some deep learning algorithms related to image classification, it can be more valuable to discriminate between multiple small values while discriminating between multiple large values may be less valuable or unnecessary. Therefore, such algorithms may be run with input DACs and output ADCs that encode values near zero with a larger fraction of the codebook and encode large values near the maximum input/output with a smaller fraction of the codebook. The effective dynamic range of the inputs and the outputs can be increased through the non-linear mappings.

II. Error Correction

Analog computers can incur errors during computation. Analog computers that use electronics fundamentally encounter Johnson-Nyquist noise and electrical shot noise that can cause errors during the readout process. When operating close to the noise floor of the output readout circuitry, the electrical noise may have a small probability of causing a bit flip in the least-significant bits (LSBs) of the output. The probability at which the LSBs flip is higher for a readout circuit with a higher bandwidth. These LSB-flip errors are synonymous to gate errors in digital computing circuits (e.g. multiply-accumulate units) but only affect the LSBs. Therefore, if LSB-flip errors occur, they are limited to an error of a few percent from the correct output. For example, for an N-bit output, a bit flip error in the LSB corresponds to a relative error of $\sim 1/2^N \times 100\%$. This is in contrast to digital computing circuits where gate errors—although highly improbable—can cause an error in the most significant bit (MSB) because digital circuits treat every bit equally. In an analog processing system, such as the linear photonic processors of FIGS. 2, 3A, and 3B, the LSB has a signal power that is closer to the noise power while the more significant bits have signal powers that are exponentially higher than the noise power. As a result, the more significant bits may be exponentially less likely to admit a bit flip error when compared to the LSB.

One way to mitigate bit flip errors is to perform error correction on the computation. The simplest error correction algorithm that can be performed is to increase redundancy by performing the same computation multiple (e.g., at least three) times and perform a majority vote to determine the correct results at a higher probability. Due to the nature of the errors in analog computers that affect the LSBs, the voting does not have to be done on the whole output bit strings. Rather, the voting can be merely done on the LSB, or at least just a few LSBs.

Resiliency of the more significant bits against error gives analog processors an advantage when running algorithms that are robust against small errors, such as artificial neural networks or ordinary differential equation solvers. The inventors have recognized that a faster analog processor—at the cost of higher probability of bit flip errors in the LSBs—can be used to evaluate more resilient algorithms. In some deep learning algorithms (e.g. for image classification) small errors merely cause a reduction in the confidence of the prediction but they do not necessarily cause a degradation in the prediction accuracy.

There are many advantages to using an intensity-based optical system such as the linear photonic processors of FIGS. 2, 3A, and 3B, including a large reduction in sensitivity to temperature fluctuations and fabrication imperfections. Field-based photonic systems often need significant stabilization and trimming to function reliably. The proposed architectures described above are largely immune to such phase errors and fluctuations. Furthermore, as intensity-based architectures do not make use of the phase information in their calculations, they are amenable to intensity modulation schemes that have a coupled phase modulation.

III. Partial Products and their Sums

In some embodiments, the matrix elements $w_{ij}$ and vector elements $x_j$ are represented with a fixed-point number representation. Within this representation, if $w_{ij} \in \{0,1\}^{m_1}$ is an unsigned $m_1$-bit number and $x_j \in \{0,1\}^{m_2}$ is an unsigned $m_2$-bit number, then a total of $m_1+m_2+\log_2(n)$ bits may be used to fully represent the resulting vector element $y_i=\Sigma_j w_{ij} x_j$, where n is the number of columns in matrix w. In general, the number of bits to represent the result of a matrix-vector product may be larger than the number of bits to represent the inputs of the operation. If the analog-to-digital converter (ADC) used to readout values from the photonic processor is unable to readout the output vector at full precision, then the output vector elements may be rounded to the precision of the ADC.

Constructing an ADC with a high bit-precision at bandwidths that correspond to the rate at which input vectors in the form of optical signals are sent through the photonic processing system can be challenging. Therefore, the bit precision of the ADC typically may limit the bit precision at which the matrix elements $w_{ij}$ and the vector element $x_j$ are represented, if a fully precise computation is desired. Accordingly, the inventors have developed a method of obtaining an output vector at its full precision, which can be arbitrarily high, by computing partial products and sums as described below. For the sake of clarity, the number of bits needed to represent either $w_{ij}$ or $x_j$ is assumed to be the same, e.g., $m_1=m_2=m$.

First, the bit-string representation of the matrix element $w_{ij}$ and $x_j$ may be divided into d divisions, with each division containing k=m/d bits. As a result, the matrix element $w_{ij}$ can be written as $w_{ij}=w_{ij}^{[0]}2^{k(d-1)}+w_{ij}^{[1]}2^{k(d-2)}+\ldots+w_{ij}^{[d-1]}2^0$, where $w_{ij}^{[a]}$ is the k-bit value of the $a^{th}$ most significant k-bit string of $w_{ij}$. In terms of bit string, $w_{ij}$ can be written as $w_{ij}=w_{ij}^{[0]}w_{ij}^{[1]}\ldots w_{ij}^{[d-1]}$. Similarly, $x_j$ can also be written as $x_j=x_j^{[0]}2^{k(d-1)}+x_j^{[1]}2^{k(d-2)}+\ldots+x_j^{[d-1]}2^0$, where the vector element $x_j$ can be written as $x_j=x_j^{[0]}x_j^{[1]}\ldots x_j^{[d-1]}\ldots x_j^{[d-1]}$ in terms of its bit string. The multiplication $y_i=\Sigma_j w_{ij} x_j$ can be broken down in terms of these divisions as:

$$y_i = \sum_{p=0}^{2(d-1)} \left\{ \left( \left( \sum_{a,b \in S_p} \sum_j w_{ij}^{[a]} x_j^{[b]} \right) 2^{2k(d-1)-pk} \right) \left( \left( \sum_{a,b \in S_p} \sum_j w_{ij}^{[a]} x_j^{[b]} \right) 2^{2k(d-1)-pk} \right) \right\}$$

where the set $S_p$ is the set of all values of a and b, where a+b=p.

The linear photonic processor can then be programmed to implement the matrix $w_{ij}^{[a]}$ and the input vector $x_j^{[b]}$, each of which is only k-bit precise, in some embodiments. The matrix-vector multiplication produces the intermediate result: $y_i^{[a,b]}=\Sigma_j w_{ij}^{[a]} x_j^{[b]}$. The output vector $y_i^{[a,b]}$ can then be stored and is precise up to $2k+\log_2(n)$ bits. This multiplication is iterated over the different values of a, b within the set $S_p$. The final result can be then be computed by performing the sum $$\sum_{a,b \in S_p} \sum_j w_{ij}^{[a]} x_j^{[b]} = \sum_{a,b \in S_p} y_i^{[a,b]}$$

over the different iterations of a and b with digital electronics (e.g., in the controller or elsewhere).

The method described above allows the user to obtain a fully precise computation by manipulating partial products and their sums, even when the available ADCs are not able to immediately capture the full precision.

IV. Generalizing to GEMM with Tensors by Serializing

The linear photonic processors described herein (e.g., in connection with FIGS. 2, 3A, and 3B) can be extended from a matrix-vector multiplication operation to a matrix-matrix multiplication, in some embodiments. Given an I×J matrix A and a J×K matrix B, the linear photonic processor may be configured to produce an I×K matrix C=AB. The matrix A may be encoded into the second amplitude modulators (e.g., second amplitude modulators 208 or 308) in the photonic processor and a column $b_k$ of matrix B can be encoded into the first amplitude modulators (e.g., first amplitude modulators 204 or 306). The result of each matrix-vector multiplication is a column $c_k$ of the matrix C. By performing the multiplication with different columns of $b_k$ and storing the results in memory (e.g., in the controller 102), the matrix C can be built column-by-column. Similarly, the matrix B can be encoded into the second amplitude modulators in the photonic processor and a row $a_i$ of matrix A can be encoded into the first amplitude modulators. The result of the matrix-vector multiplication, in this case, is a row $c_i$ of the matrix C, and one can build the output matrix C row-by-row.

In some embodiments, the matrices may be too large to be encoded in the photonic processor. In this case, the matrix-matrix multiplication may be performed between a portion of the first large input matrix and a portion of the second large input matrix. The results of this multiplication are stored in a memory. Subsequently, a second portion of the first large input matrix may be encoded in the photonic processor and a second matrix-matrix multiplication may be performed with a portion of the second large input matrix. This "tiling" of the large matrices may continue until the multiplication process is performed on all portions of the two large matrices. The results of the multiplication process may then be combined to generate a final result of the multiplication of two large matrices. This idea of serialization can be applied to tensor-tensor multiplication by processing slices of tensors at a time, storing the results in memory, and then combining the results later to form the output tensor.

V. Application to Neural Networks and Deep Learning

The linear photonic processor described herein (e.g., in connection with FIGS. 2, 3A, and 3B) has wide applicability as it can accelerate various GEMM operations and make them more power-efficient. Today, GEMM is used in linear algebra calculations such as performing eigenvalue decomposition, singular value decomposition, or inverting a matrix. One important application of GEMM is the artificial neural network.

A deep artificial neural network, at its most basic level, involves multiple (layers, up to hundreds of layers, of tensor-tensor multiplications, with each layer's linear transformation followed by a non-linear activation function. Consider a neural network with dimensionality D. For an input tensor with $O(N^D)$ elements and a weight tensor with $O(N^D)$ elements, the amount of computation needed to perform the tensor-tensor multiplication is $O(N^{2D-1})$, while the amount of computation needed to perform the activation function is $O(N^D)$. Therefore, tensor-tensor multiplication typically dominates the computation of a deep neural network, and hence the photonic processors proposed herein can be used to speed up artificial neural network calculations.

Training an artificial neural network typically involves running a back-propagation algorithm. Consider a single layer of a deep artificial neural network with a weight matrix w and a bias vector $\vec{b}$. For an input vector $\vec{x}$, the output result of this layer of neural network is $y_i = f((wx)_i + b_i)$, where f(.) is the nonlinear function that is applied element-wise. In back-propagation with conventional stochastic gradient descent, the weight matrix is adjusted iteratively such that the weight matrix at time t+1 is defined as a function of the weight matrix at time t and a derivative of the loss function with respect to the weights of the weight matrix as follows:

$$w_{ab}(t+1) = w_{ab}(t) - \eta \frac{\partial E}{\partial w_{ab}(t)},$$

where $\eta$ is the learning rate and (a, b) represent the $a^{th}$ row and $b^{th}$ column entry of the weight matrix, w, respectively.

The chain rule of calculus may be applied to compute the gradient of the loss function with respect to any of the parameters within the weight matrix (where for convenience of representation, the definition $z_i = (wx)_i + b_i = \Sigma_j w_{ij} x_j + b_i$ is used) associated with this single input vector x:

$$\frac{\partial E}{\partial w_{ab}} = \sum_{ij} \left(\frac{\partial E}{\partial y_i}\right)\left(\frac{\partial y_i}{\partial z_j}\right)\left(\frac{\partial z_j}{\partial w_{ab}}\right).$$

Computing the derivative of z with respect to $w_{ab}$ results in: $\partial z_j / \partial w_{ab} = \delta_{ja} x_b$. The sum representing the gradient of the loss function can then be rewritten as:

$$\frac{\partial E}{\partial w_{ab}} = \sum_i \left(\frac{\partial E}{\partial y_i}\right)\left(\frac{\partial y_i}{\partial z_a}\right) x_b.$$

The first sum may then be defined as the back-propagated error vector $$e_a = \sum_i \left(\frac{\partial E}{\partial y_i}\right)\left(\frac{\partial y_i}{\partial z_a}\right)$$

where $\vec{x}$ is the input vector, resulting in the final expression:

$$\frac{\partial E}{\partial w_{ab}} = e_a x_b,$$

which is an outer product between the error vector and the input vectors. In non-tensor notation, the expression can be written as:

$$\frac{\partial E}{\partial w} = \vec{e}\,\vec{x}^T.$$

Typically, to reduce the noise in the gradient updates (which can cause the model parameters to jump frequently), the update $\Delta w = \partial E / \partial w$ is not taken from a single data sample (e.g., a single input vector, x, and a single error vector, e). In practice, an average update is computed from the entire batch of training dataset or from a portion of the batch of the training dataset. Denote $\vec{x}^{(q)}$ and $\vec{e}^{(q)}$ to be the $q^{th}$ input vector and error vector from a bag of training dataset with Q total training examples. The update $\Delta w$ may be computed as follows:

$$\Delta w = \frac{1}{Q} \sum_{q=1}^{Q} \vec{e}^{(q)} \vec{x}^{(q)T}.$$

The term $$\sum_{q=1}^{Q} \vec{e}^{(q)} \vec{x}^{(q)T}$$

can be efficiently computed using matrix-matrix products between two matrices $M_e$ and $M_x$. Assuming that the error vector is P elements long and the input vector is R elements long, $M_e$ is then a P×Q matrix whose columns are the error vectors $\vec{e}^{(q)}$ and $M_x$ is a Q×R matrix whose rows are the transposed input vectors $\vec{x}^{(q)T}$. Multiplying the two matrices provides the update:

$$\Delta w = \frac{1}{Q}\sum_{q=1}^{Q} \vec{e}^{(q)}\vec{x}^{(q)T} = \frac{1}{Q}M_e M_x.$$

Because the proposed linear photonic processor operates natively in Euclidean space, it can be used to compute this matrix update $\Delta w$ efficiently. The linear photonic processor described herein is accordingly amenable for not only forward-propagation (evaluation) but also back-propagation (training) of a deep artificial neural network. While the derivation above applies to the fully-connected layer of the form wx+b, any other layer that is composed of a linear transformation followed by a non-linearity can have its gradient computed in a similar fashion.

VI. Tradeoff between Bandwidth and Signal

The inventors have further recognized that the linear photonic processor architectures described herein can perform the sum between partial products (e.g., between the j elements of $\Sigma_j M_{ij}v_j$) in the current domain. Performing this sum in the current domain allows one to tradeoff between the length of the integration time and the amount of signal collected. The amount of signal collected by the output sampling circuits is proportional to the intensity of light collected by the optical detectors and is a function of the input optical power and the optical propagation loss through the photonic processor. When the photonic processor is operating close to the noise floor of the system, the signal-to-noise ratio (SNR) can be increased by choosing a longer integration time. This longer integration time stores a larger amount of electrical charges at the output of the photonic processor, adding up to larger output signals as these electrical charges are read by output sampling circuits. The output sampling circuit may be connected to an analog-digital converter (ADC) which outputs a bit string that describes the amount of electrical charge sensed by the output sampling circuit. For this bit string to be reliable (e.g., multiple measurements produce the same output bit string), the SNR of the photonic processor may need to be high enough to support the effective number of bits (ENOB) of the output. Therefore, the speed of the photonic processor can be chosen such that the SNR of the system is high enough for the desired bit-width of the output bit string.

VII. Rescaling

Analog computing systems for matrix processing have a finite dynamic range limited by physical noise limits (e.g., shot noise, thermal noise, etc.) or architecture-based limits. In computation schemes that are based on dissipation, (e.g., optical or electrical power dissipation) this dissipation fundamentally affects the link budget, SNR, and precision of the processor. To avoid these limitations and increase the amount of signal transmitted through the system, the inventors have appreciated that rows of a matrix can be rescaled to minimize dissipation while still performing a computation that is directly proportional to the desired computation. A matrix m can be rescaled row-wise. Below, the matrix m is multiplied by a vector x. Each row of m can be associated with a different scale factor $\alpha_i$. These scale factors, for example, can either be continuous variables ranging from 0 to infinity or powers of 2. In some embodiments where the rescaling is performed using a digital computer, the scales and rescaling operations can be performed using either floating point numbers or fixed point numbers. The matrix m can also be rescaled tile-wise or matrix-wise. To obtain a tile-wise scaling, the different row scale factors simply may be set to the same value, and to obtain a matrix-wise scaling, the different tile scale factors may be set to the same value.

$$\begin{pmatrix} m_{00} & m_{01} & m_{02} \\ m_{10} & m_{11} & m_{12} \\ m_{20} & m_{21} & m_{22} \end{pmatrix}\begin{pmatrix} x_0 \\ x_1 \\ x_2 \end{pmatrix} \Leftrightarrow \begin{pmatrix} \alpha_0(m_{00}x_0 + m_{01}x_1 + m_{02}x_2) \\ \alpha_1(m_{10}x_0 + m_{11}x_1 + m_{12}x_2) \\ \alpha_2(m_{20}x_0 + m_{21}x_1 + m_{22}x_2) \end{pmatrix}$$

After performing this row-wise rescaling, the scale factors $\alpha_i$ can be removed by dividing the scale factors out of the result of the matrix computation. If the scale factor is a power of two, for example, the scale factor can be removed using electronics energy-efficient bit shift operations. If the row-scale factor is not a power of two, division can be performed. In some embodiments, the entries $m_{ij}$ may be normalized because there is a finite dynamic range for the amplitude modulators. If $\alpha m_{ij} > 1$, the entry saturates at 1. For example, let $m_i=(0.1\ 0.1\ 1\ 0.1)$. If $\alpha=10$, then $\alpha m_i=(1\ 1\ 10\ 1)$. However, the value of 10 cannot be optically represented if the amplitude modulators saturate at a value of 1, and optically the vector will be represented as $\alpha m_i=(1\ 1\ 1\ 1)$. Accordingly, values of the scale factors may be chosen so that the maximum value of an element in the vector $\alpha m_i$ is no greater than 1.

VIII. Computing Real-Valued Matrices with Positive-Only Processors

The inventors have recognized that analog processors can often encode only positive-valued matrices and tensors. For example, when using incoherent light sources, a photonic processor may modulate only the intensity of the optical signals and not the phase. Physically, intensity is a non-negative number. The inventors have recognized that, for most applications, the photonic processor will be performing a multiplication between a matrix and a vector that may include positive and/or negative-valued elements. The inventors have therefore developed a method for performing a matrix-vector multiplication operation between a real-valued matrix and a real-valued vector using only amplitude-modulation by offsetting and/or rescaling the number line.

Let the original real-valued matrix be M, with elements $M_{ij} \in R$, and let the original real-valued vector be x, with elements $x_j \in R$. Each entry of the original matrix may be offset by a constant value $c_M$ to produce a new matrix M' such that $M_{ij}'=M_{ij}+c_M \geq 0$. The constant value $c_M$ may be chosen to be the absolute value of the largest negative entry of the matrix, e.g., $$\left| \max_{i,j} ((-1)^{sgn(M_{ij})+1} M_{ij}) \right|,$$

or the absolute value of the largest possible negative entry of the matrix, even if this value is not observed in the particular matrix M. Similarly, the vector elements can be offset by a constant value $c_x$ to produce a new vector x' such that $x'=x+c_x \geq 0$. The constant $c_x$ may again be chosen to be the absolute value of the largest negative entry of the vector or the absolute value of the largest possible negative element of the vector.

The output vector $y_i=\Sigma_j M_{ij}x_j$ can then be computed using the new matrix M' and vector x' as follows:

$$y_i = \sum_j M_{ij}x_j$$

-continued $$y_i = \sum_j (M_{ij} + c_M - c_M)(x_j + c_x - c_x)$$

$$y_i = \sum_j (M_{ij} + c_M)(x_j + c_x) - c_M \sum_j x_j - c_x \sum_j M_{ij}$$

$$y_i = \sum_j M'_{ij} x'_j - c_M \sum_j x_j - c_x \sum_j M_{ij},$$

where the first term $\sum_j M_{ij}' x_j'$ can be evaluated using the photonic processor, and where the values $M'_{ij}$ may be encoded using the second amplitude modulators and the values $x'_j$ may be encoded with the first amplitude modulators. The second term $c_M \sum_j x_j$ and third term $c_x \sum_j M_{ij}$ may be evaluated by a digital vector processor. Although computing the third term incurs a cost of O(IJ) operations, assuming an I×J matrix, the cost may be amortized over the number of different vectors that will be computed by the photonic processor. If this number is large enough, one can choose to pipeline the computation of the third term and the matrix multiplication using the photonic processor.

In the case that the first amplitude modulators are able encode negative numbers (but not the second amplitude modulators), the second term $c_M \sum_j x_j$ can also be computed by extending the number of rows of the photonic processor by one and setting all second amplitude modulators in this new last row (row number I+1) to unity (e.g., set $M_{I+1,j}=1$ for all j). Note that, for this case, the value of $c_x$ may be set such that $c_x=0$ or this constant offset may be kept for other reasons such as the dynamic range of the ADC and readout circuitry, described below. Similarly, in the case that the second amplitude modulators are able to encode negative numbers (but not the first amplitude modulators), the third term $c_x \sum_j M_{ij}$ can be evaluated by computing a matrix-vector multiplication with a vector having elements with values of one. Again, $c_M$ may be chosen such that $c_M=0$ or the constant offset may be kept for other reasons.

The inventors further recognize that this method of obviating the need to encode negative numbers in the photonic processor may produce a new matrix $M_{ij}'$ or a new vector $x_j'$ whose elements are out of the photonic processor's encoding range. Without loss of generality, the input matrix and input vector can be normalized such that each entry is within the encoding range. For example, assume that the original matrix elements and the original vector elements have values between −1 and 1, e.g., $M_{ij} \in [-1,1]$ and $x_j \in [-1,1]$. Adding the constant offsets $c_M$ and $c_x$ means that the modified matrix element values are in a new range $M_{ij}' \in [-1+c_M, 1+c_M] \geq 0$ and similarly the modified vector element values are in a new range $x_j' \in [-1+c_x, 1+c_x] \geq 0$. If the photonic processor modulators can only encode values between 0 and 1, then a scale factor $\alpha_M$ and $\alpha_x$ may be introduced, in some embodiments. In such embodiments, $\alpha_M$ and $\alpha_x$ may be chosen such that $\alpha_M=1/(1+c_M)$ and $\alpha_x=1/(1+c_x)$ such that $\alpha_M M_{ij}' \in [(-1+c_M)/(1+c_M), 1]$ and $\alpha_x x_j' \in [(-1+c_x)/(1+c_x), 1]$ within the range of the possible values of the photonic processor. In other words, instead of computing $y_j$ as described above, one can compute:

$$\alpha_M \alpha_x y_i = \sum_j (\alpha_M M'_{ij})(\alpha_x x'_j) - \alpha_M \alpha_x c_M \sum_j x_j - \alpha_M \alpha_x c_x \sum_j M_{ij},$$

where the factors $\alpha_M \alpha_x$ can be removed at a post-processing stage.

The offsetting and scaling method described above precludes the need for encoding negative numbers in the processor's first and second amplitude modulators. The method also confers an additional benefit of higher signal accumulation at the output. Since the encoded matrix and the encoded vector now have non-negative elements, the currents summed at the output have the same direction of flow—leading to a larger amount of charges accumulated that will be sampled by the output sampling circuit. This leads to larger signals at the output that encode the output vector y. The inventors recognize that the larger signal outputs are important for processors that operate close to the electronic noise floor, typically consisting of Johnson-Nyquist noise, electronic shot noise and photonic shot noise.

VIII. Loss-Based Modulation and Optical Representation of Zero Values

FIGS. 4A-4C show illustrative examples of amplitude modulators that may be used in some embodiments as first and/or second amplitude modulators as described in connection with the examples of FIGS. 2, 3A, and 3B, in accordance with some embodiments of the technology described herein. FIG. 4A shows a modulator 400a that uses imperfect amplitude or phase modulators 404 and 408 to achieve "good" zero values in an interferometer arrangement. Beam splitters 402 and 410 split and re-combine, respectively, the optical signal passing through the modulator 400a. A phase shifter 406 may be added to bias the interferometer in order to increase the extinction ratio, and the modulator 408 is used for loss-matching. The modulator 400a may be used in a push-pull mode, in some embodiments. FIG. 4B shows a modulator 400b that uses a perfect extinction electro-absorption modulator 412 to increase the extinction ratio of the modulator, in some embodiments. FIG. 4C shows a modulator 400c that uses a ring resonator 414 or cavity that is tuned off resonance. In some embodiments, the ring resonator 414 may be tuned off resonance such that $\frac{1}{2^b}$ fraction of light passes in the resonant state, where b is the desired precision of the computation.

Because the goal of such amplitude modulators is only to modulate the optical intensity, almost any intensity modulation strategy (e.g., including a coupled phase modulation) can be used for amplitude modulation. For more accurate performance, the extinction ratio of the amplitude modulator should be as large as possible. In some embodiments, it may be desirable to chain modulators (e.g., to place modulators in series) to increase their extinction ratio or phase shift. However, as described below, it is possible to trade this accuracy with the effective insertion loss of the resulting output.

The same matrix-vector multiplication architecture would also apply if any of the intensity modulation is switched from a loss-based modulation as shown in FIGS. 4A-4C to a gain-based modulation. This implies that the same architecture will also work on photonic integrated circuit platforms that include semiconductor optical amplifiers (e.g., indium phosphide (InP) or other III-V semiconducting platforms). It may be advantageous to choose a combination of loss-based modulation and gain-based modulation, in some embodiments. The former can be more power efficient and the latter can be used to combat loss in the circuit.

When using only loss-based modulation schemes, the input matrix and input vector entries can only reduce the intensity of light. Mathematically, this is described by having entries with values less than one: $x_j \leq 1$ and $w_{pj} \leq 1$. To achieve this, the input matrix and the input vector are normalized. Instead of directly computing $\vec{y} = w\vec{x}$, a constant factor is first pulled out such that $|\vec{y}|=\|w\|_{max}\|\vec{x}\|_{max}$, where $\|A\|_{max}$ denotes the element-wise max-norm (e.g., the maximum absolute value entry of A, $$\|A\|_{max} = \max_{i,j}|A_{ij}|$$

for a matrix and $$\|A\|_{max} = \max_{i}|A_{i}| \text{ for a vector).}$$

The photonic processor may be used to compute $\vec{y}/|\vec{y}|=w\vec{x}/|\vec{y}|$, and digital circuitry may be used to recover the output vector $\vec{y}$ by multiplying the final result with $|\vec{y}|$.

Because the signals are encoded into the optical intensity, the matrix-vector multiplication described above would only apply for a non-negative-valued matrix and a non-negative-valued vector. The algorithm can be augmented by using four multiplications to calculate a matrix-vector multiplication between any real-valued matrix and real-valued vector. To do so, the input matrix may be split into its positive and negative components. For example, $w=w_+-w_-$, where $w_+(w_-)$ corresponds to a matrix containing only the positive (negative) components. Similarly, the input vector may be split into its positive and negative components. For example, $\vec{x}=\vec{x}_+-\vec{x}_-$, where $\vec{x}_+(\vec{x}_-)$ corresponds to a vector containing only the positive (negative) components. To perform the multiplication $\vec{y}=w\vec{x}=(w_+-w_-)(\vec{x}_+-\vec{x}_-)$, the multiplications $w_+\vec{x}_+$, $w_+\vec{x}_-$, $w_-\vec{x}_+$ and $w_-\vec{x}_-$ may be performed individually and the results may be summed and/or subtracted accordingly. This method may be described by the name "Differential Matrix Multiplication" (DMM).

Amplitude modulators are generally not capable of (1) fully extinguishing light and (2) allowing light to fully pass. However, these two properties are important parameters of an amplitude modulator; the former property is related to the extinction ratio and the latter property is the insertion loss of the modulator. At first glance, the techniques described herein require that the amplitude modulators that encode w and x are capable of fully extinguishing light (e.g., a modulator with an arbitrarily high extinction ratio). However, the four terms $w_+\vec{x}_+$, $w_+\vec{x}_-$, $w_-\vec{x}_+$, and $w_-\vec{x}_-$ that are computed to subtract this "common-mode offset" resulting from imperfect extinction at the w and x modulators may be taken advantage of. It is also possible to achieve high extinction ratios using interferometric schemes, even with imperfect intensity or phase modulators, as shown in FIGS. 4A-4C.

The DMM techniques described above allows for general matrix multiplication with amplitude modulators having poor extinction ratios and that cannot encode values close to zero. Let the $j_{th}$ amplitude modulator "AM" have an intensity modulation range of $x_j \in [x_j^{min}>0, x_j^{max}<1]$. The extinction ratio of this modulator is $x_j^{max}/x_j^{min}$ which has a finite value. The electronic circuitry, which involves a digital-to-analog converter, driving this modulator discretizes the range between $x_j^{min}$ and $x_j^{max}$. Similarly, let the $p^{th}$ column and $j^{th}$ row amplitude modulator "M" have an intensity modulation range of $w_{pj} \in [w_{pj}^{min}>0, w_{pj}^{max}<1]$. The extinction ratio of this modulator is $w_{pj}^{max}/w_{pj}^{min}$. The circuitry driving this modulator also discretizes the range between $w_{pj}^{min}$ and $w_{pj}^{max}$.

A new modulation range $x'_j \equiv x_j - x_j^{min}$ can be defined with values ranging from $x'_j \in [0, x_j^{max} - x_j^{min}]$, for the first amplitude modulators. And, a new modulation range $w'_{pj} \equiv w_{pj} - w_{pj}^{min}$ can also be defined, with values ranging from $w'_{pj} \in [0, w_{pj}^{max} - w_{pj}^{min}]$, for the second amplitude modulators. The matrix-vector product can then be computed as:

$$\vec{y} = w\vec{x} = (w_+ - w_-)(\vec{x}_+ - \vec{x}_-)$$

$$\vec{y} = \sum_{j}(w_{pj,+} - w_{pj,-})(x_{j,+} - x_{j,-})$$

$$\vec{y} = \sum_{j}[(w''_{pj,+} + w_{pj}^{min}) - (w'_{pj,-} + w_{pj}^{min})][(x'_{j,+} + x_j^{min}) - (x''_{j,-} + x_j^{min})]$$

$$\vec{y} = \sum_{j}(w'_{pj,+} - w'_{pj,-})(x'_{j,+} - x'_{j,-}),$$

because both the positive and the negative parts of the matrix and vector are modulated by the same modulator, which has the same minimum value. Therefore, matrix-vector multiplication can be performed as if both the first and second amplitude modulators have perfect extinction ratios by canceling the common-mode offset using these DMM techniques. This allows for a wider range of modulation mechanisms to be used, and allows for higher speed modulation of both the vector and matrix elements than could be achieved while requiring high extinction ratios. The trade-off is a reduction in the range of the resultant photocurrent, which may or may not be a limiting factor in the bit precision of the output.

IX. Wavelength Division Multiplexing

Figure 5:
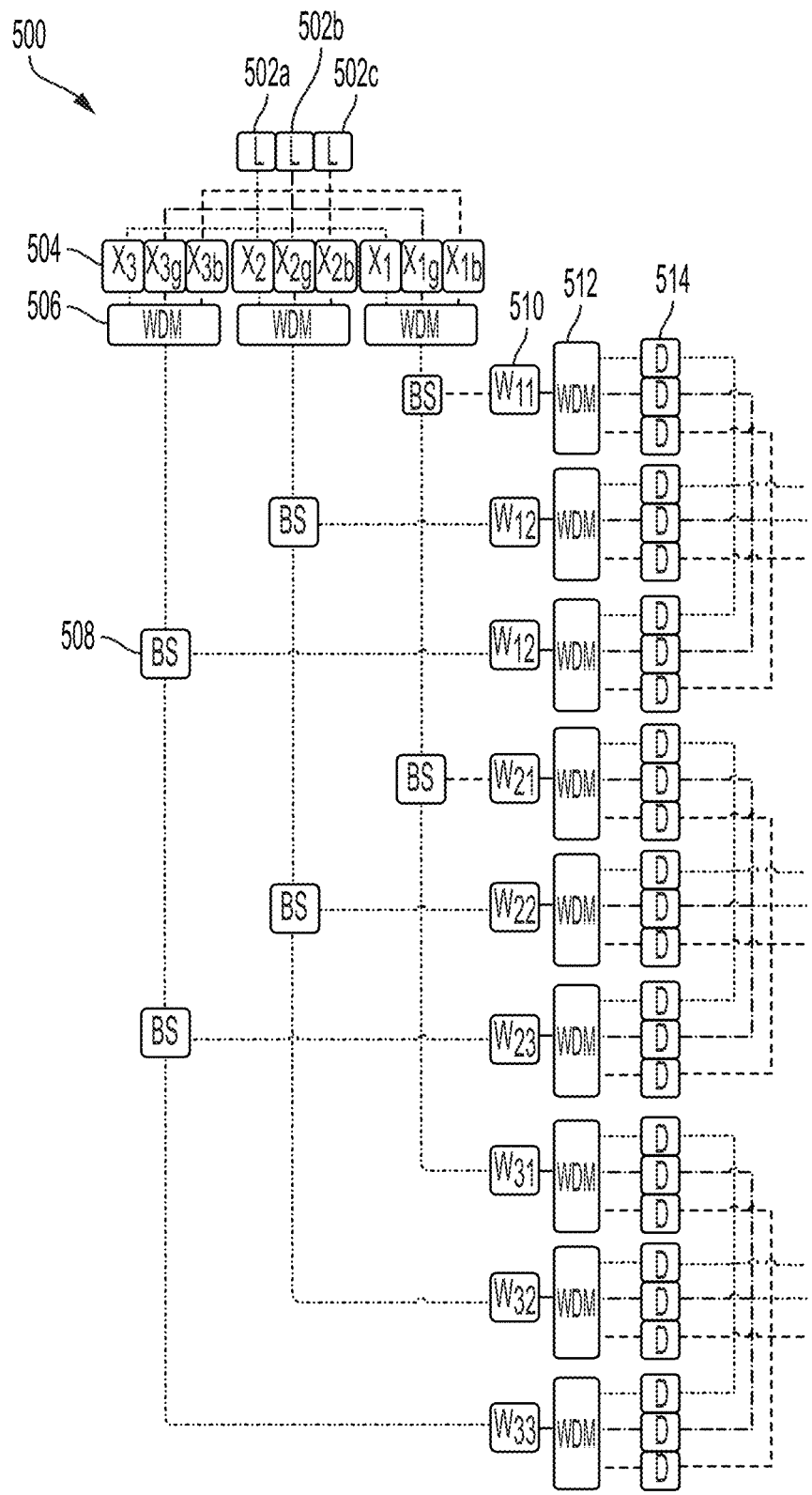
FIG. 5 is a block diagram illustrating an example of a photonic architecture including wavelength division multiplexing (WDM), in accordance with some embodiments of the technology described herein.

FIG. 5 is a block diagram illustrating an example of a linear photonic processor 500 including wavelength division multiplexing (WDM), in accordance with some embodiments of the technology described herein. The linear photonic processor 500 is similar to the linear photonic processors of the examples of FIGS. 2, 3A, and 3B, but has been augmented with WDM circuits 506 and 512. Alternatively, in some embodiments these WDM circuits 506 and 512 could be polarization division multiplexing circuits. The linear photonic processor 500 does not entail interference between any of the optical paths, and thus is conducive to being assembled entirely from broadband photonic elements—relaxing the constraint on the wavelength range used for WDM.

The example linear photonic processor 500 of FIG. 5 has been configured to multiple a 3×3 matrix w with three, 3-element vectors $x_{ir}$, $x_{ig}$, and $x_{ib}$. The linear photonic processor 500 may include multiple light sources 502a, 502b, and 502c configured to generate optical signals having different wavelengths. For example, the light sources 502a, 502b, and 502c may be configured to generate optical signals that are red light, green light, and blue light, respectively. Each element of the vectors $x_{ir}$, $x_{ig}$, and $x_{ib}$ may be thus be encoded into an amplitude of optical signals having different wavelengths by first amplitude modulators 504.

After passing through first WDM circuits 506, the first optical signals may be split by beam splitters 508 and transmitted to second amplitude modulators 510 that are configured to encode a matrix-vector element product into output second optical signals. These output second optical signals may be received by second WDM circuits 512 and subsequently detected and converted into electrical signals by optical detectors 514. The electrical signals may be summed and/or readout as described previously herein.

X. Implementing Signed Values

Figure 6A:
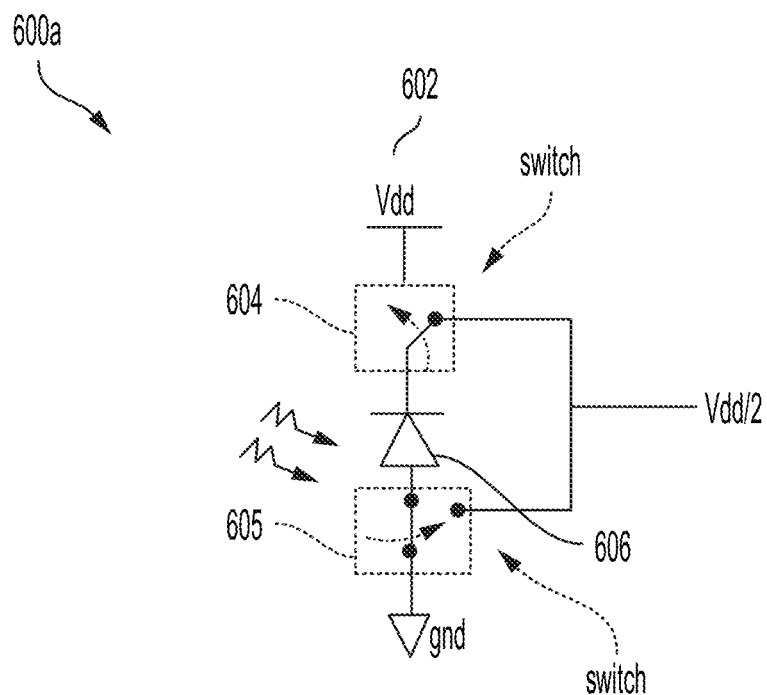
FIG. 6A is a schematic diagram of a circuit for implementing a signed value, in accordance with some embodiments of the technology described herein.

In some embodiments, negative matrix and/or vector values may be realized using circuitry. For example, FIG. 6A is a schematic diagram of a circuit 600*a* for implementing a negative and positive values, in accordance with some embodiments of the technology described herein. The optical detector 606 may have a first terminal and a second terminal (e.g., a cathode and an anode, for embodiments where the optical detector 606 comprises a photodiode as depicted in FIG. 6A). The first terminal may be coupled to either a rail voltage 602 or a summing node through switch 604. The second terminal may be coupled to either a reference voltage 608 (e.g., ground) or the summing node through switch 605. The switches 604, 605 may be, for example, transistor switches. By connecting either the first terminal or the second terminal to the summing node using switches 604 and 605, the direction of the current output from the optical detector 606 may be changed such that a signage (e.g., positive or negative) is implemented. The switch state of the transistor switches may be controlled by additional control circuitry (not pictured) of the photonic processor and/or of a controller coupled to the photonic processor.

Figure 6B:
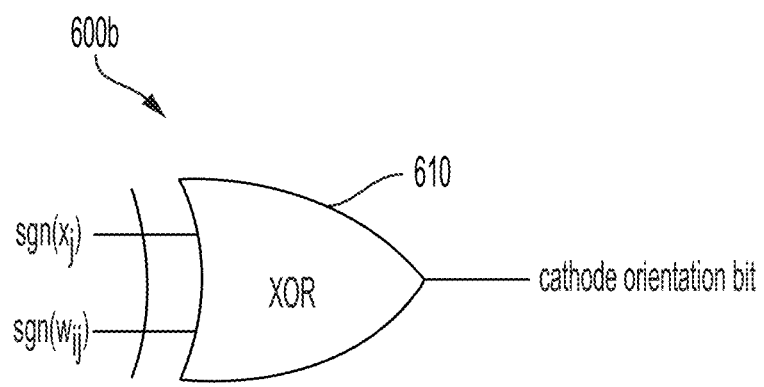
FIG. 6B is a schematic diagram of a Boolean circuit for implementing a signed value, in accordance with some embodiments of the technology described herein.

Additionally, it is possible to implement signed matrix and/or vector values using an XOR operation to pre-compute the sign of the computation and then setting the sign of the output electrical signal of the optical detectors 606, as shown in FIG. 6B. The circuit 600*b* may include an XOR operation 610, in some embodiments. The cathode orientation (e.g., of optical detectors 606) may be calculated by taking the sign of the input vector element $x_j$ and the sign of the matrix element $w_{ij}$ and performing an XOR operation on these signals. The output cathode orientation bit may set whether the current coming from the optical detector is positive or negative (e.g., the output cathode orientation bit may trigger a change in the arrangement or settings of switches 604 and 605 of circuit 600*a*).

The inventors have further developed methods for distributing these 'sign bits' throughout the photonic processor. The sign bit of each vector element can be transported near each first amplitude modulator configured to encode vector element values, where after performing the XOR operation between this vector sign bit and the matrix sign bit, the sign bit signal can be used to control the flow of the detector current.

Alternatively or additionally, the sign bit could be distributed using electrical communication. This communication may be performed using standard digital design practices to minimize skew and jitter. For example, a tree or mesh topology may be used to distribute a single bit to many places at the same time. The time delay of this tree may exceed the vector rate of the processor at which point there will be multiple signs being transmitted to the modulator at the same time.

The inventors further recognize that the sign bit may be distributed photonically. For example, an additional waveguide could be used to encode and transmit the sign bit. However, the sign bit may also be transmitted using an unused degree of freedom of the optical signals. For example, the optical signals may be modulated with another polarization or another wavelength to encode and distribute the sign bit. The sign bit may also be encoded in the logical choice of polarization or wavelength. For example, the photonic processor may use light of wavelength $\lambda_1$ if the vector sign bit is positive and the photonic processor may use light of wavelength $\lambda_2$ if the vector sign bit is negative. Photonic sign bit distribution confers multiple advantages. First, the sign-bit signal and the matrix-vector product signal can propagate at the same propagation speed. Second, the sign-bit signal and the matrix-vector product signal can propagate in the same optical waveguide, precluding the use of additional waveguides in the system.

Figure 7:
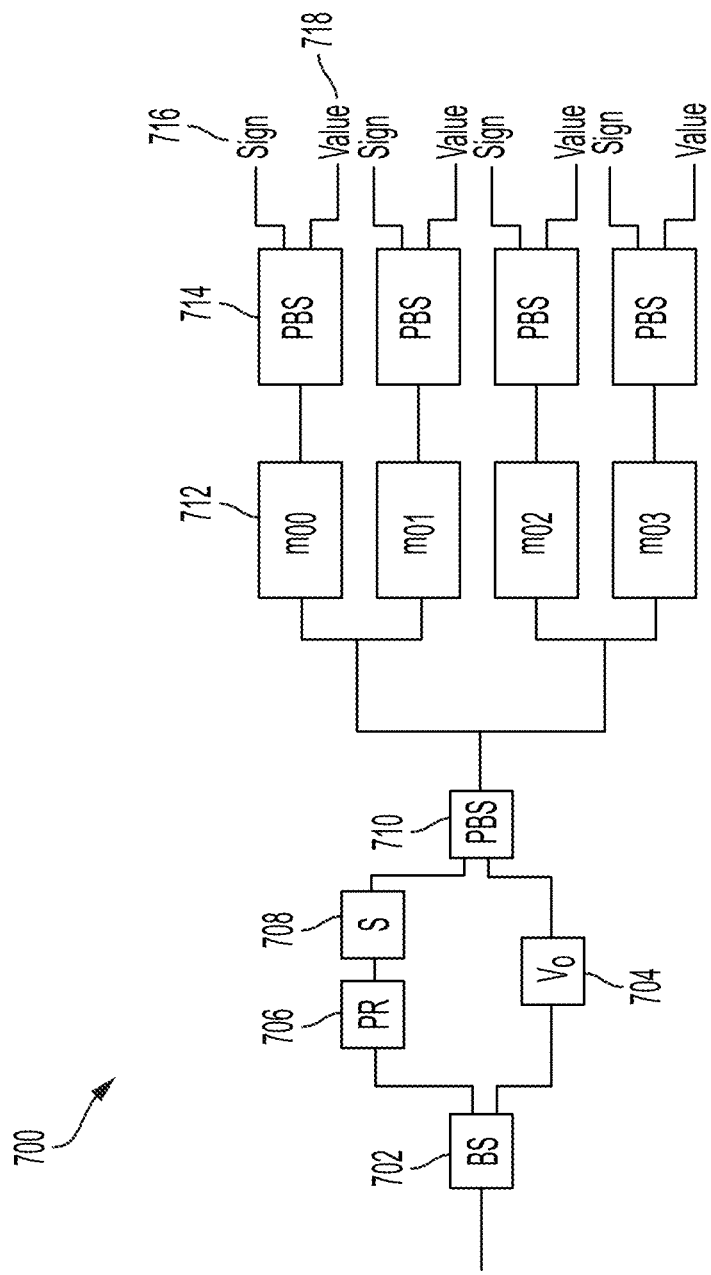
FIG. 7 is a schematic diagram of an optical circuit for distributing sign bits, in accordance with some embodiments of the technology described herein.

FIG. 7 shows a polarization-based scheme for sign bit distribution within a photonic processor, in accordance with some embodiments of the technology described herein. A first beam splitter 702 may split an input optical signal, and the vector element value may be encoded in an amplitude of the light at first amplitude modulator 704. The sign bit may be encoded into a polarization of the optical signal using a polarization rotator 706 and sign modulator 708. The two optical signals may then be recombined using a polarization beam splitter 710. It may be appreciated that the polarization beam splitter can be used to (1) split an input light of two different polarizations into two output paths, by their polarization and (2) combine light from two input paths, each with its own polarization, into a single output light of two different polarizations.

The recombined optical signal may be split and transmitted to second amplitude modulators 712 that are configured to output second optical signals representing vector element-matrix element products. The second optical signals may pass through additional polarization beam splitters 716 enabling a separation of the sign 716 and value 718.

Figure 8:
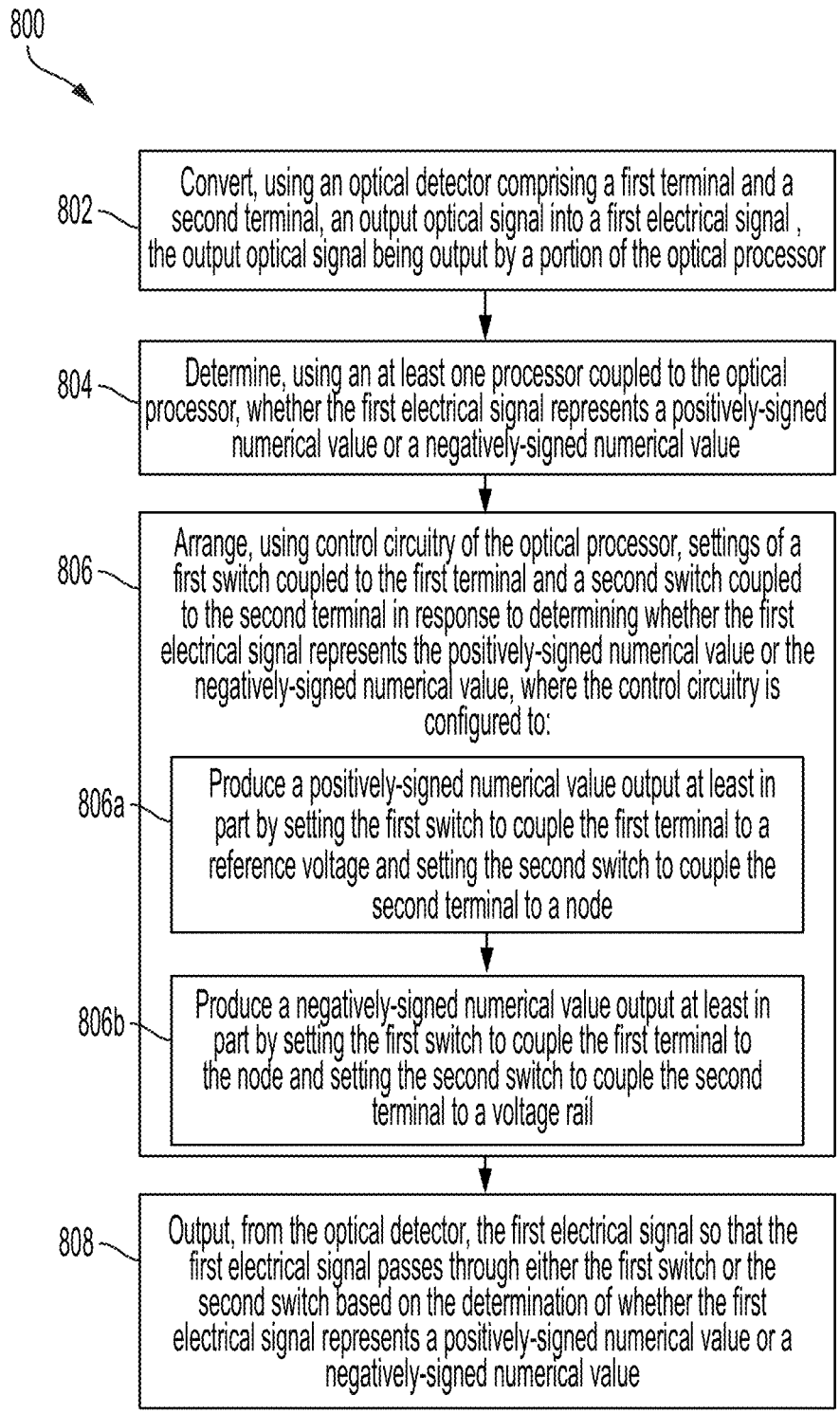
FIG. 8 is a flowchart illustrating a process for implementing a signed value, in accordance with some embodiments of the technology described herein.
Figure 9B:
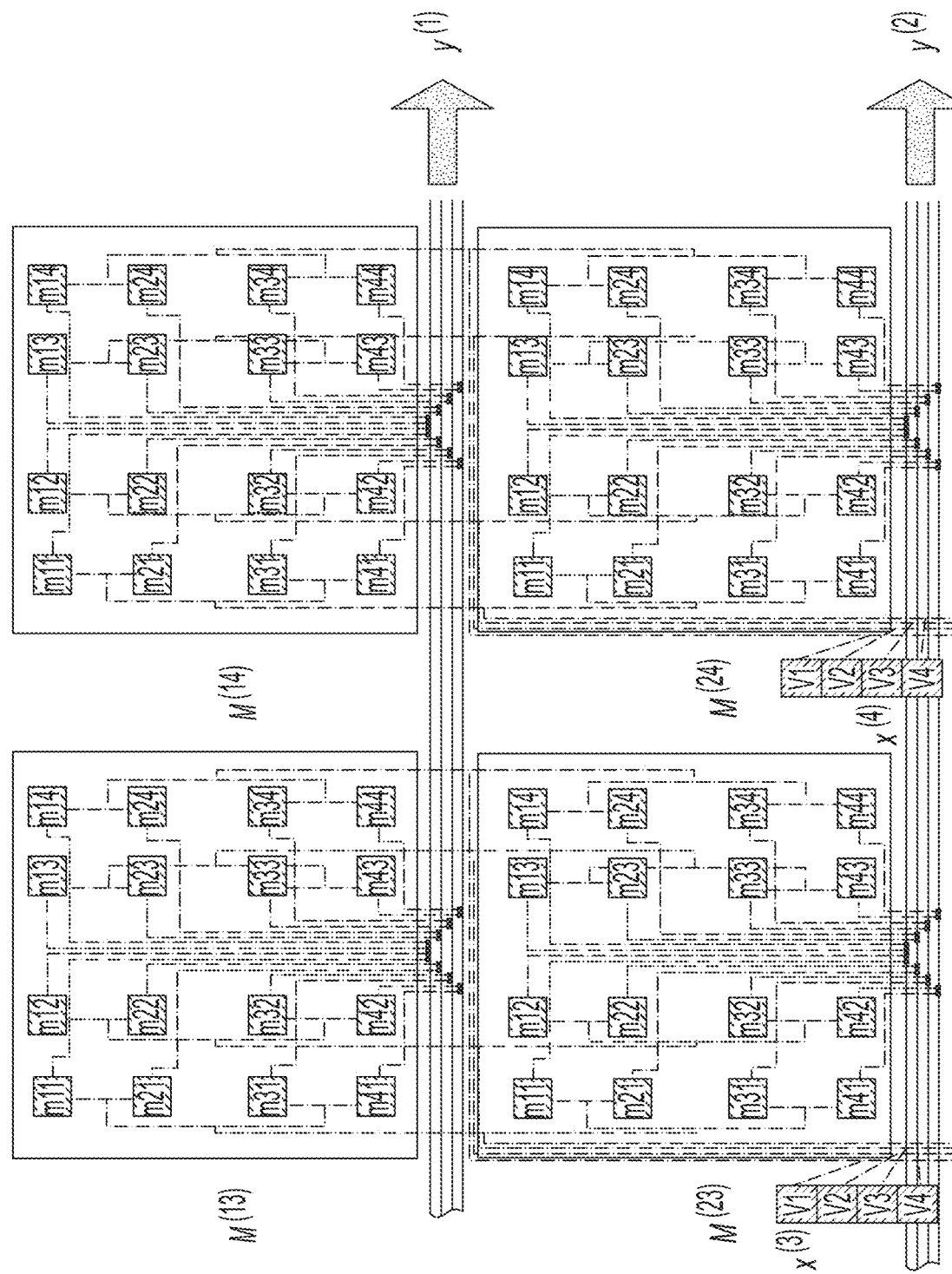
Figure 9C:
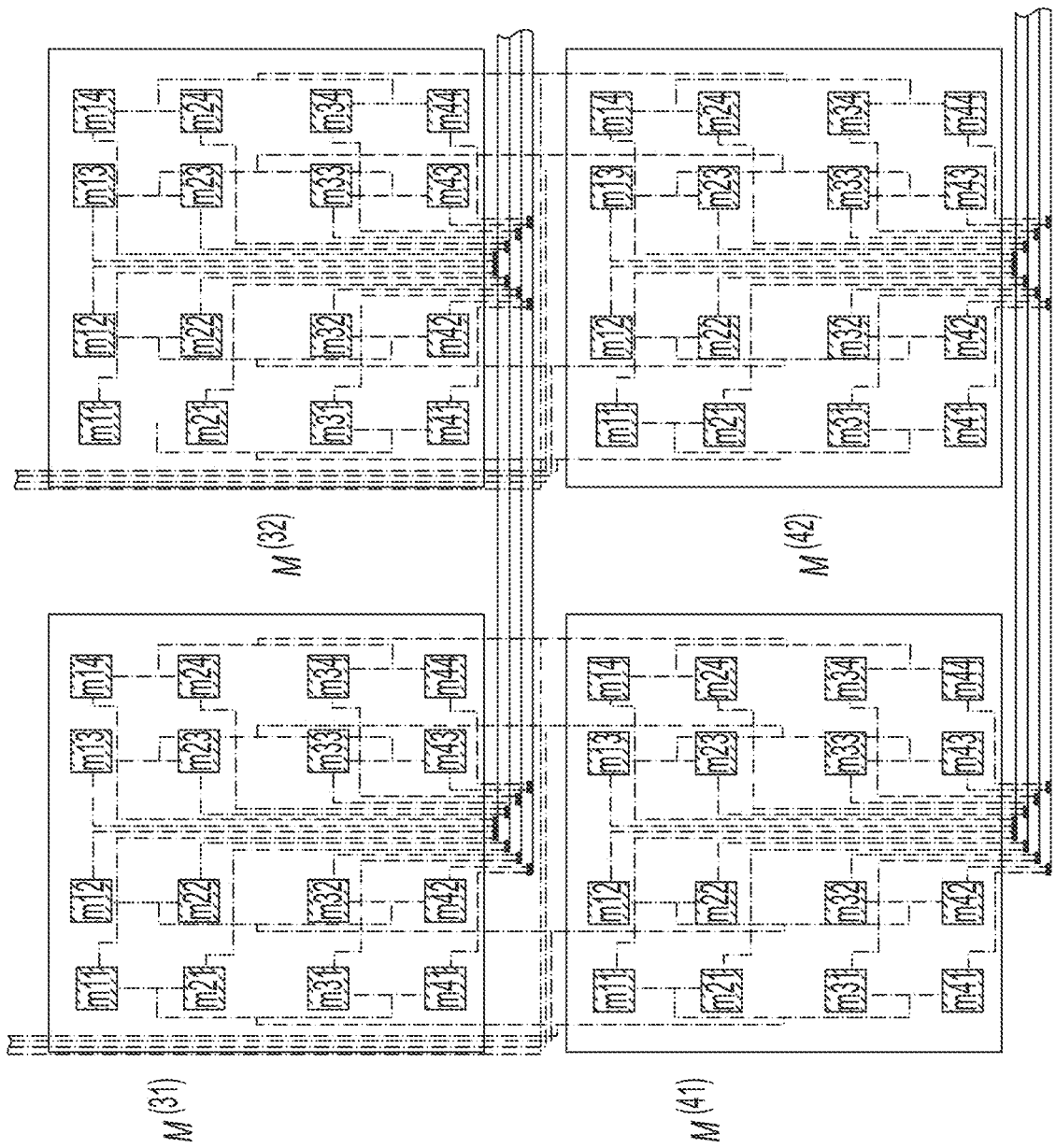
Figure 9D:
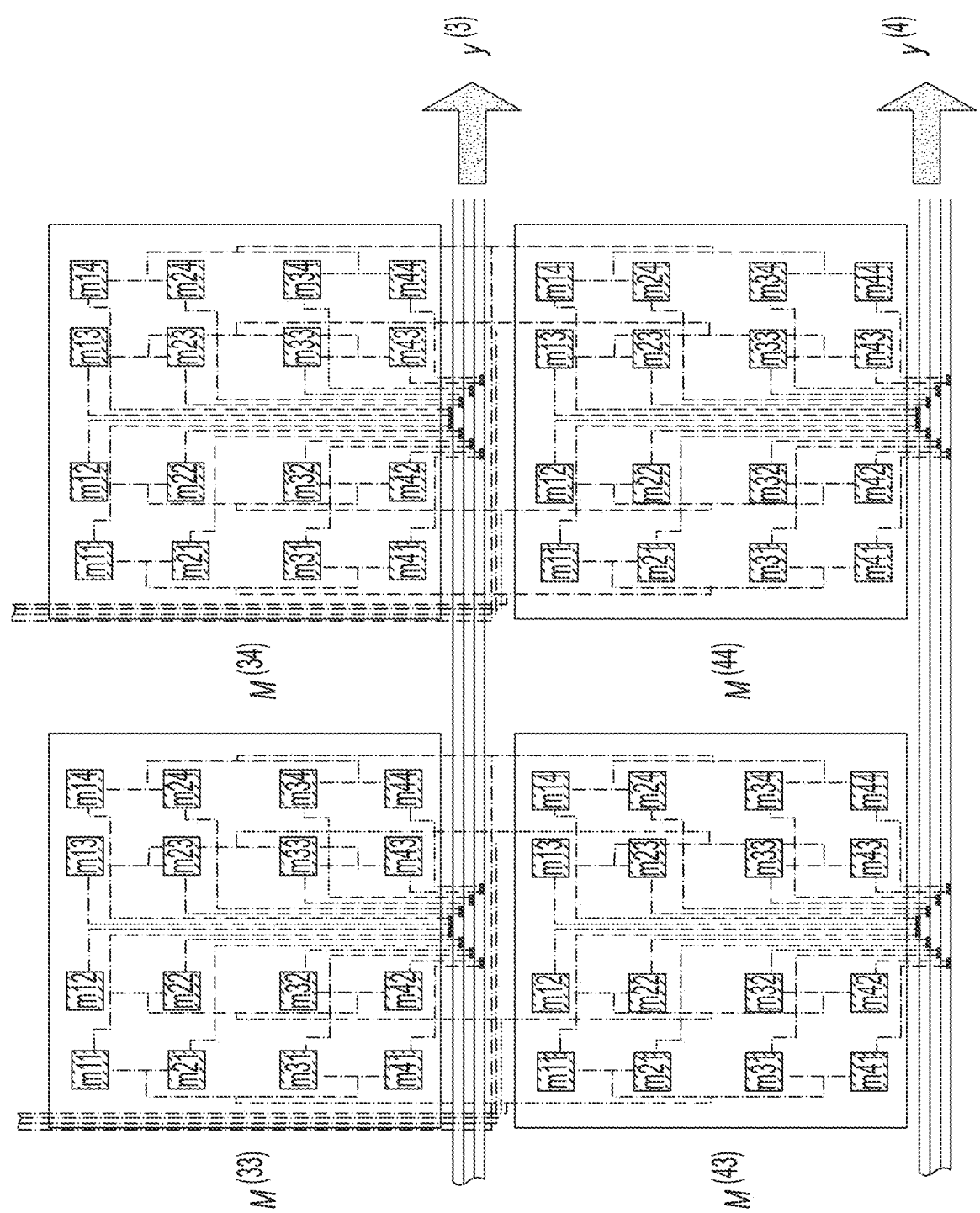

FIG. 8 is a flowchart illustrating a process 800 for implementing a signed value, in accordance with some embodiments of the technology described herein. Process 800 may be executed by any suitable computing device. For example, in some embodiments, the process 800 may be performed by a controller coupled to the photonic processor (e.g., controller 102 as described in connection with FIG. 1). In some embodiments, the process 800 may be executed by one or more processors located remotely from the photonic processor (e.g., as a part of a cloud computing system).

Process 800 begins at act 802, where an optical detector may convert a received optical signal into a first electrical signal, the optical signal being output by a portion of the photonic processor. The optical detector may comprise a first terminal and a second terminal. For example, the optical detector may comprise a photodiode, and the first terminal and the second terminal may be the anode and the cathode, respectively. In some embodiments, the first electrical signal may be a photocurrent.

After act 802, process 800 may proceed to act 804, where at least one conventional processor coupled to the optical processor may determine whether the first electrical signal represents a positively-signed numerical value or a negatively-signed numerical value, in some embodiments. The at least one conventional processor may determine the signage of the first electrical signal based at least in part on the sign of an input vector element and a sign of an input matrix element. For example, the at least one conventional processor may determine the signage of the first electrical signal using an XOR operation, as described in connection with FIG. 6B.

After act 802, process 800 may proceed to act 806, where control circuitry of the photonic processor may arrange settings of settings of a first switch coupled to the first terminal of the optical detector and a second switch coupled to the second terminal of the optical detector in response to determining whether the first electrical signal represents the positively-signed numerical value or the negatively-signed numerical value. For example, in some embodiments the first switch and/or the second switch may comprise transistor switches, and arranging the settings of the first switch and/or the second switch may comprise applying or removing a gate voltage to enable the first switch and/or the second switch.

Act 806 may further proceed in two sub-acts 806a and 806b. In sub-act 806a, the control circuitry may produce a positively-signed numerical value output at least in part by setting the first switch to couple the first terminal to a reference voltage and setting the second switch to couple the second terminal to a node (e.g., an output node). Such a setting of the first switch and the second switch may cause the optical detector to output a positive current. In sub-act 806b, the control circuitry may produce a negatively-signed numerical value output at least in part by setting the first switch to couple the first terminal to the node and setting the second switch to couple the second terminal to a voltage rail. Such a setting of the first switch and the second switch may cause the optical detector to output a negative current.

After act 806, process 800 may proceed to act 808, where the optical detector may output the first electrical signal such that the first electrical signal passes through either the first switch or the second switch. The path of the first electrical signal is based on the previous determination of whether the first electrical signal represents a positively-signed numerical value or a negatively-signed numerical value.

XI. Sub-Matrix Processing Architectures

Matrix-matrix, matrix-vector, and tensor-tensor multiplication operations are recursive in nature. Consider a multiplication between a matrix M=[[$M_{11}$, $M_{12}$], [$M_{21}$, $M_{22}$]] (in Pythonic notation) and the vector x=[$x_1$, $x_2$]. The multiplication with outputs $y_1$=$M_{11}x_1$+$M_{12}x_2$ and $y_2$=$M_{21}x_1$+$M_{22}x_2$ can be regarded as a multiplication between the submatrices $M_{11}$, $M_{12}$, $M_{21}$, $M_{22}$ and the subvectors $x_1$, $x_2$. This logic can be recursed until the elements $M_{11}$, $M_{12}$, $M_{21}$, $M_{22}$ and $x_1$, $x_2$ are scalar elements. Such a recursion described above works for a matrix of size $2^N \times 2^N$ multiplied with a vector of size $2^N$, where N is an integer. Given an arbitrary-sized matrix, zeroes can be added as needed to meet these size requirements. It should be appreciated, however, that it is not necessary to divide the matrix into two rows and two columns. The matrix may be divided into R rows and C columns that will result in different scaling.

Figure 10A:
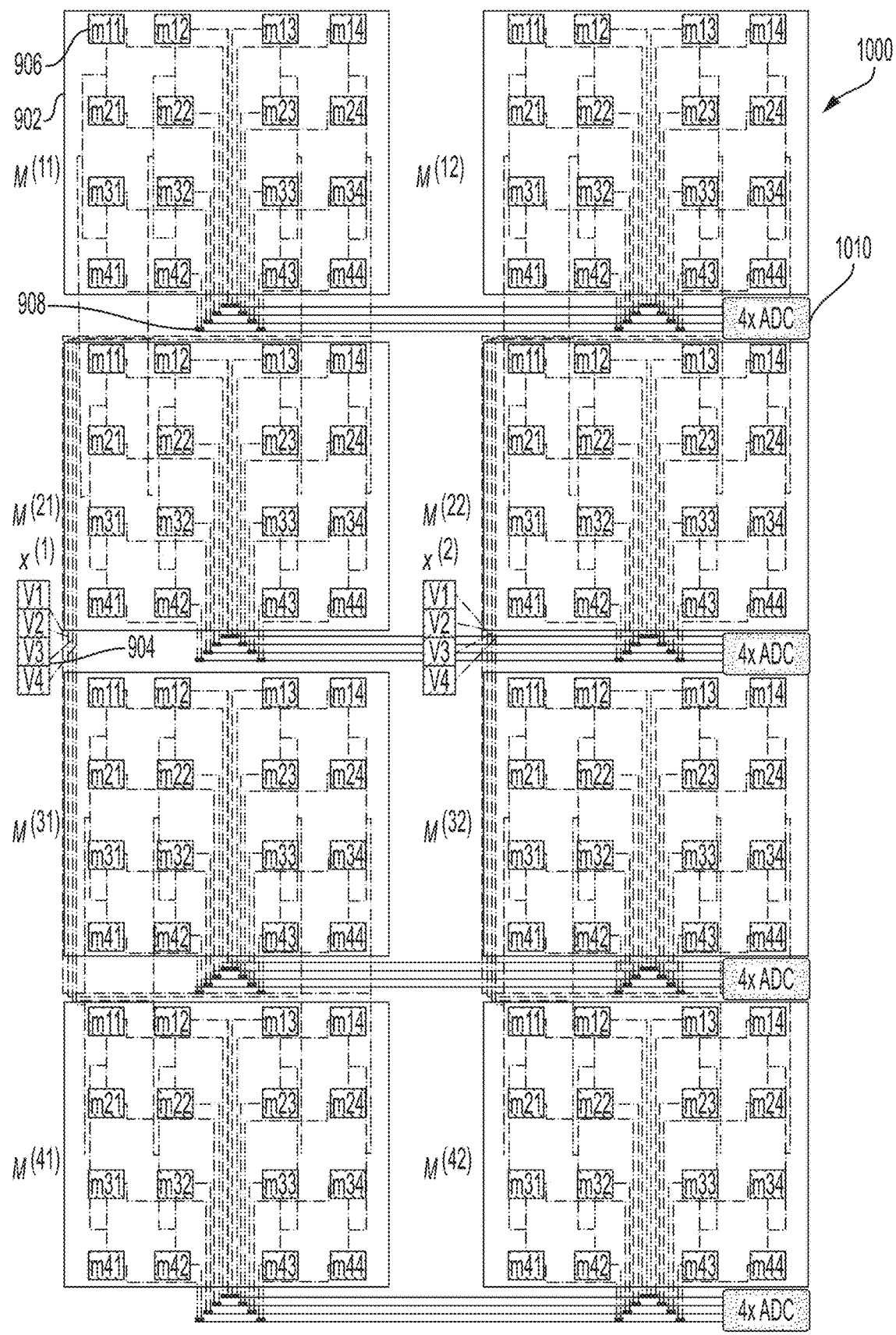
FIGS. 10A-10B are a schematic diagram illustrating a photonic processor arranged into sub-matrices with their outputs being summed locally, in accordance with some embodiments of the technology described herein.
Figure 10B:
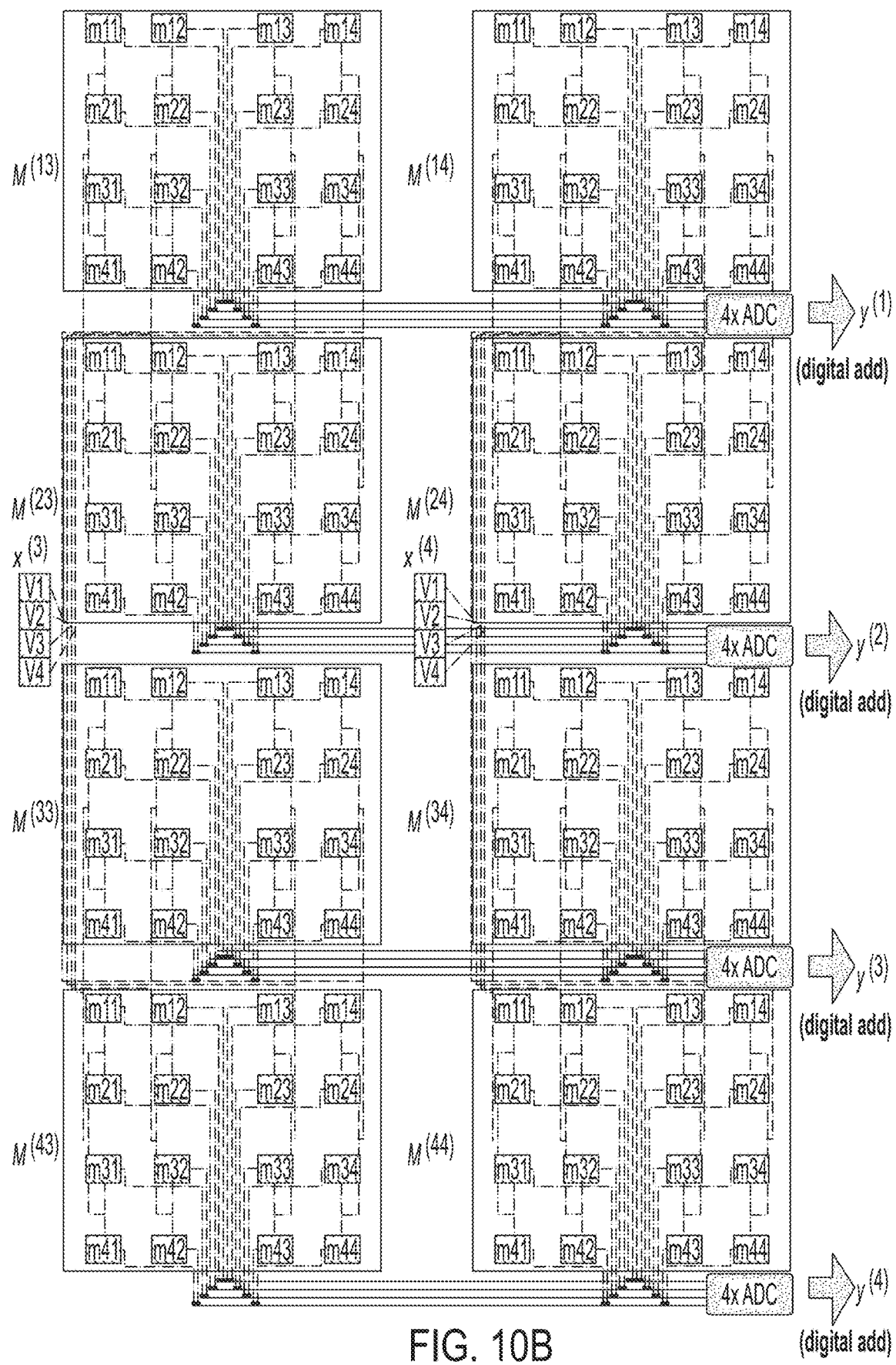

The matrix processor can be also configured in this recursive manner using sub-matrix banks. FIGS. 9A-9D are a schematic diagram illustrating a photonic processor 900 arranged into sub-matrix processors, in accordance with some embodiments of the technology described herein. Each sub-matrix processor 902 is labeled $M^{(ij)}$ and the vectors 904 are labeled $x^{(j)}$. In the example of FIGS. 9A-9D, i, j ∈{1,2,3,4}, though it may be appreciated that the sub-matrices and the vectors may be of other sizes in some embodiments. The sub-vectors are split and transmitted to the relevant sub-matrix processors. Matrix-vector multiplications are performed in each sub-matrix processor between the sub-matrix and the sub-vector at amplitude modulators 906. The matrix-vector multiplications are then optically transmitted to optical detectors 908. The optical detectors 908 are configured to convert the received optical signals into electrical signals. The relevant sub-vector electrical signals may then be summed together between the different sub-matrix processors. In FIGS. 10A-10B, another embodiment of a photonic processor 1000 is shown, in accordance with some embodiments. The sub-vector outputs are converted into bit strings locally using ADCs 1010 and the final outputs are added together using digital circuitry (not shown).

XII. Photonic Processing with Multiple Wavelengths of Light

Figure 11:
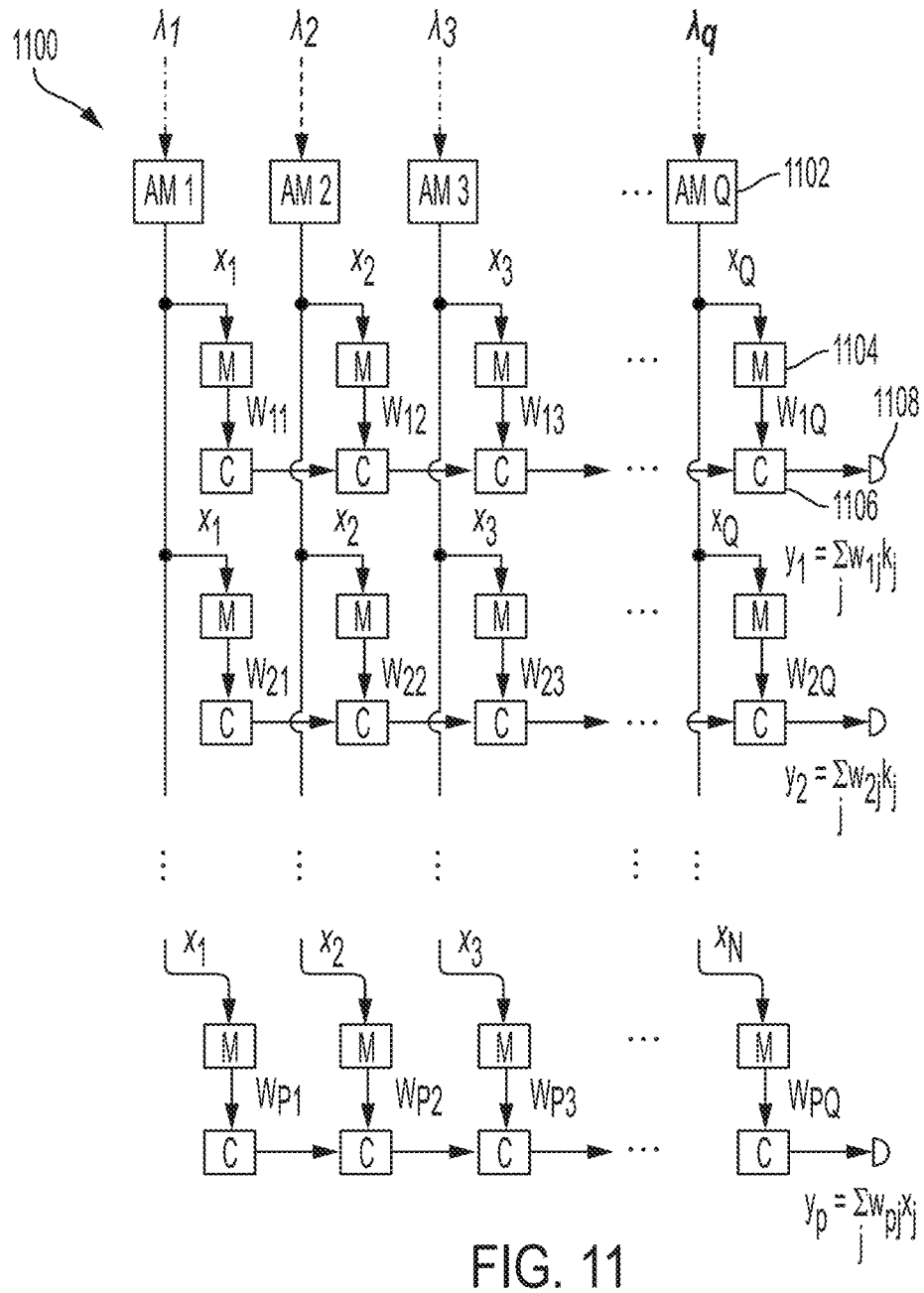
FIG. 11 is a schematic diagram illustrating a photonic processor configured to use input light having multiple wavelengths, in accordance with some embodiments of the technology described herein.

Thus far, a linear photonic processor architecture that uses electronic circuitry to perform summation has been described. FIG. 11 shows a schematic diagram illustrating an alternative embodiment of a linear photonic processor 1100 configured to perform summation in the optical domain and to use input light having multiple wavelengths, in accordance with some embodiments of the technology described herein. In the example of FIG. 11, each first amplitude modulator 1102 receives light of different wavelengths: $\lambda_1$, $\lambda_2$, ..., $\lambda_Q$. The vector modulation strategy and the matrix modulation strategy in the linear photonic processor 1100 is similar to that performed by the linear photonic processors of FIGS. 2, 3A, and 3B. However, in the linear photonic processor 1100, the optical signals are not immediately detected after being modulated by second amplitude modulators 1104. Rather, the optical signals may be fed into an optical combiner circuit 1106 before being detected by an optical detector 1108. Therefore, there are only P optical detectors 1108 in the embodiment of FIG. 11 as compared to a total of P×Q optical detectors in the previously-described linear photonic processors of FIGS. 2, 3A, and 3B.

Figure 12A:
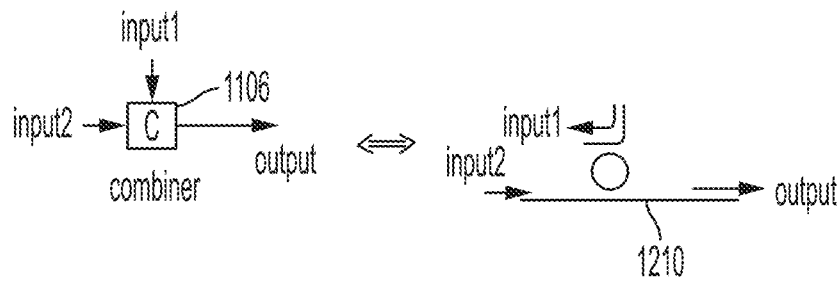
FIG. 12A is a schematic diagram for an optical combiner configured for use with multiple wavelengths of light, in accordance with some embodiments of the technology described herein.

FIG. 12A is a schematic diagram of an optical combiner 1106 configured for use with multiple wavelengths of light, in accordance with some embodiments of the technology described herein. The optical combiner 1106 may include an add-drop ring filter 1210. Optical signals that are resonant with the ring and received from input 1 (e.g., from the second amplitude modulators 1104) may be dropped into the output bus waveguide, and optical signals that are not resonant with the ring from input 2 (e.g., from the bus) pass through the ring to the output bus waveguide. Therefore, the ring is tuned to be resonant to the wavelength of light arriving to the corresponding second amplitude modulator 1104 but is not resonant to any other wavelengths used in the processor. The ring filter thus may have have, at least in some embodiments, a free spectral range (FSR) large enough to support a total of at least Q resonances within a single FSR.

Figure 12B:
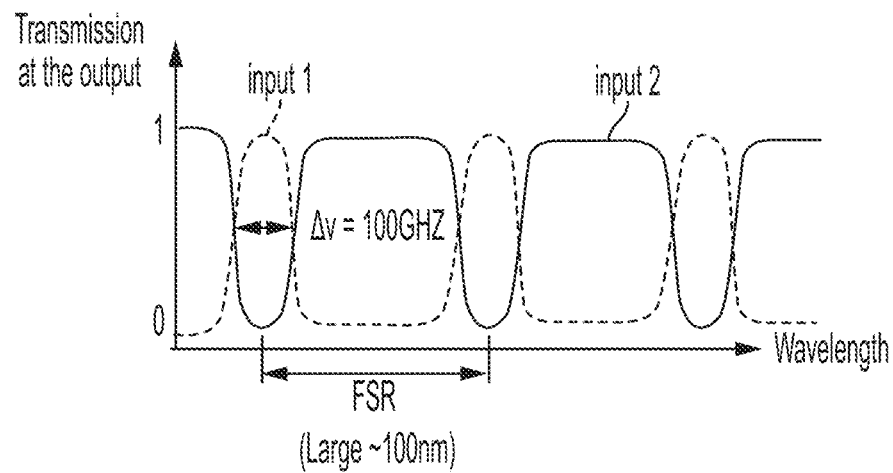
FIG. 12B is an illustrative plot of a free-spectral-range (FSR) of the combiner of FIG. 12A, in accordance with some embodiments of the technology described herein.

FIG. 12B is an illustrative plot of the FSR of the combiner of FIG. 12A, in accordance with some embodiments of the technology described herein. The ring-filter may be designed to have a large free-spectral-range (FSR) but with a sufficiently high quality factor such that many resonance peaks of the input from the second amplitude modulators are captured.

Figure 12C:
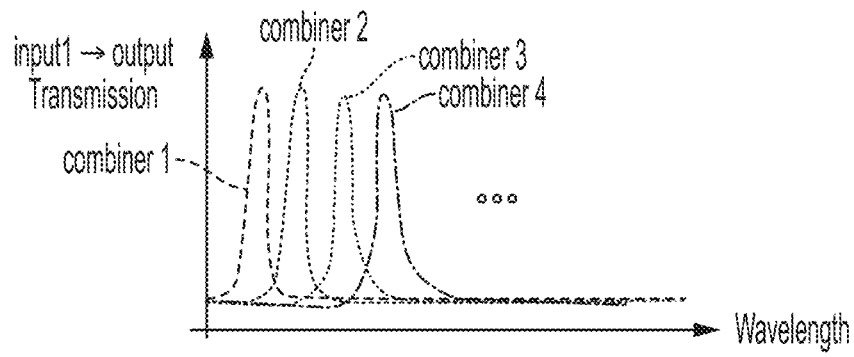
FIG. 12C is an illustrative plot of transmission as a function of wavelength for several of the combiners of FIG. 12A, in accordance with some embodiments of the technology described herein.

FIG. 12C is an illustrative plot of transmission as a function of wavelength for several of the combiners of FIG. 12A, in accordance with some embodiments of the technology described herein. Each combiner may be detuned from one another such that only one wavelength of light is dropped from input 1 (e.g., from the second amplitude modulators 1104) to the output. Other non-resonant multi-wavelength combiners such as y-combiners or directional couplers can also be used to combine the output light of different wavelengths at the expense of some optical loss.

XIV. Implementing Sparse Matrices and/or Vectors

Figure 13A:
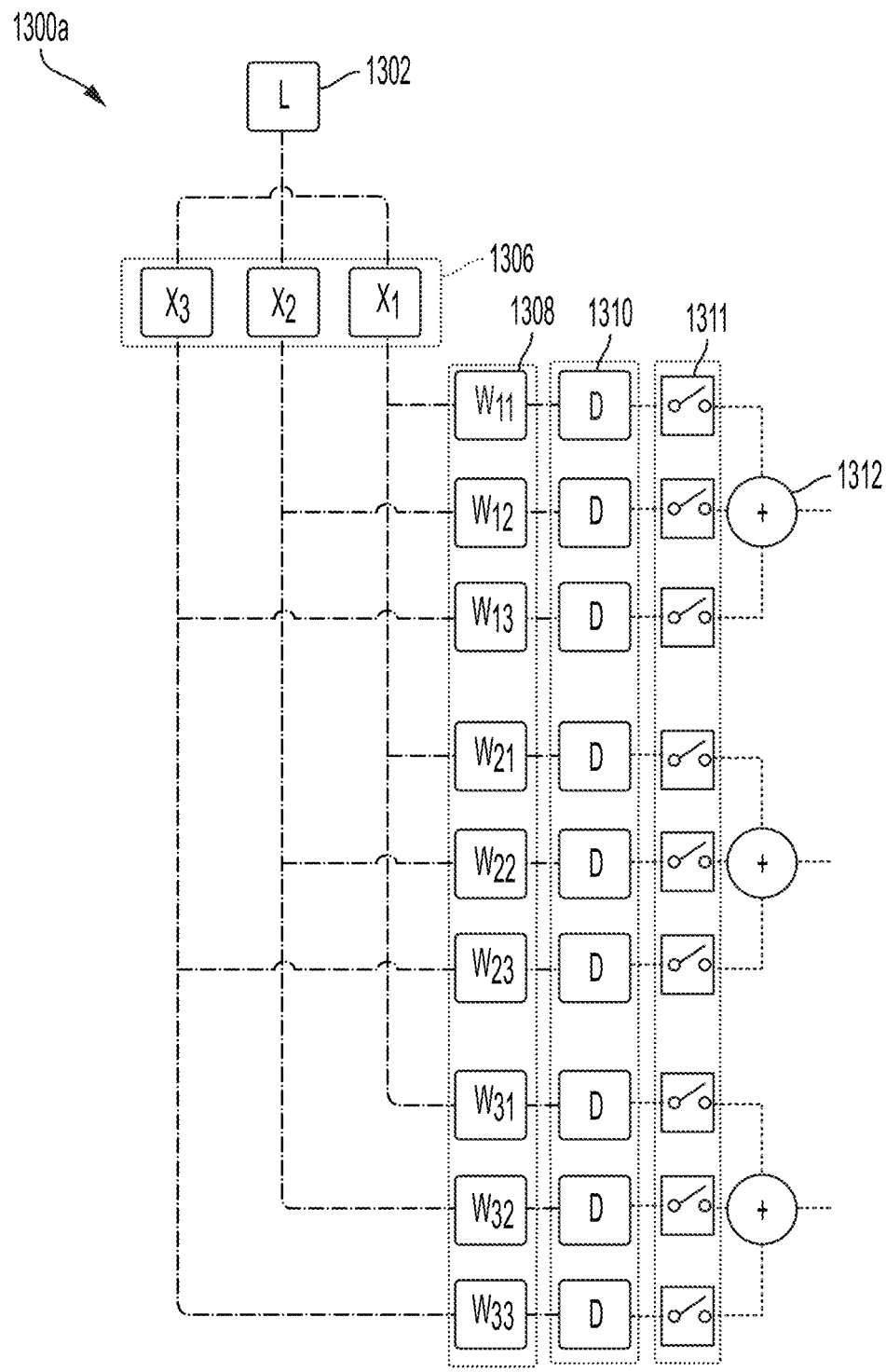
FIGS. 13A-13C are block diagrams illustrating photonic processors configured to implement sparse vectors and/or matrices, in accordance with some embodiments of the technology described herein.
Figure 13B:
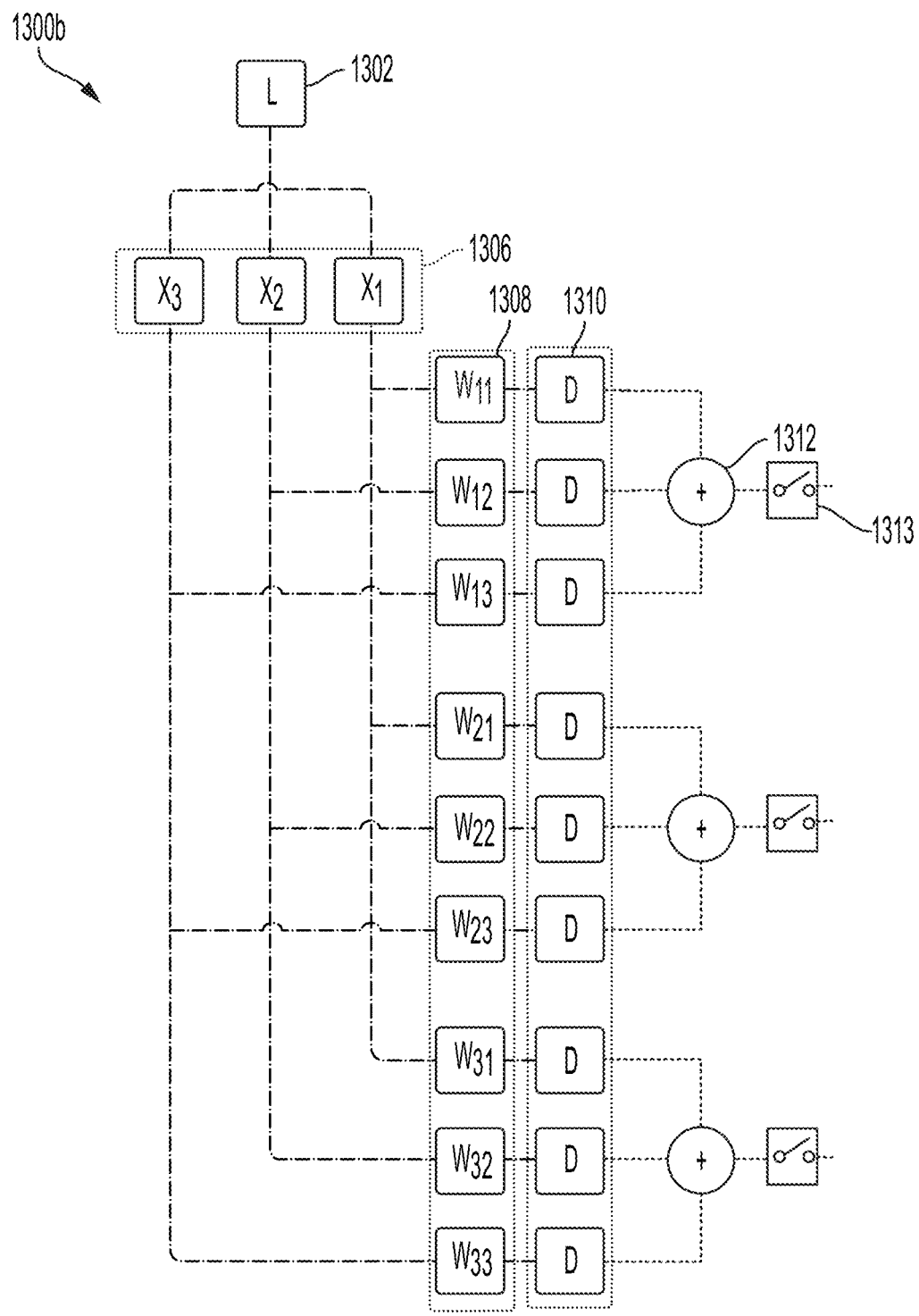
Figure 13C:
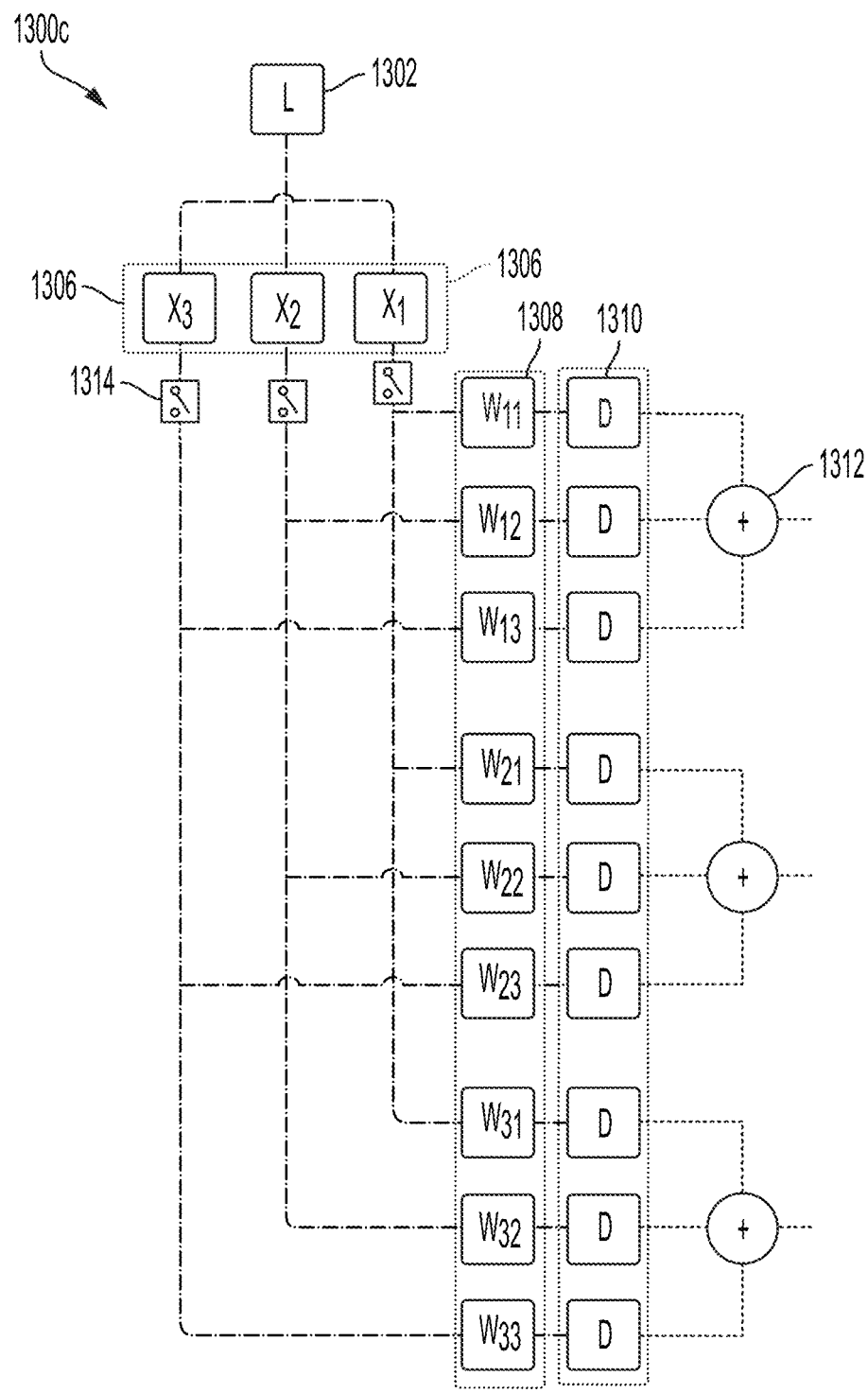

Sparse matrices (e.g., matrices with few non-zero elements) are commonly encountered in many fields of computation. In some embodiments, sparse entries may be implemented in the matrix w or vector x by using an electrical or optical switch placed within the processor architecture, as shown in the examples of FIGS. 13A-13C. The linear photonic processors 1300a, 1300b, and 1300c are similar to the linear photonic processor 300a as described in connection with FIG. 3, and include a light source 1302, first amplitude modulators 1306, second amplitude modulators 1308, optical detectors 1310, and electrical summing circuits 1312. However, the linear photonic processors 1300a, 1300b, and 1300c include additional electrical or optical switches to implement sparse matrix or vector entries.

Placing the electrical switches 1311 after the optical detectors 1310, as in the linear photonic processor 1300a of FIG. 13A may implement sparse entries in the matrix w. Alternatively or additionally, as shown in the linear photonic processor 1300b of FIG. 13B, electrical switches 1313 may be placed after the electrical summing circuits 1312 in order to implement sparse rows of the matrix w. Alternatively or additionally, optical switches 1314, shown in the linear photonic processor 1300c of FIG. 13C, may be placed after the first amplitude modulators 1306 to implement sparse entries in the vector x. It may be appreciated that any combination of the switches 1311, 1313, and 1314 may be used in a linear photonic processor to implement sparse matrix and/or vector entries. It is possible to save energy for sparse matrix entries by ensuring that the zero value corresponds to a default state of the second amplitude modulators 1308. In this way, energy is not spent on applying zeros.

Alternatively or additionally, pre-computation could be used to implement sparse or identity sub-matrices. Analog processors typically derive an advantage from extremely compute-intensive dense (non-sparse) operations. Assume a matrix M and a vector x; if the row of the matrix M is sparse, it may be beneficial to perform the operations individually on a digital computing system. For example, if an entire row i of M contains zero entries, the computer should do no computation and simply output a zero for that vector entry $x_i$. Another extreme example, if an entire matrix is an identity matrix, the computer should simply return the vector x. Both examples do not require any computation but a simple mapping between the input and the output that can be done efficiently using digital circuits. A compiler system external to the photonic processor may be implemented to determine if the particular multiplication between the matrix row of M and the vector x is to be computed using digital circuitry, as in the previous case, or using an analog processor.

Figure 14:
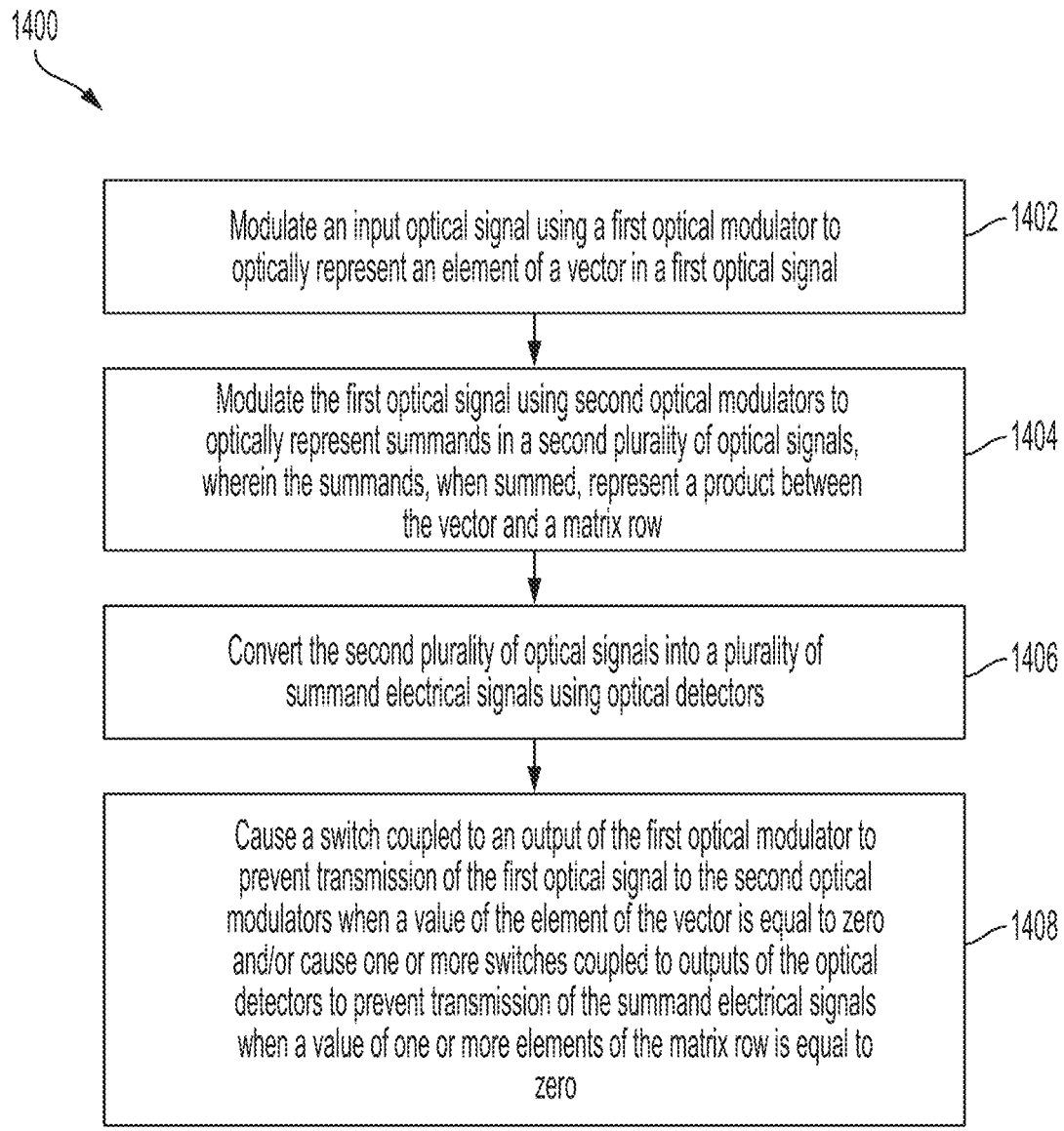
FIG. 14 is a flowchart illustrating a process of performing a matrix-vector operation including a sparse vector and/or matrix, in accordance with some embodiments of the technology described herein.

FIG. 14 is a flowchart illustrating a process of performing a matrix-vector operation including a sparse vector and/or matrix, in accordance with some embodiments of the technology described herein. Process 1400 may be executed in part by any suitable computing device in combination with a photonic processor. For example, in some embodiments, the process 1400 may be performed by a controller coupled to a photonic processor (e.g., controller 102 as described in connection with FIG. 1 coupled to a photonic processor as described in connection with FIGS. 13A-13C).

Process 1400 begins at act 1402, where an input optical signal may be modulated using a first optical modulator, in some embodiments. The input optical signal may be supplied, for example, by a light source (e.g., light source 1302 of FIGS. 13A-13C). The input optical signal may be modulated by the first optical modulator to optically represent an element of a vector in a first optical signal output by the first optical modulator. For example, the first optical modulator may be configured to modulate an amplitude (e.g., an intensity) of the input optical signal and encode the value of an element of a vector into the amplitude of the light.

The process 1400 may proceed to act 1404, where the first optical signal may be modulated by second optical modulators. The first optical signal may be split (e.g., using beam splitters) and transmitted to a number of second optical modulators. The second optical modulators may be programmed with elements of a matrix row. The second optical modulators, by modulating an amplitude of the first optical signal, may produce second optical signals that optically represent summand values (e.g., products of the vector element and an element of the matrix row). The summands, if summed together, may represent a product between the vector element and the matrix row.

After act 1404, the process 1400 may proceed to act 1406, where the second optical signals may be converted into a plurality of summand electrical signals by optical detectors. In some embodiments, each optical signal may be received by an optical detector configured to convert an amplitude of the received light into an electrical signal. For example, the optical detectors may comprise photodetectors configured to output a photocurrent having a magnitude proportional to an intensity of light received by the photodetector. In some embodiments, multiple second optical signals may be received by a single optical detector (e.g., at a same time or at different times, for example, by time division multiplexing).

Act 1400 may then proceed to act 1408, where a switch coupled to an output of the first optical modulator and/or switches coupled to outputs of the optical detectors may be caused to prevent transmission of one or more signals. For example, in some embodiments, optical switches may be coupled to an output of the first optical modulator to prevent transmission of the first optical signal to the second optical modulators when a value of the element of the vector is equal to zero. The optical switch may, for example, open to prevent transmission of the first optical signal. In this way, a true zero value may be propagated through the photonic processor. Alternatively or additionally, one or more switches coupled to outputs of the optical detectors may be caused to prevent transmission of the summand electrical signals when a value of one or more elements of the matrix row is equal to zero. For example, electrical switches coupled to outputs of the optical detectors may be caused to open when a value of a corresponding element of the matrix row is equal to zero. In some embodiments, additional switches coupled to an output of multiple optical detectors (e.g., coupled to an output of electrical summing circuit 1312) may be configured to prevent transmission of a summed electrical signal if values of the entire matrix row are equal to zero.

XIV. Signal Readout Strategies

For large matrices, the above-described method of adding together matrix-row currents by electrically tying detector outputs together can result in significant parasitic capacitances. These parasitic capacitances can make high-speed operation challenging due to the loading of the receiver circuit. To circumvent this, the inventors have developed several signal readout strategies as shown in FIGS. 15A-15D, in accordance with some embodiments described herein.

Figure 15A:
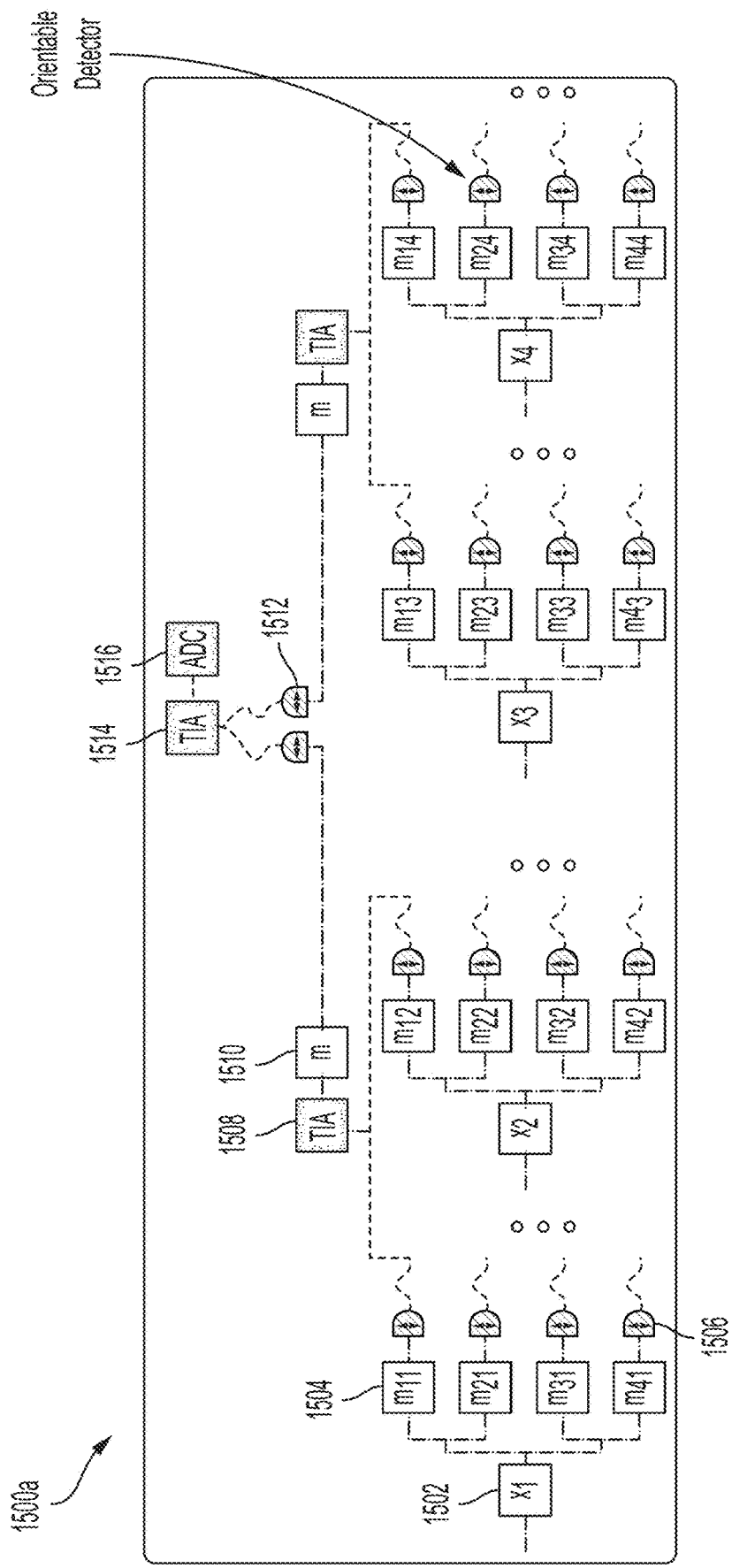
FIGS. 15A-15D are schematic diagrams illustrating signal readout strategies for a photonic processor, in accordance with some embodiments of the technology described herein.

FIG. 15A shows an illustrative readout system 1500a based on optical-electronic-optical conversions, in accordance with some embodiments. In the illustrative readout system 1500a, the matrix-vector element multiplications are performed optically by modulating optical signals using first amplitude modulators 1502 and second amplitude modulators 1504. The optical signals from second amplitude modulators 1504 may be converted into electrical signals by optical detectors 1506 and then added in the current domain. The summed electrical signals may be converted into an amplified voltage using a transimpedance amplifier (TIA) 1508 which may then drive an optical modulator 1510. The signal from the optical modulator 1510 may be transmitted to optical detectors 1512 and converted into electrical signals. These electrical signals may then be converted into a voltage using a TIA 1514 and then readout as a digital string using an analog-to-digital converter (ADC) 1516. Such an embodiment may enable long-distance routing of subgroup signals without creating large parasitic capacitances (e.g., by using photonic waveguides between the optical modulators 1510 and optical detectors 1512 to route the signals rather than routing the signals in the electrical domain).

Figure 15B:
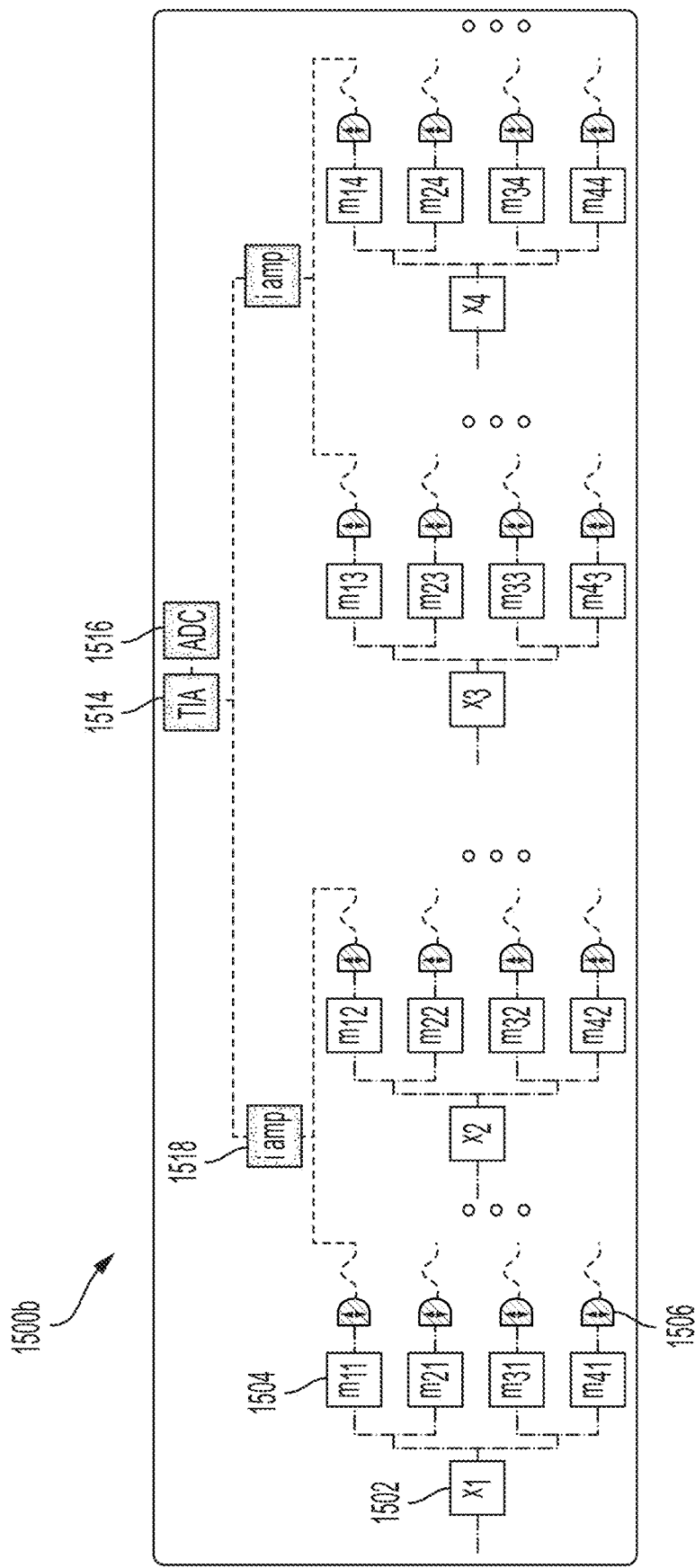

FIG. 15B shows an illustrative readout system 1500*b* based on subgroup current amplification, in accordance with some embodiments described herein. This subgroup current amplification may be performed using, for example, a current mirror circuit 1518. The amplified currents may then be converted to a voltage using TIA 1514 and readout as a digital string using ADC 1516.

Figure 15C:
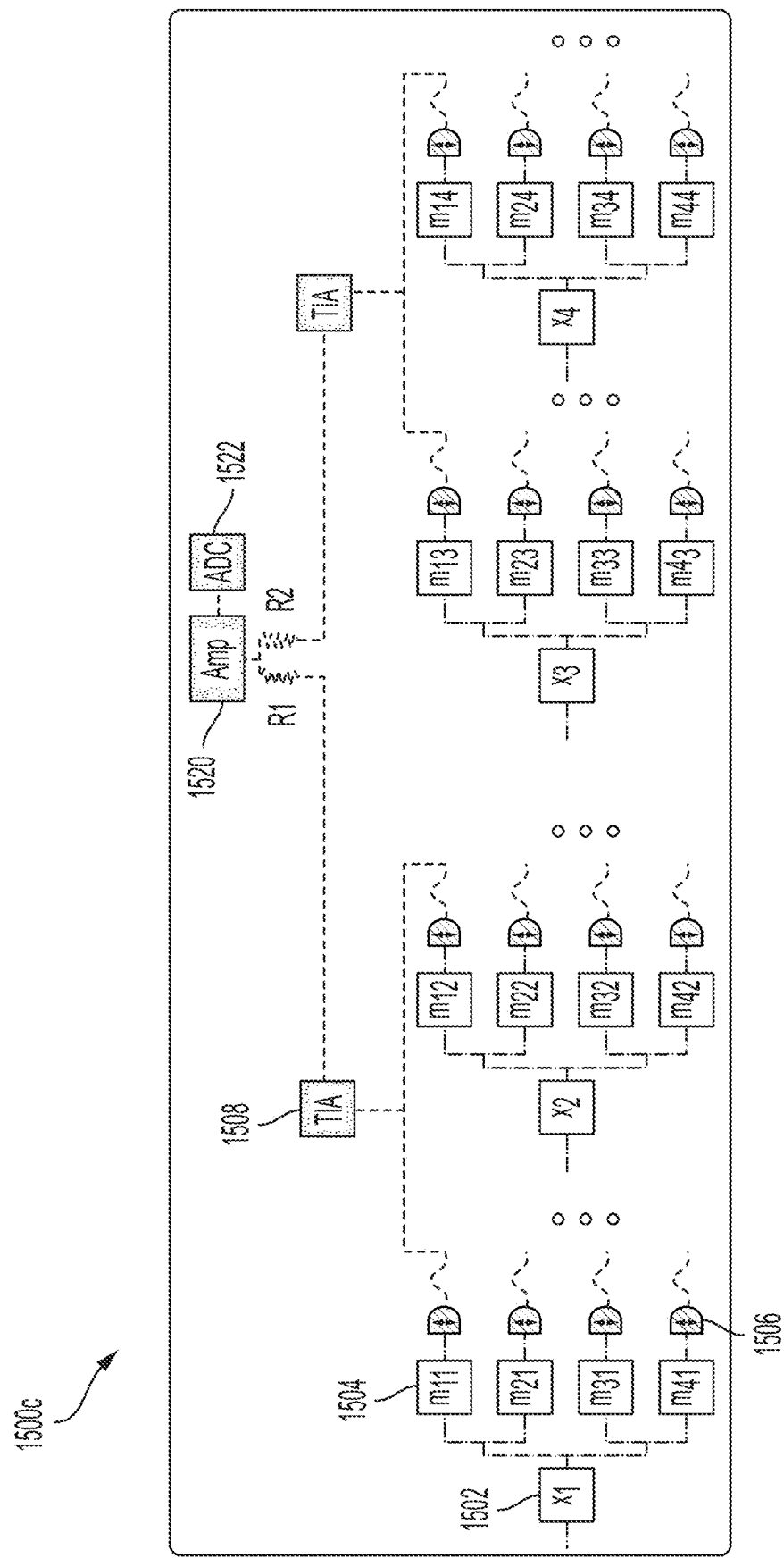

FIG. 15C shows an illustrative readout system 1500*c* based on intra-subgroup addition in the current domain and subgroup addition in the voltage domain, in accordance with some embodiments described herein. Intra-subgroup outputs of optical detectors 1506 may be performed in the current domain. The intra-subgroup outputs may be converted into a voltage using a TIA 1508. Larger subgroup addition may be performed thereafter, for example, using an op-amp coupled to multiple resistors (e.g., R1, R2) as input. The summed voltage signal may be read out as a digital string using an ADC 1522.

Figure 15D:
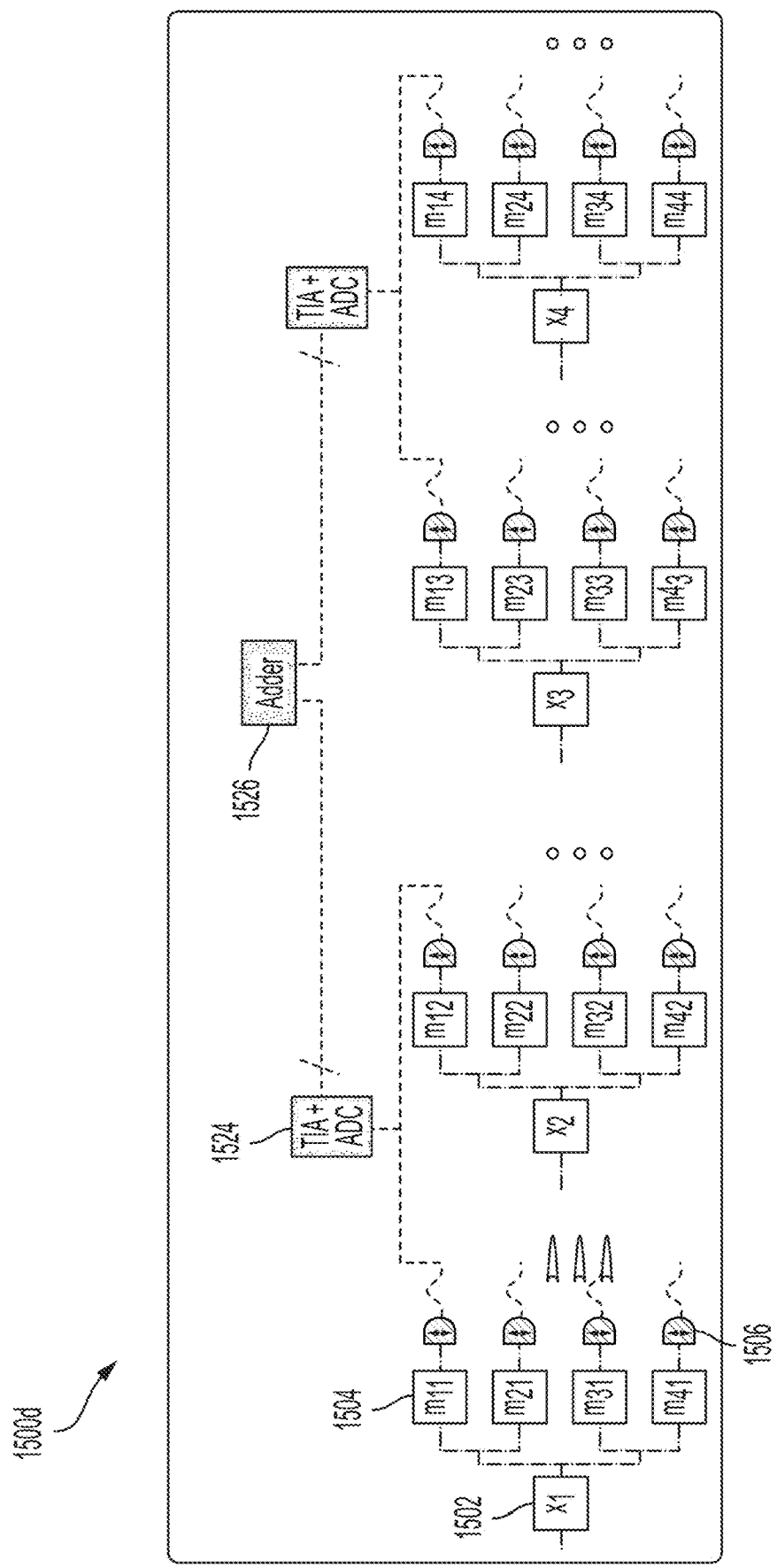
Figure 16A:
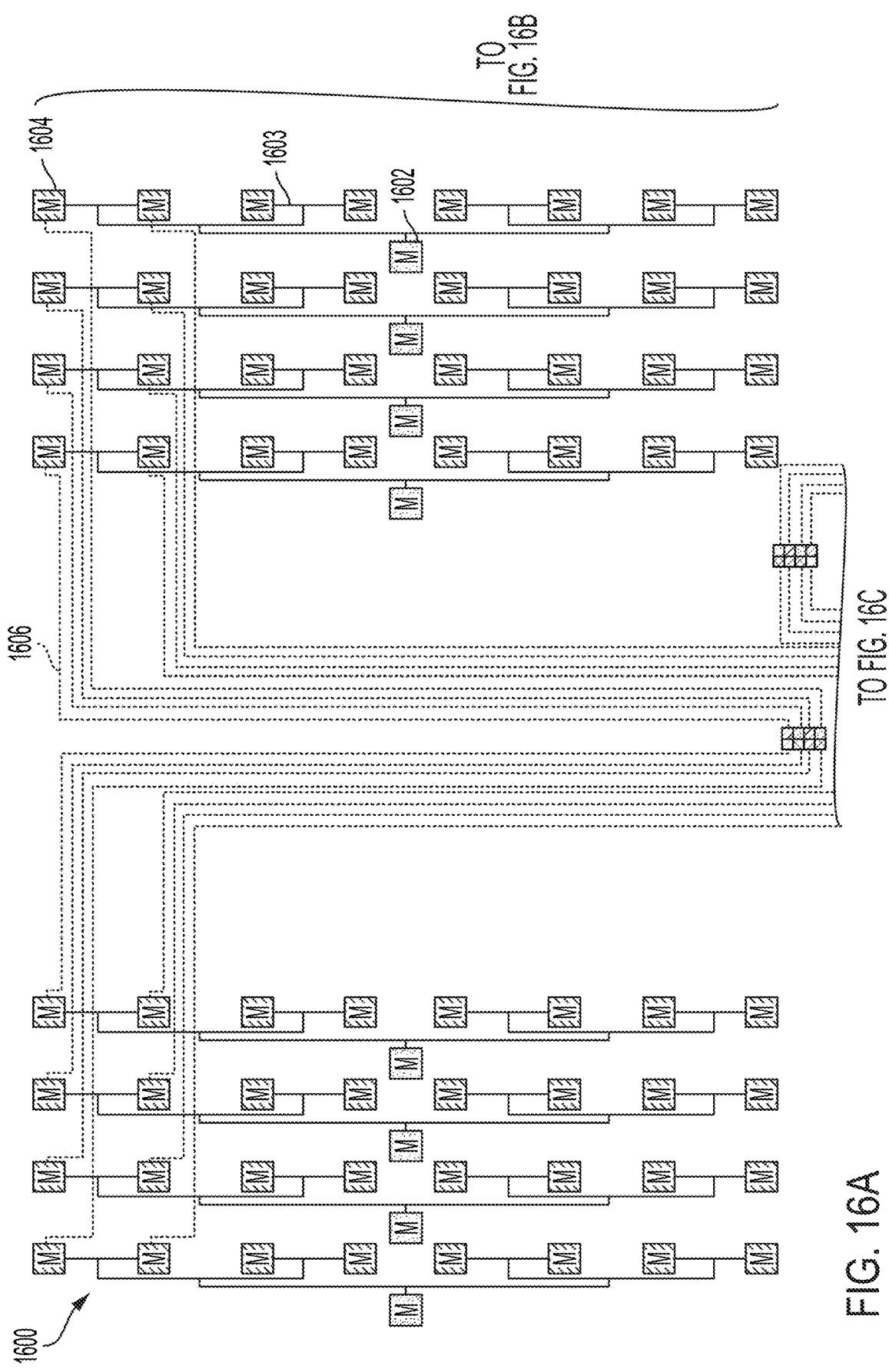
FIGS. 16A-16D are a schematic diagram illustrating a photonic processor architecture having clustered readout circuits, in accordance with some embodiments of the technology described herein.
Figure 16B:
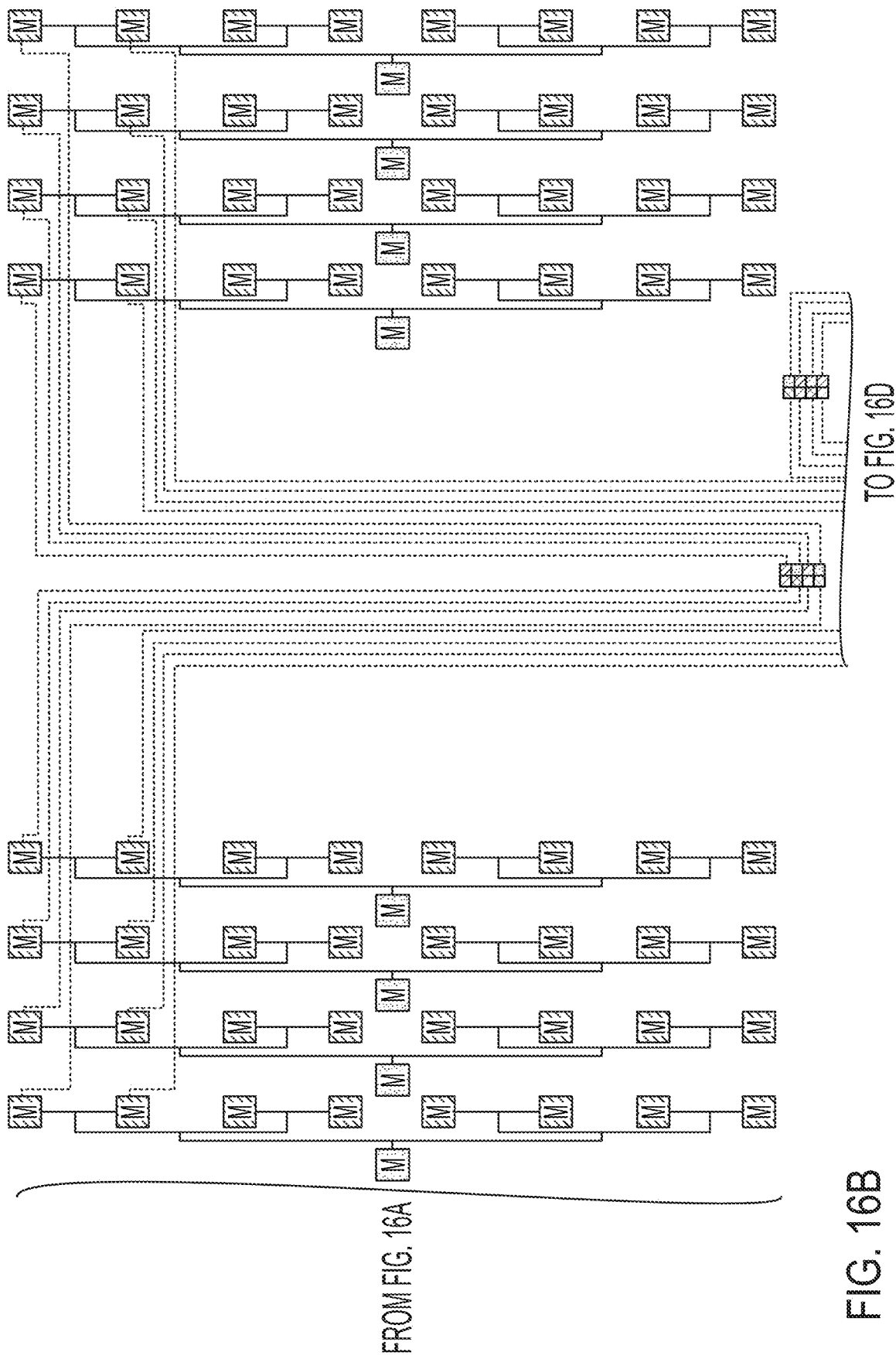
Figure 16C:
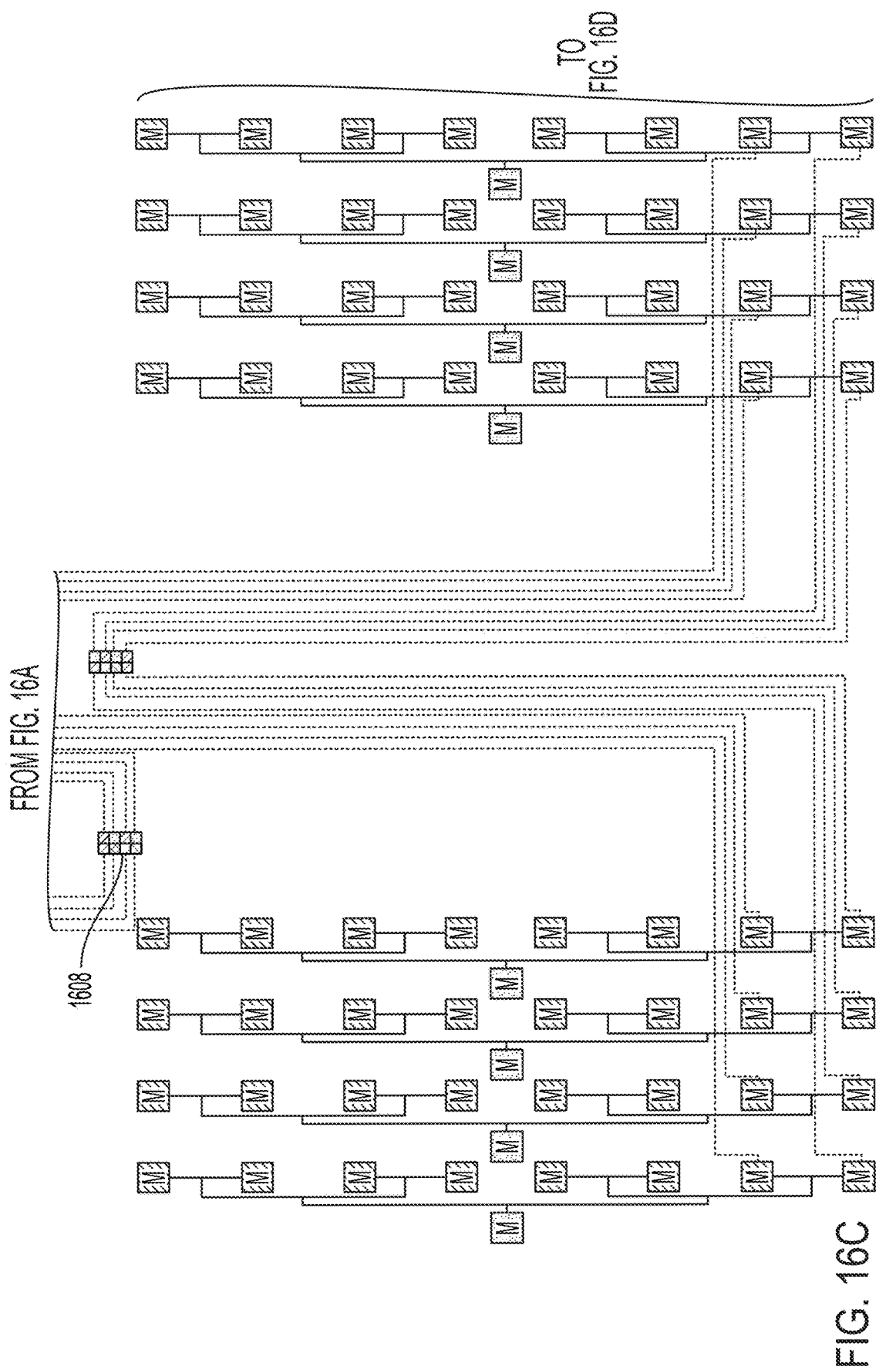
Figure 16D:
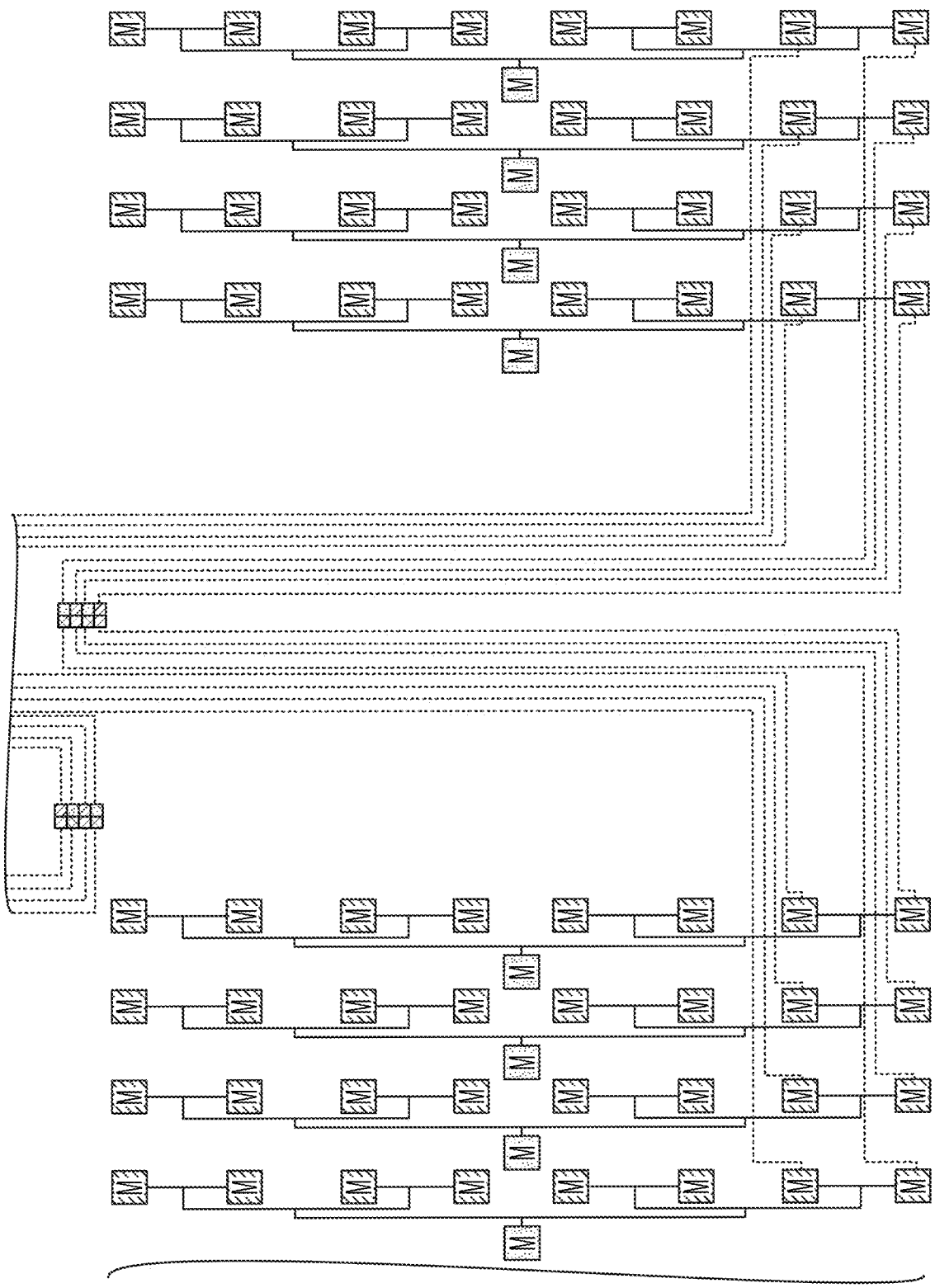

FIG. 15D shows an illustrative readout system 1500*d* based on digital addition, in accordance with some embodiments described herein. The intra-subgroup outputs of optical detectors 1506 may be performed in the current domain and then converted into a digital voltage signal using a TIA and ADC 1524. The digital addition may then be performed by using a digital adder 1526.

The layout of a photonic processor in a semiconductor substrate can have large effects in terms of the performance (e.g., speed and/or power) of the processor. One general strategy to reduce the capacitance of the readout circuitry (e.g., comprising a TIA and an ADC) is to group the photodetectors and readout circuits near each other to reduce the length of electrical connections. Electrical connections (e.g., via electrical wires) incur additional capacitance for the output readout circuitry that can limit the gain or the bandwidth of the readout circuitry.

On the other hand, photonic connections (e.g., via photonic waveguides) do not add more capacitance to the system. Thus, another strategy of laying out the photonic processor in a semiconductor substrate, where devices are typically laid out in a two-dimensional plane, is to have four independent blocks: each reflected along the x- and y-axis from each other, as shown in the layout 1600 of FIGS. 16A-16D. The optical modulators 1602 and 1604 may be connected to the optical detectors 1608 through waveguides 1606. The reflected blocks allow the optical detectors 1608 to be clustered near each other and reduce the amount of additional capacitance that would have been added to the system if the connections were made electrically.

If the system can be laid out in a three-dimensional block (in an advanced future semiconductor substrate), it may be advantageous to divide the system into eight independent blocks: each reflected along the x-axis, y-axis, and z-axis (not shown). The output photodetectors may be clustered next to each other. Generally, if the system can be laid out in an N-dimensional block, it is advantageous to have $2^N$ independent blocks, each reflected along one axis of N possible dimensions, such that the output photodetectors are clustered next to each other.

XV. Matrix-Matrix Operations

Figure 17:
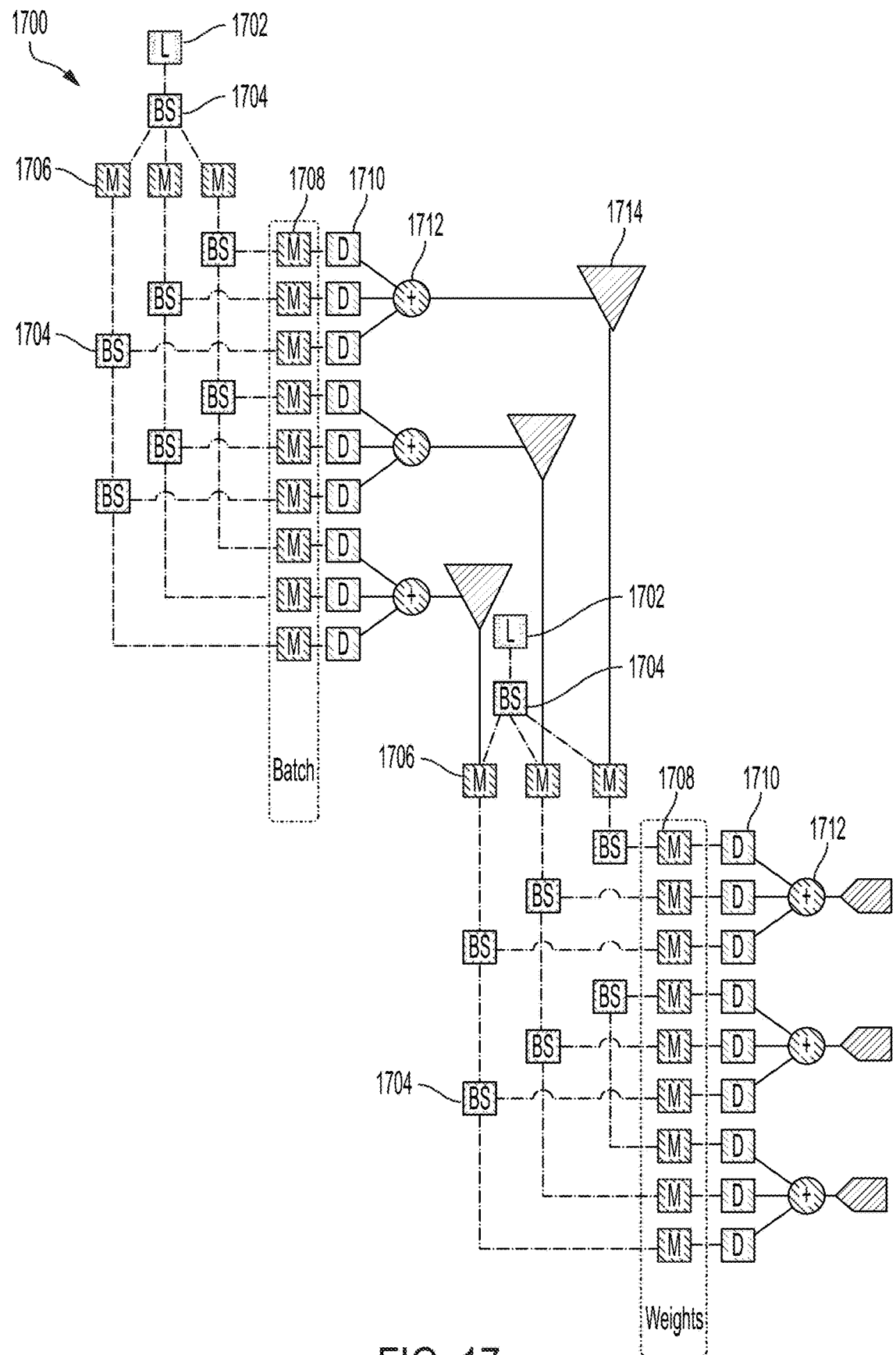
FIG. 17 is a block diagram of a photonic processor configured to implement matrix-matrix operations, in accordance with some embodiments of the technology described herein.

FIG. 17 is a block diagram of a photonic processor 1700 configured to implement matrix-matrix operations, in accordance with some embodiments of the technology described herein. The photonic processor 1700 includes two matrix-vector sub-processors. These matrix-vector sub-processors have a similar architecture as linear photonic processor 300 as described in connection with FIG. 3. Both matrix sub-processors include a light source 1702, a beam splitter 1704, and first amplitude modulators 1706. The first optical signals output by first amplitude modulators 1706 may be split by additional beam splitters 1704 and transmitted to second amplitude modulators 1708. The optical signals output by second amplitude modulators 1708 may be detected and converted into electrical signals by optical detectors 1710. The electrical signals output by optical detectors 1710 may be summed by electrical summing circuit 1717. However, the photonic processor 1700 uses the electrical output of the first sub-processor as an input to the second sub-processor. In some embodiments, the electrical output of the first sub-processor may be amplified by amplifiers 1714 prior to being transmitted to the second matrix sub-processor.

Consider the multiplication between two matrices A and B, with output matrix C=AB. The matrix B can be programmed into the second amplitude modulators 1708 of the first matrix-vector processor and the matrix A can be programmed into the second amplitude modulators 1708 of the second matrix-vector processor. To read out the resultant matrix C, one-hot vectors (e.g., a vector with one entry with a value of one and all other entries with a value of zero) may be programmed into the first amplitude modulators 1706 of the first sub-matrix vector such that only one modulator is turned on at any single time.

The one-hot vectors propagate through the photonic processor 1700, in some embodiments. When the one-hot vectors propagate through the second amplitude modulators 1708 of the first matrix sub-processor, they carry information representing a column of the matrix B. The column of the matrix B may be transmitted and programmed into the first amplitude modulators 1706 of the second matrix processor. An optical signal from the light source 1702 can then transmit the column of the matrix B to the second amplitude modulators 1708 of the second matrix sub-processor that are programmed with the elements of the matrix A. The output vectors correspond to the columns of the final matrix C. More specifically, if the user sends in vector $e_i$—a vector of all zeros except a one as the $i^{th}$ element—the output will be the $i^{th}$ column of C. For example, sending in $e_1$=(1 0 0 0 . . . ) returns the first column of C. Thus, a multiplication between a column of the matrix B and the elements of the matrix A may be performed and stored digitally (e.g., by an external memory). By propagating different one-hot vectors through the photonic processor 1700, the entire matrix-matrix multiplication operation may be performed.

Figure 18:
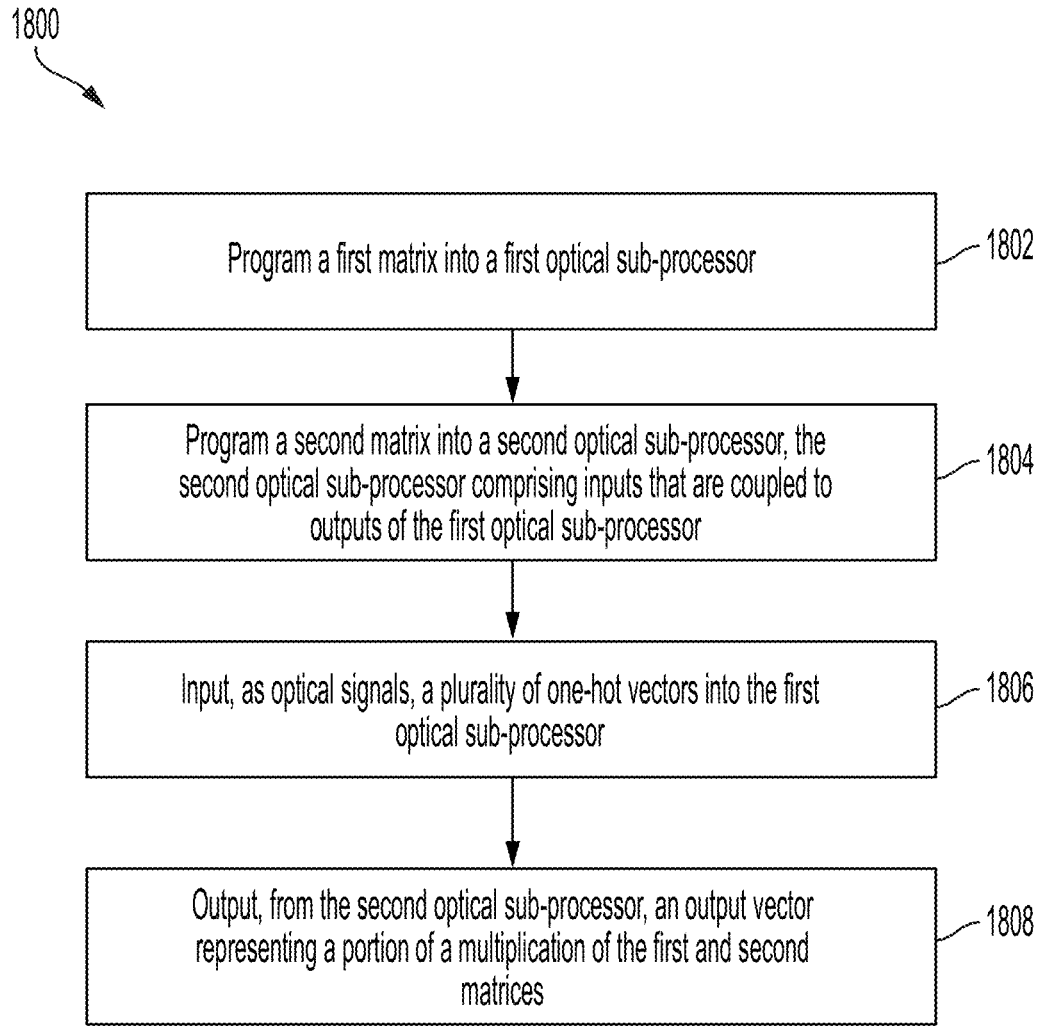
FIG. 18 is a flowchart illustrating a process of performing a matrix-matrix operation using a photonic processor, in accordance with some embodiments of the technology described herein.

FIG. 18 is a flowchart illustrating a process of performing a matrix-matrix operation using a photonic processor, in accordance with some embodiments of the technology described herein. Process 1800 may be executed in part by any suitable computing device in combination with a photonic processor. For example, in some embodiments, the process 1800 may be performed by a controller coupled to a photonic processor (e.g., controller 102 as described in connection with FIG. 1 coupled to a photonic processor as described in connection with FIG. 17).

Process 1800 may begin at act 1802, where a first matrix may be programmed into a first optical sub-processor, in some embodiments. For example, the first matrix may be programmed into second amplitude modulators (e.g., second amplitude modulators 1708) of the first optical sub-processor. The first matrix may be programmed into the second amplitude modulators, for example, based on bit strings received from an external controller. Individual elements of the first matrix may each be programmed into an individual amplitude modulator of the second amplitude modulators. For example, a first matrix element having a value of one may be programmed into a first of the second amplitude modulators such that the first one of the second amplitude modulators may allow the intensity of a received optical signal to be passed through the amplitude modulator without being changed. A second matrix element having a value of zero may be programmed into a second one of the second amplitude modulators such that the second one of the amplitude modulators may extinguish the intensity of a received optical signal and may output an optical signal with an amplitude of zero or close to zero.

In some embodiments, process 1800 may then proceed to act 1804, where a second matrix may be programmed into a second optical sub-processor. The second matrix may be programmed into second amplitude modulators (e.g., second amplitude modulators 1708) of the second optical sub-processor. The second matrix may be programmed into the second amplitude modulators, for example, based on bit strings received from an external controller. As with the first matrix, individual elements of the second matrix may be programmed into individual amplitude modulators of the second amplitude modulators of the second optical sub-processor. In some embodiments, the second optical sub-processor may comprise inputs that are coupled to outputs of the first optical sub-processor;

After act 1804, the process 1800 may proceed to act 1806, where a plurality of one-hot vectors are input into the first optical sub-processor. For example, the plurality of one-hot vectors may be programmed into the first amplitude modulators 1706 of the first optical sub-processor. By propagating an optical signal from a light source through the first amplitude modulators (e.g., propagating a one-hot vector) and to the second amplitude modulators being programmed with the first matrix, the first optical sub-processor may propagate a first set of matrix elements (e.g., a matrix row, a matrix column) to the second optical sub-processor. For example, the output optical signals from the first optical sub-processor may be used to program the first set of matrix elements of the first matrix into the first amplitude modulators of the second optical sub-processor. By propagating another optical signal (e.g., originating from a light source) through the first and second amplitude modulators of the second optical sub-processor, a multiplication between the first set of matrix elements of the first matrix and elements of the second matrix may be performed.

Subsequently, at act 1808, the second optical sub-processor may output an output vector representing a portion of a multiplication of the first and second matrices, in some embodiments. For example, the second optical sub-processor may output summed electrical signals (e.g., from electrical summing circuits 1712) representing products of elements of the first and second matrices.

Having thus described several aspects of at least one embodiment of this technology, it is to be appreciated that various alterations, modifications, and improvements will readily occur to those skilled in the art.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semi-custom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, the various methods or processes outlined herein may be coded as software that is executable on one or more processors running any one of a variety of operating systems or platforms. Such software may be written using any of a number of suitable programming languages and/or programming tools, including scripting languages and/or scripting tools. In some instances, such software may be compiled as executable machine language code or intermediate code that is executed on a framework or virtual machine. Additionally, or alternatively, such software may be interpreted.

The techniques disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more processors, perform methods that implement the various embodiments of the present disclosure described above. The computer-readable medium or media may be transportable, such that the program or programs stored thereon may be loaded onto one or more different computers or other processors to implement various aspects of the present disclosure as described above.

A computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format. As another example, a computing device may receive input from a camera, lidar, or other device that produces visual data.

Embodiments of a computing device may also include a photonic processor, such as the one described herein. The processor of the computing device may send and receive information to the photonic processor via one or more interfaces. The information that is sent and received may include settings of the detectors of the photonic processor and/or measurement results from the detectors of the photonic processor.

The terms "program" or "software" are used herein to refer to any type of computer code or set of computer-executable instructions that may be employed to program one or more processors to implement various aspects of the present disclosure as described above. Moreover, it should be appreciated that according to one aspect of this embodiment, one or more computer programs that, when executed, perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Program modules may include routines, programs, objects, components, data structures, etc. that perform particular tasks or implement particular abstract data types. Functionalities of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields to locations in a computer-readable medium that convey relationship between the fields. However, any suitable mechanism may be used to establish a relationship between information in fields of a data structure, including through the use of pointers, tags, or other mechanisms that establish relationship between data elements.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the technology described herein may be embodied as a method, examples of which are provided herein including with reference to FIGS. 8, 15 and 19. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for implementing signed numerical values, the apparatus comprising:
    an optical detector comprising a first terminal and a second terminal;
    a first switch coupling the first terminal of the optical detector to either a node or a reference voltage;
    a second switch coupling the second terminal of the optical detector to either the node or to a voltage rail; and
    control circuitry configured to:
        produce a positively-signed numerical value output at least in part by setting the first switch to couple the first terminal to the reference voltage and setting the second switch to couple the second terminal to the node; and
        produce a negatively-signed numerical value output at least in part by setting the first switch to couple the first terminal to the node and setting the second switch to couple the second terminal to the voltage rail.

2. The apparatus of claim 1, wherein the optical detector comprises a photodiode;
    the first terminal comprises an anode; and
    the second terminal comprises a cathode.

3. The apparatus of claim 1, wherein the first switch and the second switch each comprise a transistor switch.

4. The apparatus of claim 1, wherein the reference voltage is ground.

5. The apparatus of claim 1, wherein the control circuitry comprises logical gate configured to output a sign orientation bit, wherein the sign orientation bit comprises information indicative of whether the numerical value output comprises a positively-signed or negatively-signed numerical value.

6. The apparatus of claim 5, wherein the logical gate comprises an XOR gate.

7. The apparatus of claim 5, wherein the logical gate is configured to compare a sign of a value of an input vector element and a sign of a value of an input matrix element.

8. An optical processing system, comprising:
    a first plurality of optical modulators, each configured to receive an input optical signal, modulate the input optical signal, and output a first optical signal representing an element of a vector;
    a second plurality of optical modulators, each optically coupled to an optical modulator of the first plurality of optical modulators and configured to receive the first optical signal, modulate the first optical signal, and output a second optical signal representing a portion of a matrix-vector multiplication between the vector and a matrix;
    a plurality of optical detectors each optically coupled to optical modulators of the second plurality of optical modulators and configured to convert the second optical signal into an electrical signal representing the portion of the matrix-vector multiplication, wherein each optical detector of the plurality of optical detectors comprises a first terminal and a second terminal;
    a first switch coupling the first terminal of a first optical detector to either an output node or a reference voltage;
    a second switch coupling the second terminal of the first optical detector to either the output node or to a voltage rail; and
    control circuitry configured to:
        produce a positively-signed numerical value output at least in part by setting the first switch to couple the first terminal of the first optical detector to the reference voltage and setting the second switch to couple the second terminal of the first optical detector to the output node; and
        produce a negatively-signed numerical value output at least in part by setting the first switch of the first optical detector to couple the first terminal to the output node and setting the second switch of the first optical detector to couple the second terminal to the voltage rail.

9. The optical processing system of claim 8, wherein the optical detector comprises a photodiode;
the first terminal comprises an anode; and
the second terminal comprises a cathode.

10. The optical processing system of claim 9, wherein the first switch and the second switch each comprise a transistor switch.

11. The optical processing system of claim 9, wherein the reference voltage is grounded.

12. The optical processing system of claim 9, further comprising a plurality of electrical summing circuits, wherein:
a first electrical summing circuit of the plurality is coupled to two or more output nodes, each output node of the two or more output nodes being coupled to an optical detector through the first switch or the second switch; and
the first electrical summing circuit is configured to output an electrical signal representing a sum of the portions of the matrix-vector operation output by the optical detectors coupled to the two or more output nodes.

13. The optical processing system of claim 8, wherein the control circuitry comprises logical gate configured to output a sign orientation bit, wherein the sign orientation bit comprises information indicative of whether the numerical value output comprises a positively-signed or negatively-signed numerical value.

14. The optical processing system of claim 13, wherein the logical gate comprises an XOR gate.

15. The optical processing system of claim 13, wherein the logical gate is configured to compare a sign of a value of an input vector element and a sign of a value of an input matrix element.

16. A method for implementing signed numerical values output by optical detectors of an optical processor, the method comprising:
converting, using an optical detector comprising a first terminal and a second terminal, an output optical signal into a first electrical signal, the output optical signal being output by a portion of the optical processor;
determining, using an at least one conventional processor coupled to the optical processor, whether the first electrical signal represents a positively-signed numerical value or a negatively-signed numerical value;
arranging, using control circuitry of the optical processor, settings of a first switch coupled to the first terminal and settings of a second switch coupled to the second terminal in response to determining whether the first electrical signal represents the positively-signed numerical value or the negatively-signed numerical value, wherein the control circuitry is configured to:
produce a positively-signed numerical value output at least in part by setting the first switch to couple the first terminal to a reference voltage and setting the second switch to couple the second terminal to a node; and
produce a negatively-signed numerical value output at least in part by setting the first switch to couple the first terminal to the node and setting the second switch to couple the second terminal to a voltage rail; and
outputting, from the optical detector, the first electrical signal so that the first electrical signal passes through either the first switch or the second switch based on the determination of whether the first electrical signal represents a positively-signed numerical value or a negatively-signed numerical value.

17. The method of claim 16, wherein arranging settings of the first switch and the second switch comprises sending, from the control circuitry, one or more electrical signals to the first switch and the second switch, wherein the first switch and the second switch each comprise a transistor switch.

18. The method of claim 16, further comprising:
modulating an input optical signal using a first optical modulator to optically represent an element of a vector in a first optical signal;
modulating the first optical signal using a second optical modulator to optically represent a summand in the output optical signal, wherein the summand, when summed with other summands, represents a product between the vector and a matrix row; and
detecting the output optical signal using the optical detector.

19. The method of claim 16, wherein arranging settings of a first switch and settings of a second switch further comprises using a logical gate to generate a sign orientation bit, wherein the sign orientation bit comprises information indicative of whether the first electrical signal comprises a positively-signed or negatively-signed numerical value.

20. The method of claim 19, wherein using the logical gate comprises using an XOR gate.

* * * * *